(12) United States Patent
Hofmeister et al.

(10) Patent No.: US 8,651,789 B2
(45) Date of Patent: Feb. 18, 2014

(54) SUBSTRATE PROCESSING APPARATUS

(75) Inventors: Christopher Hofmeister, Hampstead, NH (US); Robert T. Caveney, Windham, NH (US)

(73) Assignee: Brooks Automation, Inc., Chelmsford, MA (US)

( * ) Notice: Subject to any disclaimer, the term of this patent is extended or adjusted under 35 U.S.C. 154(b) by 131 days.

(21) Appl. No.: 13/159,034

(22) Filed: Jun. 13, 2011

(65) Prior Publication Data

US 2011/0232844 A1 Sep. 29, 2011

Related U.S. Application Data

(60) Division of application No. 11/442,509, filed on May 26, 2006, now Pat. No. 7,959,395, which is a continuation-in-part of application No. 10/962,787, filed on Oct. 9, 2004, now Pat. No. 7,988,398, which is a continuation-in-part of application No. 10/624,987, filed on Jul. 22, 2003, now Pat. No. 7,575,406.

(60) Provisional application No. 60/397,895, filed on Jul. 22, 2002.

(51) Int. Cl.
*H01L 21/677* (2006.01)

(52) U.S. Cl.
USPC .......................... 414/217; 414/935; 414/939

(58) Field of Classification Search
USPC ........... 414/217, 221, 939; 32/92, 406; 34/92, 34/406
See application file for complete search history.

(56) References Cited

U.S. PATENT DOCUMENTS

| | | | |
|---|---|---|---|
| 3,294,670 A | 12/1966 | Charschan et al. |
| 3,407,749 A | 10/1968 | Frig |
| 3,470,828 A | 10/1969 | Powell et al. |
| 3,771,033 A | 11/1973 | Matsui et al. |
| 3,903,809 A | 9/1975 | Miericke et al. |

(Continued)

FOREIGN PATENT DOCUMENTS

| | | |
|---|---|---|
| EP | 1 365 040 | 11/2003 |
| JP | 6338555 | 12/1984 |

(Continued)

OTHER PUBLICATIONS

International Search Report, PCT/us03/22881, Apr. 16, 2001, 1 page.

(Continued)

*Primary Examiner* — Scott Lowe
(74) *Attorney, Agent, or Firm* — Perman & Green, LLP; Colin C. Durham

(57) ABSTRACT

A substrate processing apparatus is presented having a transport chamber defining substantially linear substrate transport paths, a linear array of substrate holding modules, each communicably connected to the chamber. The substrate transport has at least one transporter capable of holding and moving the substrate on more than one substantially linear substrate transport paths. The transport chamber having different transport tubes at least one of which is sealable at both ends of the transport tube and configured to hold an isolated atmosphere different from that of the transport tubes, each of the different transport tubes having one of the substrate transport paths located therein different from another of the transport paths located in another of the transport tubes, and being communicably connected to each other, where at least one of the transport tubes is configured to provide uninterrupted transit of the substrate transport through the transport tubes.

25 Claims, 33 Drawing Sheets

(56) References Cited

U.S. PATENT DOCUMENTS

| | | | |
|---|---|---|---|
| 3,937,148 | A | 2/1976 | Simpson |
| 3,976,330 | A * | 8/1976 | Babinski et al. ............... 406/84 |
| 4,042,128 | A | 8/1977 | Shrader |
| 4,307,668 | A | 12/1981 | Vinson |
| 4,348,139 | A | 9/1982 | Hassan et al. |
| 4,518,078 | A | 5/1985 | Garrett |
| 4,542,712 | A | 9/1985 | Sato |
| 4,624,617 | A | 11/1986 | Belna |
| 4,676,884 | A | 6/1987 | Dimock |
| 4,717,461 | A | 1/1988 | Strahl et al. |
| 4,766,993 | A | 8/1988 | Kita et al. |
| 4,779,538 | A | 10/1988 | Fujiwara |
| 4,794,863 | A | 1/1989 | Gates et al. |
| 4,825,808 | A | 5/1989 | Takahashi et al. |
| 4,836,733 | A | 6/1989 | Hertel et al. |
| 4,886,592 | A | 12/1989 | Anderle et al. |
| 4,917,446 | A | 4/1990 | Mariani |
| 4,917,556 | A | 4/1990 | Stark et al. |
| 4,951,601 | A | 8/1990 | Maydan et al. |
| 5,040,484 | A | 8/1991 | Mears et al. |
| 5,076,205 | A | 12/1991 | Vowles et al. |
| 5,086,729 | A | 2/1992 | Katagiri |
| 5,154,730 | A | 10/1992 | Hodos et al. |
| 5,202,716 | A | 4/1993 | Tateyama et al. |
| 5,215,420 | A | 6/1993 | Hughes |
| 5,234,303 | A | 8/1993 | Koyano |
| 5,248,236 | A | 9/1993 | Ooshima et al. |
| 5,259,881 | A | 11/1993 | Edwards et al. |
| 5,275,709 | A | 1/1994 | Anderle et al. |
| 5,284,411 | A | 2/1994 | Enomoto et al. |
| 5,309,049 | A | 5/1994 | Kawada et al. |
| 5,380,682 | A | 1/1995 | Edwards et al. |
| 5,391,035 | A | 2/1995 | Krueger |
| 5,399,531 | A * | 3/1995 | Wu ............................ 700/112 |
| 5,402,021 | A | 3/1995 | Johnson |
| 5,417,537 | A | 5/1995 | Miller |
| 5,433,155 | A | 7/1995 | O'Neill et al. |
| 5,538,390 | A | 7/1996 | Salzman |
| 5,551,350 | A | 9/1996 | Yamada et al. |
| 5,571,325 | A | 11/1996 | Ueyama et al. |
| 5,586,535 | A | 12/1996 | Soyomura |
| 5,641,054 | A | 6/1997 | Mori et al. |
| 5,651,868 | A | 7/1997 | Canady et al. |
| 5,655,277 | A * | 8/1997 | Galdos et al. ................ 29/33 P |
| 5,695,564 | A | 12/1997 | Imahashi |
| 5,700,127 | A | 12/1997 | Harada et al. |
| 5,788,447 | A | 8/1998 | Yonemitsu et al. |
| 5,846,328 | A | 12/1998 | Aruga et al. |
| 5,881,649 | A | 3/1999 | Hasegawa et al. |
| 5,882,165 | A | 3/1999 | Maydan et al. |
| 5,894,760 | A | 4/1999 | Caveney |
| 5,897,710 | A | 4/1999 | Sato et al. |
| 5,904,101 | A | 5/1999 | Kuznetsov |
| 5,980,193 | A | 11/1999 | Clifton et al. |
| 5,989,346 | A | 11/1999 | Hiroki |
| 5,994,798 | A | 11/1999 | Chitayat |
| 5,998,889 | A | 12/1999 | Novak |
| 6,002,840 | A | 12/1999 | Hofmeister |
| 6,017,820 | A | 1/2000 | Ting et al. |
| 6,042,324 | A * | 3/2000 | Aggarwal et al. ............. 414/411 |
| 6,053,980 | A | 4/2000 | Suda et al. |
| 6,066,210 | A | 5/2000 | Yonemitsu et al. |
| 6,155,131 | A | 12/2000 | Suwa et al. |
| 6,183,615 | B1 | 2/2001 | Yasar et al. |
| 6,191,394 | B1 | 2/2001 | Shirakawa et al. |
| 6,206,176 | B1 | 3/2001 | Blonigan et al. |
| 6,235,634 | B1 | 5/2001 | White et al. |
| 6,238,161 | B1 | 5/2001 | Kirkpatrick et al. |
| 6,257,821 | B1 | 7/2001 | Ward et al. |
| 6,261,048 | B1 | 7/2001 | Muka |
| 6,271,606 | B1 | 8/2001 | Hazelton |
| 6,288,366 | B1 | 9/2001 | Dings |
| 6,296,735 | B1 | 10/2001 | Marxer et al. |
| 6,297,611 | B1 | 10/2001 | Todorov et al. |
| 6,318,951 | B1 | 11/2001 | Schmidt et al. |
| 6,361,268 | B1 | 3/2002 | Pelrine et al. |
| 6,364,592 | B1 | 4/2002 | Hofmeister |
| 6,374,748 | B1 | 4/2002 | Shiwaku et al. |
| 6,382,895 | B1 * | 5/2002 | Konishi et al. ................ 414/217 |
| 6,425,722 | B1 | 7/2002 | Ueda et al. |
| 6,450,103 | B2 | 9/2002 | Svensson |
| 6,468,021 | B1 | 10/2002 | Bonora et al. |
| 6,471,459 | B2 | 10/2002 | Blonigan et al. |
| 6,483,222 | B2 | 11/2002 | Pelrine et al. |
| 6,503,365 | B1 | 1/2003 | Kim et al. |
| 6,506,009 | B1 * | 1/2003 | Nulman et al. ............ 414/217.1 |
| 6,517,303 | B1 | 2/2003 | White et al. |
| 6,519,504 | B1 | 2/2003 | Soraoko et al. |
| 6,540,869 | B2 | 4/2003 | Saeki et al. |
| 6,540,896 | B1 | 4/2003 | Manz et al. |
| 6,634,845 | B1 | 10/2003 | Komino |
| 6,641,350 | B2 | 11/2003 | Nakashima et al. |
| 6,776,880 | B1 | 8/2004 | Yamazaki |
| 6,852,194 | B2 | 2/2005 | Matsushita et al. |
| 6,962,471 | B2 | 11/2005 | Birkner et al. |
| 6,990,906 | B2 | 1/2006 | Powell et al. |
| 7,090,741 | B2 * | 8/2006 | Narushima et al. ...... 156/345.26 |
| 7,134,222 | B2 | 11/2006 | An et al. |
| 7,575,406 | B2 | 8/2009 | Hofmeister et al. |
| 7,905,960 | B2 | 3/2011 | Choi et al. |
| 2001/0026748 | A1 | 10/2001 | Blonigan et al. |
| 2002/0021050 | A1 | 2/2002 | Fujisawa et al. |
| 2002/0044860 | A1 | 4/2002 | Hayashi et al. |
| 2002/0061248 | A1 | 5/2002 | Tepman |
| 2002/0089237 | A1 | 7/2002 | Hazelton |
| 2002/0090287 | A1 | 7/2002 | Pelrine et al. |
| 2002/0144881 | A1 | 10/2002 | Miyauchi et al. |
| 2002/0150448 | A1 | 10/2002 | Mizokawa et al. |
| 2002/0192056 | A1 | 12/2002 | Reimer et al. |
| 2003/0129045 | A1 | 7/2003 | Bonora et al. |
| 2003/0217668 | A1 | 11/2003 | Fiske et al. |
| 2004/0119358 | A1 | 6/2004 | Thornton et al. |
| 2004/0151562 | A1 | 8/2004 | Hofmeister et al. |
| 2005/0105991 | A1 | 5/2005 | Hofmeister et al. |
| 2005/0111938 | A1 | 5/2005 | van der Meulen |
| 2005/0111956 | A1 | 5/2005 | van der Meulen |
| 2005/0113964 | A1 | 5/2005 | van der Meulen |
| 2005/0113976 | A1 | 5/2005 | van der Meulen |
| 2005/0118009 | A1 | 6/2005 | van der Meulen |
| 2005/0120578 | A1 | 6/2005 | van der Meulen |
| 2005/0223837 | A1 | 10/2005 | van der Meulen |
| 2008/0063496 | A1 | 3/2008 | Bufano et al. |
| 2011/0232844 | A1 | 9/2011 | Hofmeister et al. |

FOREIGN PATENT DOCUMENTS

| | | |
|---|---|---|
| JP | 62219509 | 9/1987 |
| JP | 63102238 | 5/1988 |
| JP | 1117041 | 5/1989 |
| JP | 1230242 | 9/1989 |
| JP | 11307614 | 11/1991 |
| JP | 4275449 | 10/1992 |
| JP | 5090383 | 4/1993 |
| JP | 542236 | 6/1993 |
| JP | 5176416 | 7/1993 |
| JP | 7176593 | 7/1995 |
| JP | 7228344 | 8/1995 |
| JP | 7228345 | 8/1995 |
| JP | 8119409 | 5/1996 |
| JP | 9308292 | 11/1997 |
| JP | 2001392702 | 11/1997 |
| JP | 11-288989 | 10/1999 |
| JP | 2001-189363 | 7/2001 |
| JP | 2002141293 | 5/2002 |
| JP | 2003282669 | 3/2003 |
| JP | 2003179120 | 6/2003 |
| JP | 2003197709 | 7/2003 |
| JP | 2004273842 | 9/2004 |
| JP | 2004274889 | 9/2004 |
| JP | 2005508085 | 3/2005 |
| JP | 2005228917 | 8/2005 |
| JP | 2005534176 | 11/2005 |
| WO | 94/26640 | 11/1994 |
| WO | 97/27977 | 7/1997 |

(56) References Cited

FOREIGN PATENT DOCUMENTS

| WO | 99/23504 | 5/1999 |
| WO | 99/33691 | 7/1999 |
| WO | 99/59190 | 11/1999 |
| WO | 99/59928 | 11/1999 |
| WO | 99/60611 | 11/1999 |
| WO | 99/61350 | 12/1999 |
| WO | 00/68974 | 11/2000 |
| WO | 01/102211 | 1/2001 |
| WO | 0102211 | 1/2001 |
| WO | 01/22477 | 3/2001 |
| WO | 01/38124 | 5/2001 |
| WO | 0138124 | 5/2001 |
| WO | 01/71684 | 9/2001 |
| WO | 0175965 | 10/2001 |
| WO | 02/051728 | 7/2002 |
| WO | 02/099854 | 12/2002 |
| WO | 03/038869 | 5/2003 |
| WO | 03048012 | 6/2003 |
| WO | 2004010476 | 1/2004 |
| WO | 03038869 | 2/2004 |
| WO | WO 2004040089 | 5/2004 |

OTHER PUBLICATIONS

Supplemental European Search Report, EP 03 76 5906, Apr. 15, 2010, 3 pages.

International Search Report, PCT/US07/12407, Nov. 26, 2007, 3 pages.

Patent Abstracts of Japan, No. 2004040089, filed May 21, 2003, Evers et al.

International Search Report, PCT/US05/36650, Dec. 22, 2005, 1 page.

International Search Report, PCT/US94/05073, Aug. 18, 1994, 3 pages.

"Distributed Servo Products," Agile Systems, Inc. 3 pages, www.agile-systems.com/servocontrols.htm, accessed Oct. 20, 2005.

A Low Cost USB-CAN Distributed Motion Control System, Circuit Cellular Website, www.circuitcellular/flash2002/First/abstractM250.htm, 8 pages, accessed Oct. 20, 2005.

Chris Rand, "Distributed Motion Control," Engineering Talk website, 2 pages, www.engineeringtalk.com/guides/distributed-motion-control.html, accessed Oct. 20, 2005.

"Rorze Products Overview," RR-713, Rorze Automation Products Website, 2 pages, www.rorzeautomation.com/rorzeproducts/, accessed Oct. 20, 2005.

Yoshinobu Hayashi, et al.,"Semiconductor Equipment Design for Short Cycle Time Manufacturing," Future Fab International Website, 9 pages, www.future-fab.com/documents.asp?grID=212&d_ID=1154, accessed Oct. 20, 2005.

"International SeMaTec 13001 Factory Guidelines," Version 5.0, 94 pages, Apr. 28, 2000.

Mikell P. Groover, "Fundamentals of Modern Manufacturing," Materials, Process and Systems, Second Edition, p. 888-906, Dec. 2003.

Mtchell Weiss, "The Automated Semiconductor Manufacturer Circa 2020,", 2 pages, May 1, 1997.

ITRS 2001 Factory Integration Chapter, "Material Handling Backup Systems," 2005 ITRS Factory Integration TWG, 46 pages, accessed Oct. 20, 2005.

Daifuku America Corporation, "Cleanway 700 CLW-700," 1 page, www.daifukuamerica.com/daifuku/dac/efa/c_clw700.asp, accessed Oct. 20, 2005.

Daifuku America Corporation, "Cleanway 600 CLW-600," 1 page, www.daifukuamerica.com/daifuku/dac/efa/c_clw600.asp, accessed Oct. 20, 2005.

Yoshinobu Hayashi, "Semiconductor Equipment for Short Cycle Time Manufacturing," Tokyo Electron Ltd., 5 pages, Jun. 1, 2000, SEMICON Kansai 2000 ULSI Technology Seminar.

Glenn Chapman, "Semiconductor Wafer Transport in a High Vacuum Microgravity Environment," Professor Glenn Chapman homepage, 24 pages, http://deneb.ensc.sfu.ca/, accessed Oct. 20, 2005.

Product Description of "Ferrofluidic Sealing Sub-Assemblies," Ferrotec USA, 3 pages, http://www.ferrotec.com/usa/sealing_sub_systems.htm, accessed Oct. 20, 2005.

"Linear Motor Robots Finding Varied Applications," 3 pages, Robotics World, Fall 1994.

Mikel P. Groover, et al, "Industrial Robotics: Technology Programming and Applications," pp. 313, 316, 431-445, published Mar. 1, 1986.

"Flexible Material Handling Automation in Wafer Fabrication," James P. Harper, et al, VEECO Integrated Automation, Inc., Solid State Technology, Jul. 1984.

Serope Kalpakjian, Excerted pages from Manufacturing Engineering and Technology, 3rd Edition, pp. 1017, 1162, 1197, published 1995.

ULVAC Products Description of In-Line Sputter System New SDP-S Series, 1 page, Published circa 2005.

* cited by examiner

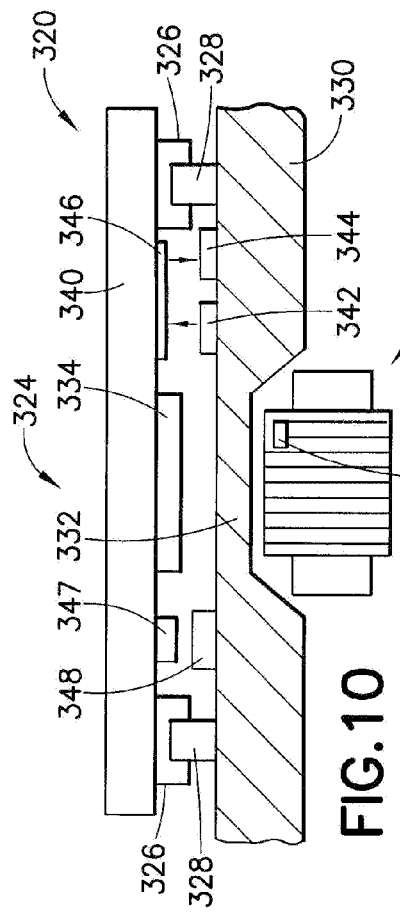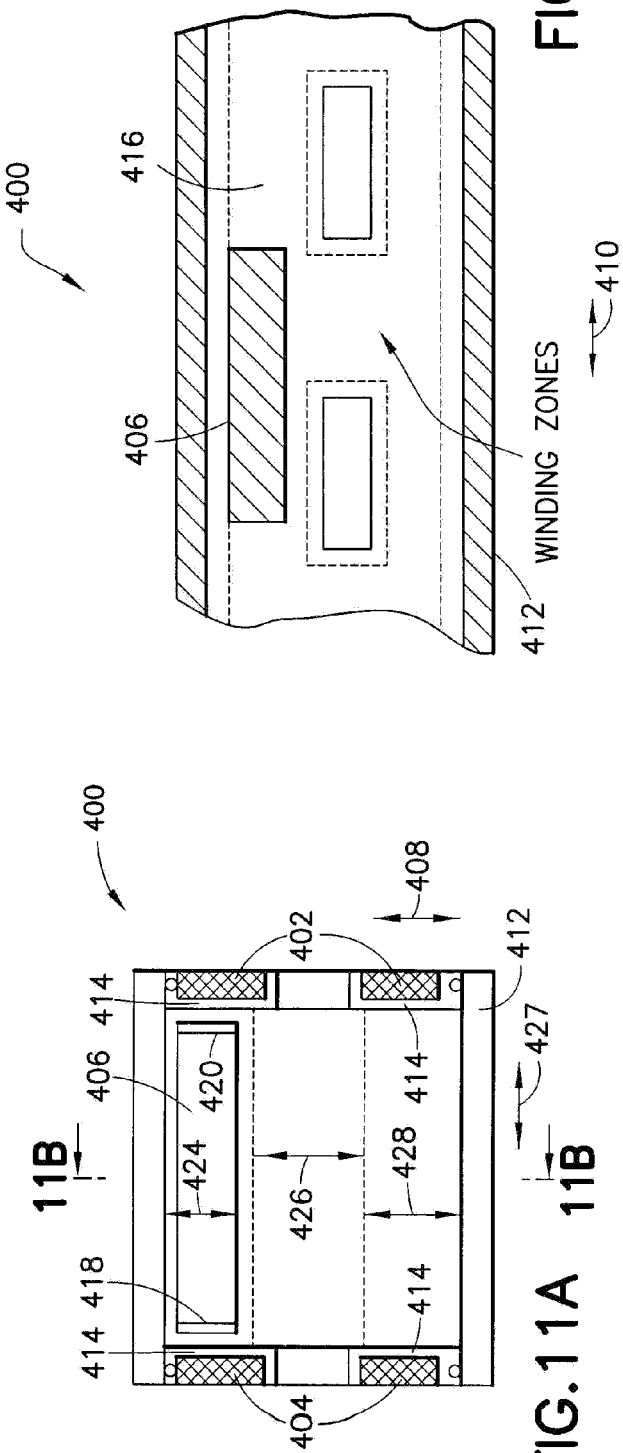

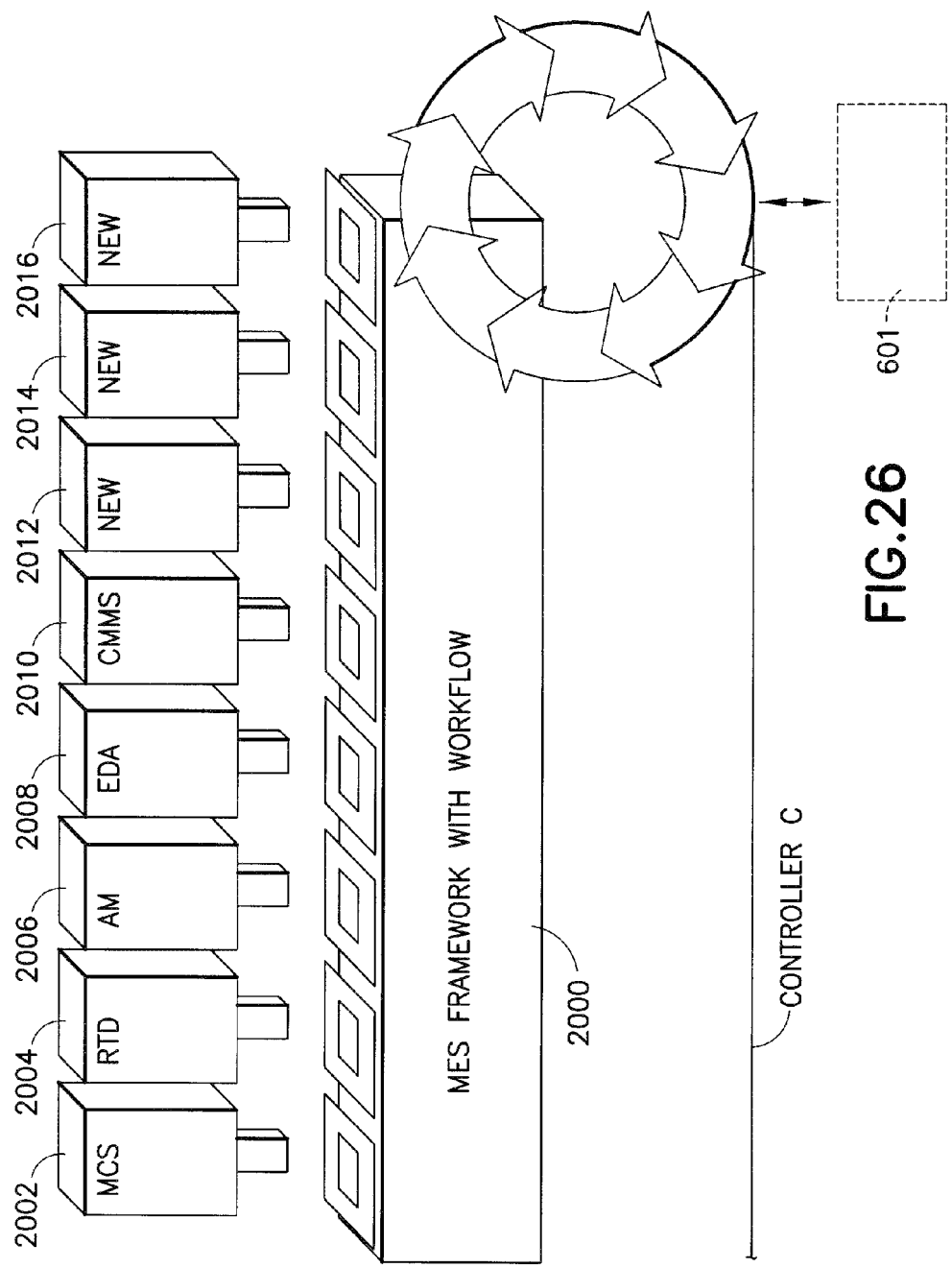

SUBSTRATE PROCESSING APPARATUS

CROSS-REFERENCE TO RELATED APPLICATION(S)

This is a divisional of application Ser. No. 11/442,509, filed May 26, 2006, that is a continuation-in-part of application Ser. No. 10/962,787, filed Oct. 9, 2004, that is a continuation in part of application Ser. No. 10/624,987, filed Jul. 22, 2003, that claims the benefit of U.S. Provisional Application No. 60/397,895, filed Jul. 22, 2002, which is incorporated by reference herein in its entirety.

BACKGROUND INFORMATION

1. Field

The embodiments and methods described herein relate to substrate processing apparatus and, more particularly, to substrate processing apparatus with chambers interconnected in a Cartesian arrangement.

2. Brief Description of Earlier Developments

One of the factors affecting consumer desire for new electronic devices naturally is the price of the device. Conversely, if the cost, and hence the price of new electronic devices can be lowered, it would appear that a beneficial effect would be achieved in consumer desires for new electronic devices. A significant portion of the manufacturing costs for electronic devices is the cost of producing the electronics which starts with the manufacturing and processing of semi-conductor substrates such as used in manufacturing electronic components, or panels used for making displays. The cost of processing substrates is affected in part by the cost of the processing apparatus, the cost of the facilities in which the processing apparatus are housed, and in large part by the throughput of the processing apparatus (which has significant impact on unit price). As can be immediately realized, the size of the processing apparatus itself impacts all of the aforementioned factors. However, it appears that conventional processing apparatus have reached a dead end with respect to size reduction. Moreover, conventional processing apparatus appear to have reached a limit with respect to increasing throughput per unit. For example, conventional processing apparatus may use a radial processing module arrangement. A schematic plan view of a conventional substrate processing apparatus is shown in FIG. 1. As can been seen, the processing modules of the apparatus in FIG. 1 are placed radially around the transport chamber of the processing apparatus. The transport apparatus, which is a conventional two or three axis of movement apparatus (e.g. Z, θ, T Axis) is centrally located in the transport chamber to transport substrates between processing modules. As can be realized from FIG. 1, throughput of the conventional processing apparatus is limited by the handling rate of the transport apparatus. In other words, throughput cannot be increased with the conventional apparatus by merely adding processing modules to the apparatus, because once the transport apparatus reaches a handling rate peak, this becomes the controlling factor for throughput. The apparatus of the present invention overcome the problems of the prior art as will be described further below.

SUMMARY OF THE EMBODIMENTS AND METHODS

In accordance with an exemplary embodiment, a substrate processing apparatus is provided. The apparatus comprises a transport chamber defining more than one substantially linear substrate transport paths extending longitudinally along the transport chamber between opposing walls of the transport chamber, a generally linear array of substrate holding modules alongside the transport chamber each communicably connected to the chamber to allow passage of a substrate between transport chamber and holding module, and a substrate transport located in and movably mounted to the transport chamber for transporting the substrate along the more than one substantially linear substrate transport paths, the substrate transport having at least one transporter capable of holding and moving the substrate on at least one of the more than one substantially linear paths. The transport chamber further has different transport tubes having at least one of which is sealable at both ends of the transport tube and configured to hold an isolated atmosphere different from an atmosphere of another of the transport tubes where the at least one transporter is configured to travel through the transport tubes having different atmospheres for transporting substrates through the different atmospheres corresponding to respective substrate holding modules. Each of the different transport tubes having at least one, of the substrate transport paths located therein are different from another of the transport paths located in another of the transport tubes. Further, being communicably connected to each other at a first location to allow substrate transfer between different substrate transport paths in different transport tubes, each transport tube extending longitudinally to another location common to each transport tube and distant from the first location, where at least one of the transport tubes is configured to provide substantially uninterrupted transit of the substrate transport through the at least one of the transport tubes along a respective transport path.

BRIEF DESCRIPTION OF THE DRAWINGS

The foregoing aspects and other features of the present invention are explained in the following description, taken in connection with the accompanying drawings, wherein:

FIG. 10 is an end view of a platen drive system of the substrate processing apparatus;

FIGS. 11A-11B are respectively an end view, and a section view (taken along lines 11B-11B in FIG. 11A) of another platen drive system of the substrate processing apparatus;

FIG. 26 is a schematic diagram of system control software in the controller of the apparatus.

DETAILED DESCRIPTION OF THE EMBODIMENTS

Figure 2:
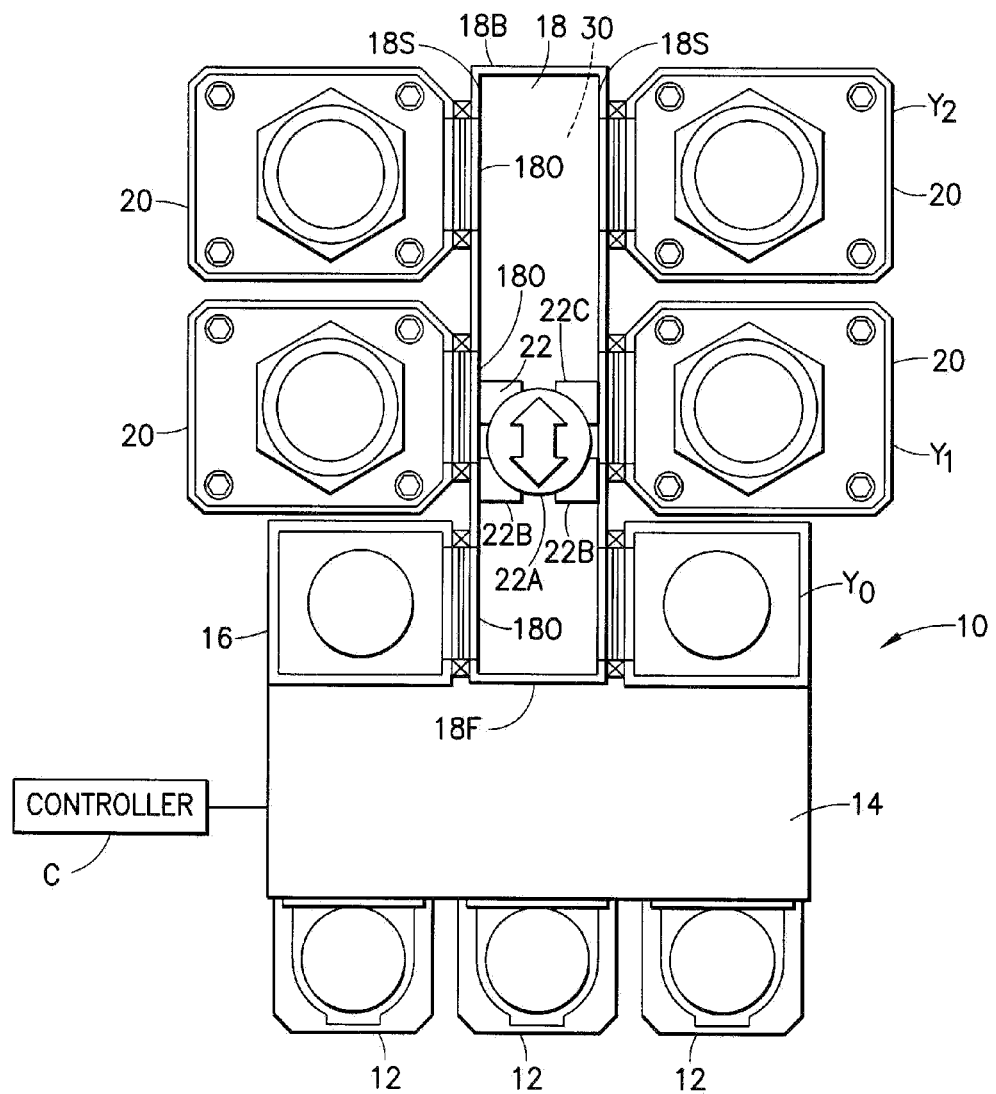
FIG. 2 is a schematic plan view of a substrate processing apparatus incorporating features of the present invention in accordance with a first embodiment.

Referring to FIG. 2, there is shown a schematic plan view of a substrate processing apparatus 10 incorporating features of the present invention. Although the present invention will be described with reference to the embodiments shown in the drawings, it should be understood that the present invention can be embodied in many alternate forms of embodiments. In addition, any suitable size, shape or type of elements or materials could be used.

The substrate processing apparatus 10 is connected to an environmental front end module (EFEM) 14 which has a number of load ports 12 as shown in FIG. 2. The load ports 12 are capable of supporting a number of substrate storage canisters such as for example conventional FOUP canisters; though any other suitable type may be provided. The EFEM 14 communicates with the processing apparatus through load locks 16 which are connected to the processing apparatus as will be described further below. The EFEM 14 (which may be open to atmosphere) has a substrate transport apparatus (not shown) capable of transporting substrates from load ports 12 to load locks 16. The EFEM 14 may further include substrate alignment capability, batch handling capability, substrate and carrier identification capability or otherwise. In alternate embodiments, the load locks 16 may interface directly with the load ports 12 as in the case where the load locks have batch handling capability or in the case where the load locks have the ability to transfer wafers directly from the FOUP to the lock. Some examples of such apparatus are disclosed in U.S. Pat. Nos. 6,071,059, 6,375,403, 6,461,094, 5,588,789, 5,613, 821, 5,607,276, 5,644,925, 5,954,472, 6,120,229 and U.S. patent application Ser. No. 10/200,818 filed Jul. 22, 2002 all of which are incorporated by reference herein in their entirety. In alternate embodiments, other lock options may be provided.

Figure 1:
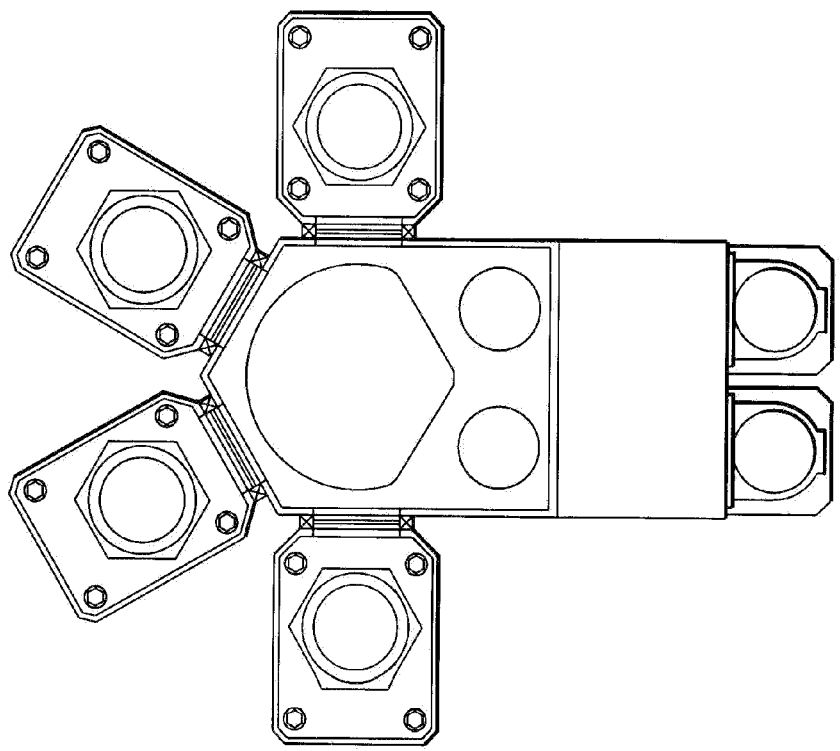
FIG. 1 is a schematic plan view of a substrate processing apparatus in accordance with the prior art.
Figure 4:
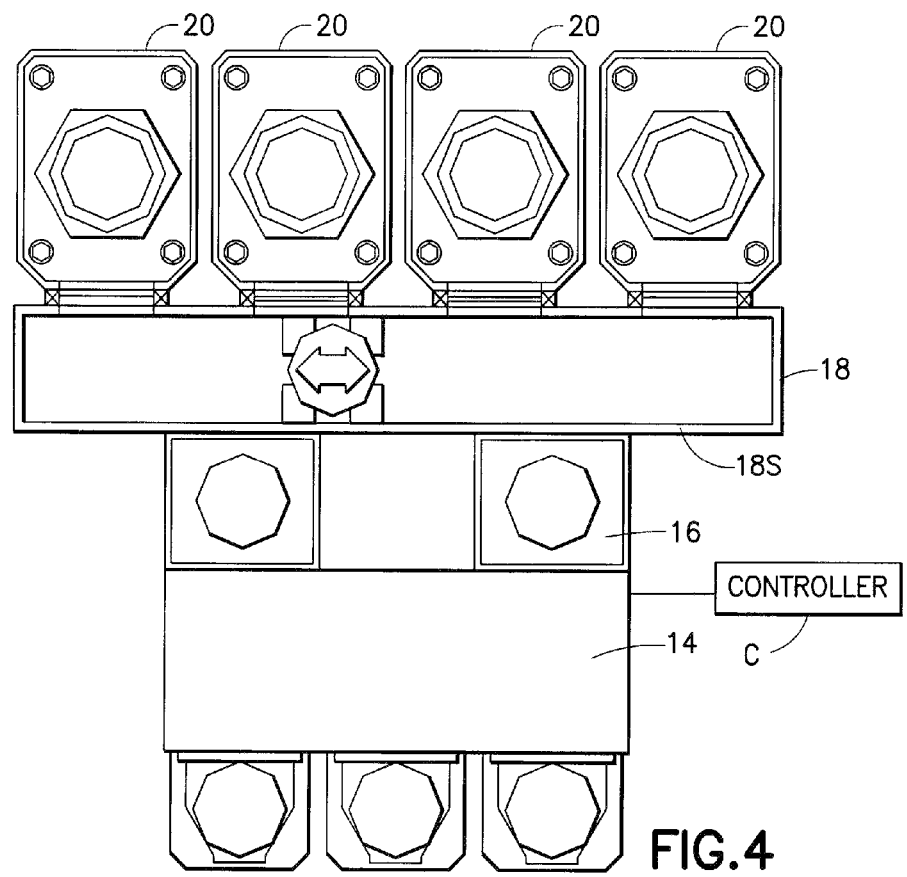
FIGS. 4-5 are respectively schematic plan views of substrate processing apparatus in accordance with still other embodiments of the present invention.
Figure 5:
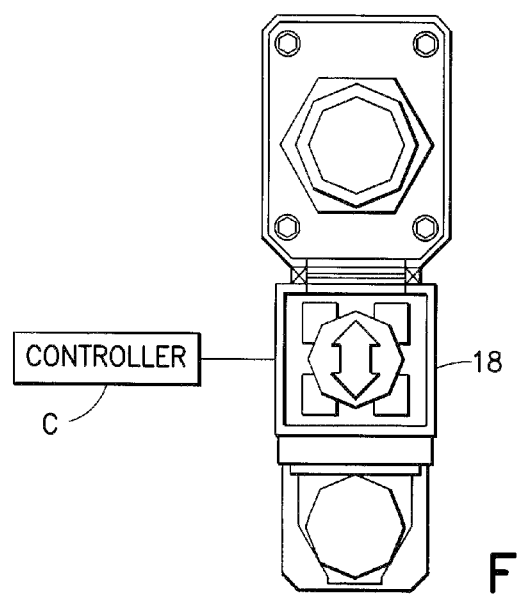

Still referring to FIG. 2, the processing apparatus 10, which as noted before may be used for processing semiconductor substrates (e.g. 200/300 mm wafers), panels for flat panel displays, or any other desired kind of substrate, generally comprises transport chamber 18, processing modules 20, and at least one substrate transport apparatus 22. The substrate transport apparatus 22 in the embodiment shown is integrated with the chamber 18. In this embodiment, processing modules are mounted on both sides of the chamber. In other embodiments, processing modules may be mounted on one side of the chamber as shown for example in FIG. 4. In the embodiment shown in FIG. 2, processing modules 20 are mounted opposite each other in rows Y1, Y2 or vertical planes. In other alternate embodiments, the processing modules may be staggered from each other on the opposite sides of the transport chamber or stacked in a vertical direction relative to each other. The transport apparatus 22 has a cart 22C that is moved in the chamber to transport substrates between load locks 16 and the processing chambers 20. In the embodiment shown, only one cart 22C is provided, in alternate embodiments, more carts may be provided. As seen in FIG. 2, the transport chamber 18 (which is subjected to vacuum or an inert atmosphere or simply a clean environment or a combination thereof in its interior) has a configuration, and employs a novel substrate transport apparatus 22 that allows the processing modules to be mounted to the chamber 18 in a novel Cartesian arrangement with modules arrayed in substantially parallel vertical planes or rows. This results in the processing apparatus 10 having a more compact footprint than a comparable conventional processing apparatus (i.e. a conventional processing apparatus with the same number of processing modules) as is apparent from comparing FIGS. 1 and 2. Moreover, the transport chamber 22 may be capable of being provided with any desired length to add any desired number of processing modules, as will be described in greater detail below, in order to increase throughput. The transport chamber may also be capable of supporting any desired number of transport apparatus therein and allowing the transport apparatus to reach any desired processing chamber on the transport chamber without interfering with each other. This in effect decouples the throughput of the processing apparatus from the handling capacity of the transport apparatus, and hence the processing apparatus throughput becomes processing limited rather than handling limited. Accordingly, throughput can be increased as desired by adding processing modules and corresponding handling capacity on the same platform.

Still referring to FIG. 2, the transport chamber 18 in this embodiment has a general rectangular shape though in alternate embodiments the chamber may have any other suitable shape. The chamber 18 has a slender shape (i.e. length much longer than width) and defines a generally linear transport path for the transport apparatus therein. The chamber 18 has longitudinal side walls 18S. The side walls 18S have transport openings or ports 180 formed therethrough. The transport ports 180 are sized large enough to allow substrates to pass through the ports (can be through valves) into and out of the transport chamber. As can be seen in FIG. 2, the processing modules 20 in this embodiment are mounted outside the side walls 18s with each processing module being aligned with a corresponding transport port in the transport chamber. As can be realized, each processing module 20 may be sealed against the sides 18S of the chamber 18 around the periphery of the corresponding transport aperture to maintain the vacuum in the transport chamber. Each processing module may have a valve, controlled by any suitable means to close the transport port when desired. The transport ports 180 may be located in the same horizontal plane. Accordingly, the processing modules on the chamber are also aligned in the same horizontal plane. In alternate embodiments the transport ports may be disposed in different horizontal planes. As seen in FIG. 2, in this embodiment, the load locks 16 are mounted to the chamber sides 18S at the two front most transport ports 180. This allows the load locks to be adjacent the EFEM 14 at the front of the processing apparatus. In alternate embodiments, the load locks may be located at any other transport ports on the transport chamber such as shown for example in FIG. 4. The hexahedron shape of the transport chamber allows the length of the chamber to be selected as desired in order to mount as many rows of processing modules as desired (for example see FIGS. 3, 5, 6-7A showing other embodiments in which the transport chamber length is such to accommodate any number of processing modules).

As noted before, the transport chamber 18 in the embodiment shown in FIG. 2 has one substrate transport apparatus 22 having a single cart 22C. The transport apparatus 22 is integrated with the chamber to translate cart 22C back and forth in the chamber between front 18F and back 18B. The transport apparatus 22 has cart 22C having end effectors for holding one or more substrates. The cart 22C of transport apparatus 22 also has an articulated arm or movable transfer mechanism 22A for extending and retracting the end effectors in order to pick or release substrates in the processing modules or load locks. To pick or release substrates from the processing modules/load ports, the transport apparatus 22 may be aligned with desired module/port and the arm is extended/retracted through the corresponding port 180 to position the end effector inside the module/port for the substrate pick/release.

The transport apparatus 22, shown in FIG. 2 is a representative transport apparatus and, includes a cart 22C which is supported from linear support/drive rails. The transport apparatus will be described in greater detail below. The linear support/drive rails may be mounted to the side walls 18S, floor, or top of the transport chamber and may extend the length of the chamber. This allows the cart 22C, and hence, the apparatus to traverse the length of the chamber. The cart has a frame, which supports the arm. The frame also supports caster mounts or platens 22B, which move with or relative to the frame. As will also be described further below, a sequential synchronous linear motor 30 drives the platens 22B and hence the cart 22C along the rails. The linear motor 30 may be located in the floor or side walls 18S of the transport chamber. A barrier, as will be seen further below, may be located between the windings of the motor and the motive portion of the platens to isolate the windings from the interior of the chamber. In general, the linear motor may include a number of drive zones. The drive zones are located at locations along the transport chamber where the arm 22A is extended/retracted (i.e. at the rows Y0-Y2 in this embodiment of modules/ports). The number and density of drive zones is dependent on the number of platens per cart, the number of motors per chamber, the number of process modules or exchange points etc. In this embodiment, the arm is operably connected to the platens 22A by a suitable linkage/transmission so that when the platens are moved by a drive motor in relative motion to each other the arm is extended or retracted. For instance, the transmission may be arranged so that when the platens are moved apart along the rails the arm is extended to the left, and when moved back closer together the arm is retracted from the left. The platens may also be suitably operated by a linear motor to extend/retract the arm 22A to/from the right. The control of movement of the platens over the slide rails with the linear motor, as well as position sensing of the platens and hence of the cart and the extended/retracted position of the arm may be accomplished in accordance with international application having publication numbers WO 99/23504; 99/33691; 01/02211; 01/38124; and 01/71684, which are incorporated by reference herein in their entireties. As can be realized, the platens may be driven in unison in one direction in order to move the entire cart/apparatus in that longitudinal direction inside the transport chamber.

Figure 3:
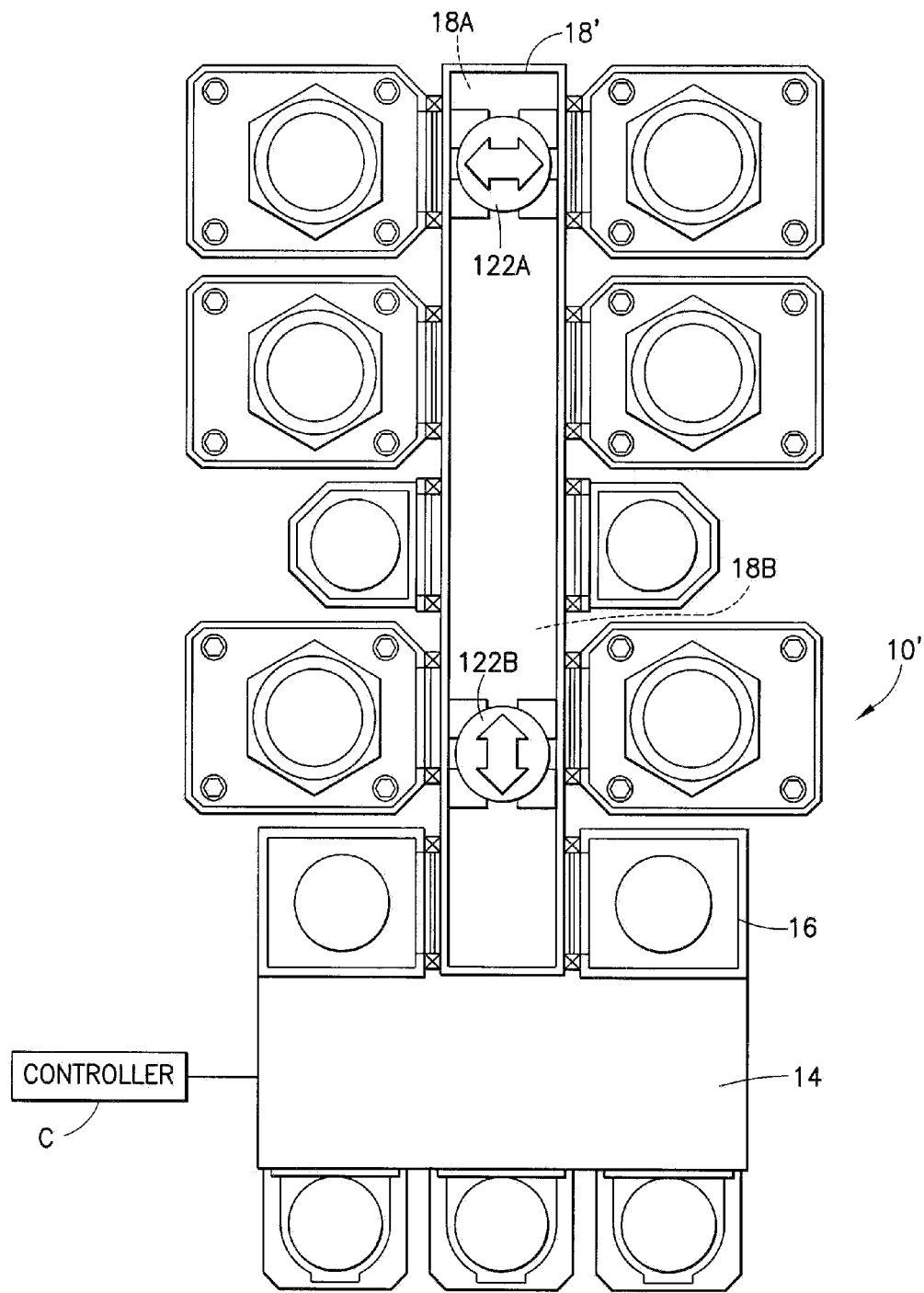
FIG. 3 is a schematic plan view of a substrate processing apparatus in accordance with another embodiment of the present invention.

FIG. 3 shows another embodiment of a substrate processing apparatus 10' which is generally similar to apparatus 10. In this embodiment, the transport chamber 18' has two transport apparatus 22A, 22B. The transport apparatus 122A, 122B are substantially the same as the apparatus 22 in the previously described embodiment. Both transport apparatus 122A, 122B may be supported from a common set of longitudinal slide rails as described before. The platens of the cart corresponding to each apparatus may be driven by the same linear motor drive. The different drive zones of the linear motor allow the independent driving of individual platens on each cart and thus also the independent driving of each individual cart 122A, 122B. Thus, as can be realized the arm of each apparatus can be independently extended/retracted using the linear motor in a manner similar to that described before. However, in this case the substrate transport apparatus 122A, 122B are not capable of passing each other in the transport chamber unless separate slide systems are employed. Accordingly, the processing modules are positioned along the length of the transport chamber so that the substrate may be transported to be processed in the processing module in a sequence which would avoid the transport apparatus from interfering with each other. For example, processing modules for coating may be located before heating modules, and cooling modules and etching modules may be located last.

However, the transport chamber 18' may have another transport zone 18'A, 18'B which allow the two transport apparatus to pass over each other (akin to a side rail, bypass rail or magnetically suspended zone that does not require rails). In this case, the other transport zone may be located either above or below the horizontal plane(s) in which the processing modules are located. In this embodiment the transport apparatus has two slide rails, one for each transport apparatus. One slide rail may be located in the floor, or side walls of the transport chamber, and the other slide rail may be located in the top of the chamber. In alternate embodiments, a linear drive system may be employed which simultaneously drives and suspends the carts where the carts may be horizontally and vertically independently moveable, hence allowing them independent of each other to pass or transfer substrates. In all embodiments employing electric windings, these windings may also be used as resistance heaters as in the case where it is desired that the chamber be heated for degas as in the case to eliminate water vapor for example. Each transport apparatus in this case may be driven by a dedicated linear drive motor or a dedicated drive zone in which the cart resides similar to that described before.

Figure 6:
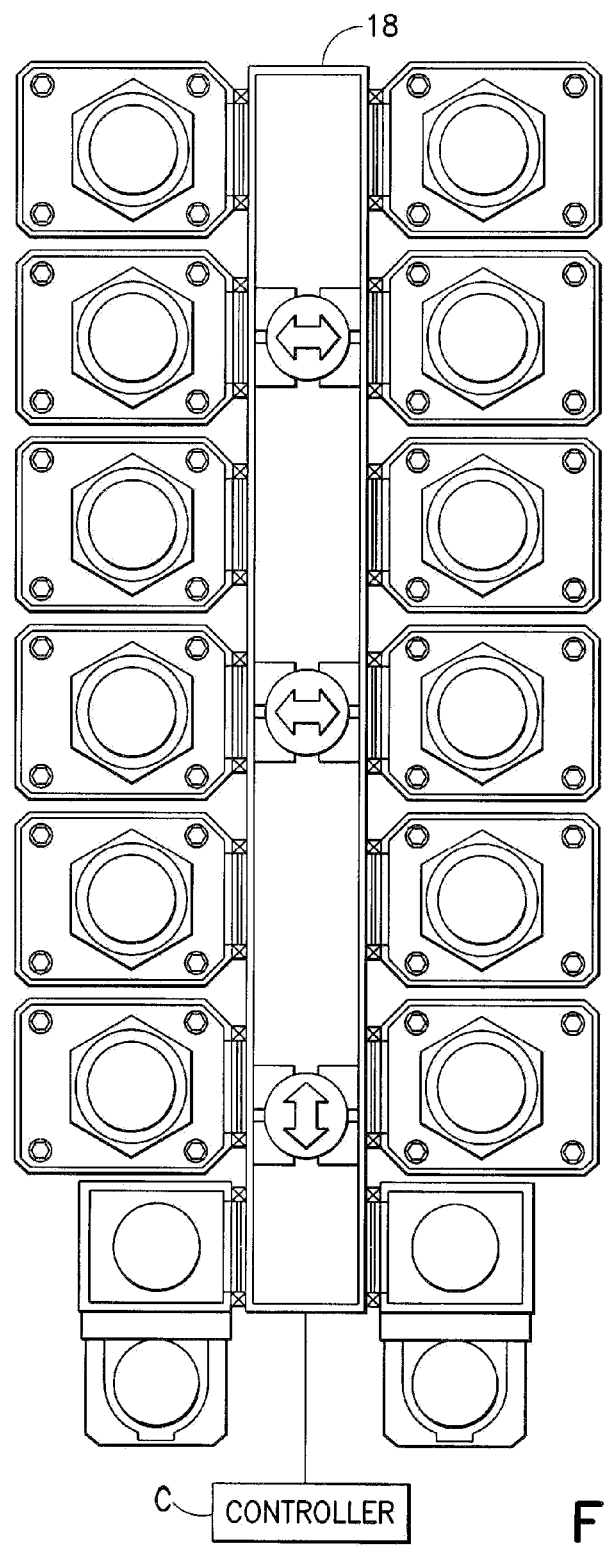
FIG. 6 is a schematic plan view of a substrate processing apparatus in accordance with yet another embodiment of the present invention.
Figure 7:
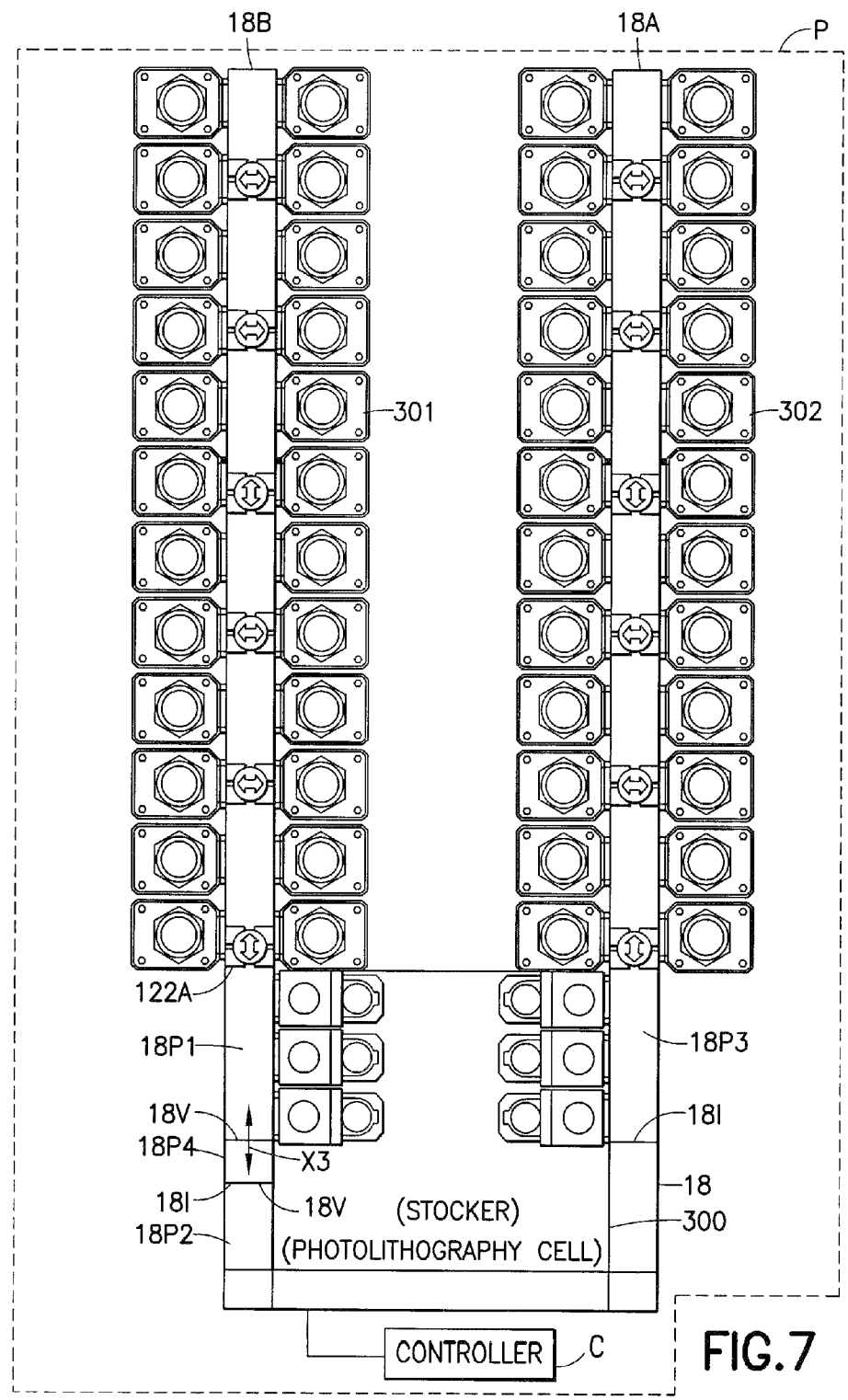
FIG. 7 is a schematic plan view of a substrate processing system with two substrate processing apparatus in accordance with another embodiment.

Referring now to FIGS. 6, and 7 there are shown other substrate processing apparatus in accordance with other embodiments of the present invention. As seen in FIGS. 6 and 7 the transport chamber in these embodiments is elongated to accommodate additional processing modules. The apparatus shown in FIG. 6 has twelve (12) processing modules connected to the transport chamber, and each apparatus (two apparatus are shown) in FIG. 7 has 24 processing module connected to the transport chamber. The numbers of processing modules shown in these embodiments are merely exemplary, and the apparatus may have any other number of processing modules as previously described. The processing modules in these embodiments are disposed along the sides of the transport chamber in a Cartesian arrangement similar to that previously discussed. The number of rows of processing modules in these case however have been greatly increased (e.g. six (6) rows in the apparatus of FIG. 6, and twelve (12) rows in each of the apparatus of FIG. 7). In the embodiment of FIG. 6, the EFEM may be removed and the load ports may be mated directly to load locks. The transport chamber of the apparatus in FIGS. 6, and 7 have multiple transport apparatus (i.e. three apparatus in the case of FIG. 6, and six apparatus in the case of FIG. 7) to handle the substrates between the load locks and the processing chambers. The number of transport apparatus shown are merely exemplary and more or fewer apparatus may be used. The transport apparatus in these embodiments are generally similar to that previously described, comprising an arm and a cart. In this case, however, the cart is supported from zoned linear motor drives in the side walls of the transport chamber. The linear motor drives in this case provide for translation of the cart in two orthogonal axis (i.e. longitudinally in the transport chamber and vertically in the transport chamber). Accordingly, the transport apparatus are capable of moving past one another in the transport chamber. The transport chamber may have "passing" or transport areas above and/or below the plane(s) of the processing modules, through which the transport apparatus may be routed to avoid stationary transport apparatus (i.e. picking/releasing substrates in the processing modules) or transport apparatus moving in opposite directions. As can be realized, the substrate transport apparatus has a controller for controlling the movements of the multiple substrate transport apparatus.

Still referring to FIG. 7, the substrate processing apparatus 18A and 18B in this case may be mated directly to a tool 300.

As may be realized from FIGS. 3, 5 and 6-7 the transport chamber 18 may be extended as desired to run throughout the processing facility P. As seen in FIG. 7, and as will be described in further detail below, the transport chamber may connect and communicate with various sections or bays, 18A, 18B in the processing facility P such as for example storage, lithography tool, metal deposition tool or any other suitable tool bays. Bays interconnected by the transport chamber 18 may also be configured as process bays or processes 18A, 18B. Each bay has desired tools (e.g. lithography, metal deposition, heat soaking, cleaning) to accomplish a given fabrication process in the semiconductor workpiece. In either case, the transport chamber 18 has processing modules, corresponding to the various tools in the facility bays, communicably connected thereto, as previously described, to allow transfer of the semiconductor workpiece between chamber and processing modules. Hence, the transport chamber may contain different environmental conditions such as atmospheric, vacuum, ultra high vacuum, inert gas, or any other, throughout its length corresponding to the environments of the various processing modules connected to the transport chamber. Accordingly, the section 18P1 of the chamber in a given process or bay 18A, 18B, or within a portion of the bay, may have for example, one environmental condition (e.g. atmospheric), and another section 18P2, 18P3 of the chamber may have a different environmental condition. As noted before, the section 18P1, 18P2, 18P3 of the chamber with different environments therein may be in different bays of the facility, or may all be in one bay of the facility. FIG. 7 shows the chamber 18 having three sections 18P1, 18P2, 18P3 with different environments for example purposes only. The chamber 18 in this embodiment may have as many sections with as many different environments as desired.

As seen in FIG. 7, the transport apparatus, similar to apparatus 122A, (see also FIG. 3) in the chamber 18 are capable of transiting between sections 18P1, 18P2, 18P3 of the chamber with different environments therein. Hence, as can be realized from FIG. 7, the transport apparatus 122A may with one pick move a semiconductor workpiece from the tool in one process or bay 18A of the processing facility to another tool with a different environment in a different process or bay 18B of the process facility. For example, transport apparatus 122A may pick a substrate in processing module 301, which may be an atmospheric module, lithography, etching or any other desired processing module in section 18P1, of transport chamber 18. The transport apparatus 122A may then move in the direction indicated by arrow X3 in FIG. 7 from section 18P1 of the chamber to section 18P3. In section 18P3, the transport apparatus 122A may place the substrate in processing module 302, which may be any desired processing module.

As can be realized from FIG. 7, the transport chamber may be modular, with chamber modules connected as desired to form the chamber 18. The modules may include internal walls 181, similar to walls 18F, 18R in FIG. 2, to segregate sections 18P1, 18P2, 18P3, 18P4 of the chamber. Internal walls 181 may include slot valves, or any other suitable valve allowing one section of the chamber 18P1, 18P4 to communicate with adjoining section. The slot valves 18V, may be sized to allow, one or more carts to transit through the valves from one section 18P1, 18P4 to another. In this way, the carts 122A may move anywhere throughout the chamber 18. The valves may be closed to isolate sections 18P1, 18P2, 18P3, 18P4 of the chamber so that the different sections may contain disparate environments as described before. Further, the internal walls of the chamber modules may be located to form load locks 18P4 as shown in FIG. 2. The load locks 18P4 (only one is shown in FIG. 2 for example purposes) may be located in chamber 18 as desired and may hold any desired number of carts 122A therein.

Figure 9:
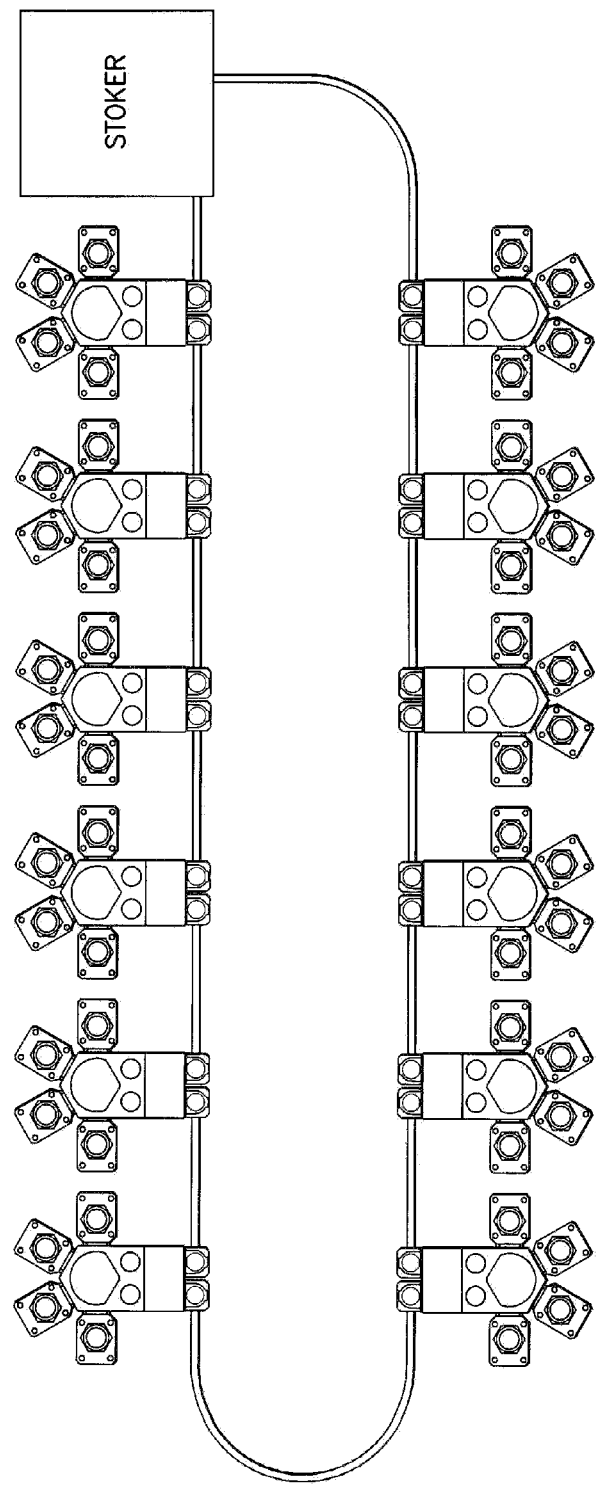
FIG. 9 is a schematic plan view of a conventional substrate processing system including a number of conventional processing apparatus and a stocker.

In the embodiment shown in FIG. 7, processes 18A and 18B may be the same process, for example etch, where the processing apparatus 18A and 18B in combination with tool 300 being a stocker are capable of processing equal amounts of substrates as, for example the apparatus shown in FIG. 9 but without the associated material handling overhead associated with transporting FOUPS from the stocker to individual process tools via an AMHS, and transporting individual wafers via EFEM's to the respective processing tools. Instead, the robot within the stocker directly transfers FOUPS to the load ports (3 shown per tool, more or less could be provided depending on throughput requirements) where the wafers are batch moved into locks and dispatched to their respective process module(s) depending on the desired process and/or throughput required. In this manner, in a steady state fashion, the FIG. 7 apparatus and FIG. 9 apparatus may have the same throughput, but the apparatus in FIG. 7 does it with less cost, lower footprint, less WIP required—therefor less inventory and with a quicker turnaround when looking at the time to process a single carrier lot (or "hot lot") resulting in significant advantages for the fab operator. Within the tool 18A, 18B or the stocker 300 may further have metrology capability, sorting capability, material identification capability, test capability, inspection capability (put boxes . . . ) etc. as required to effectively process and test substrates.

Figure 8:
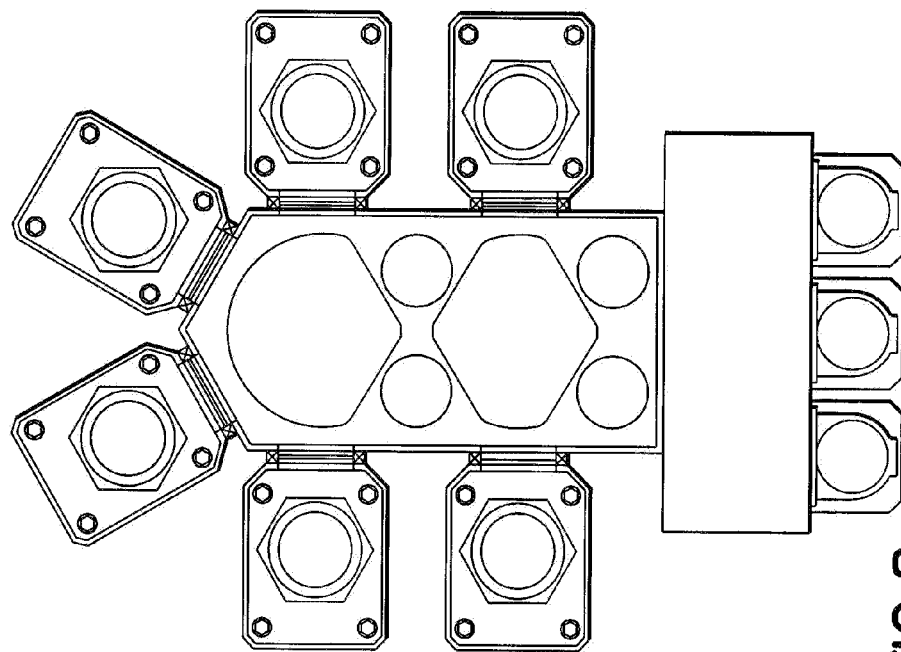
FIG. 8 is a schematic plan view of another conventional substrate processing apparatus.
Figure 7A:
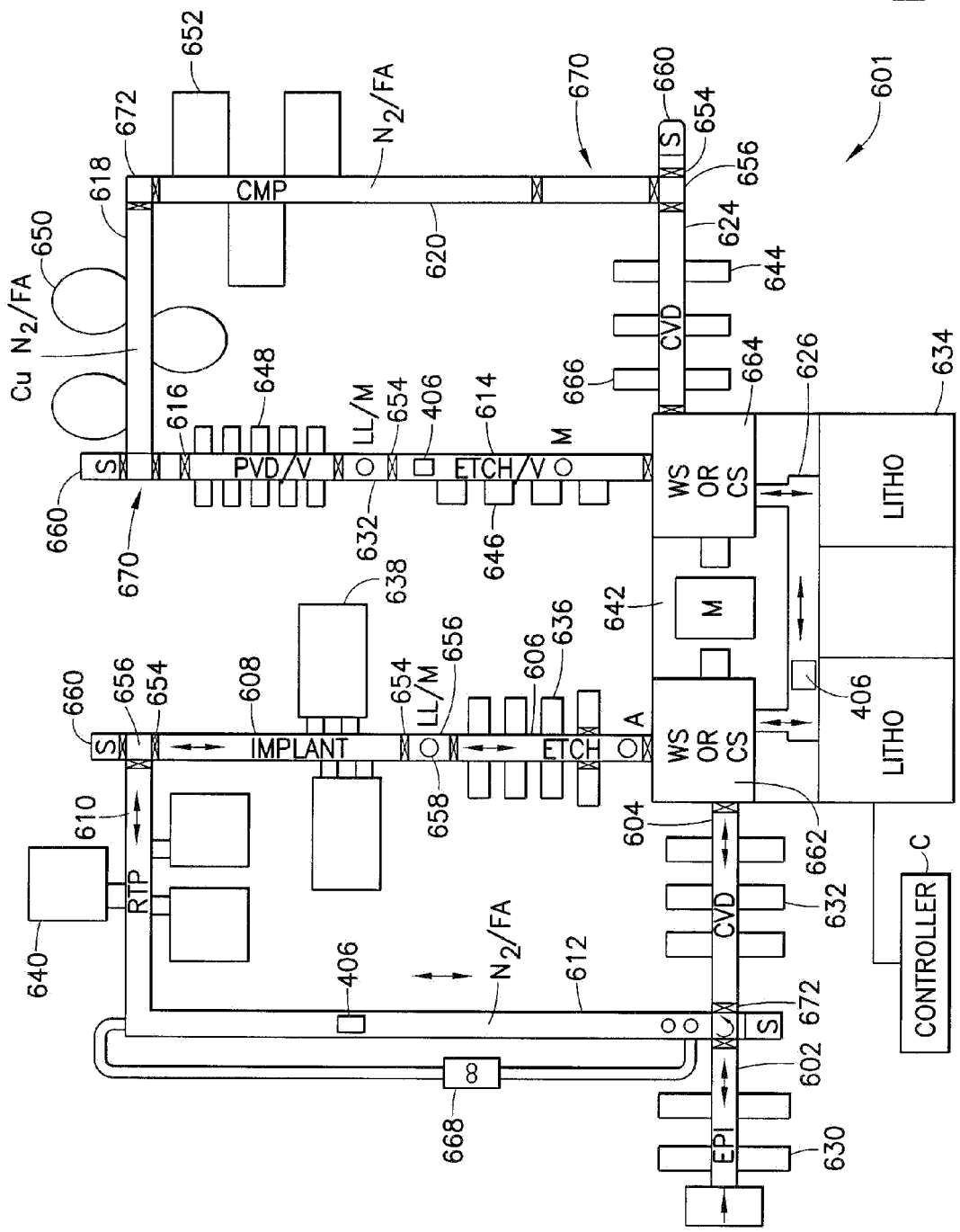
FIG. 7A is another schematic plan view of the substrate processing system in accordance with yet another embodiment.

In the embodiment shown in FIG. 7, more or less processes 18A and 18B may be provided that are different processes, for example etch, CMP, copper deposition, PVD, CVD, etc. where the processing apparatus 18A, 18B, etc. in combination with tool 300 being, for example a photolithography cell are capable of processing equal amounts of substrates as, for example multiple apparatus' shown in FIG. 9 but without the associated material handling overhead associated with transporting FOUPs to individual process tool bays and a lithography bay via an AMHS, and transporting individual wafers via EFEM's to the respective processing tools. Instead, the automation within the lithography cell directly transfers FOUPS, substrates or material to the load ports (3 shown per process type, more or less could be provided depending on throughput requirements) where the substrates are dispatched to their respective process depending on the desired process and/or throughput required. An example of such an alternative is shown in FIG. 7A. In this manner, the apparatus in FIG. 7 processes substrates with less cost, lower footprint, less WIP required—therefor less inventory and with a quicker turnaround when looking at the time to process a single carrier lot (or "hot lot"), and with a higher degree of contamination control resulting in significant advantages for the fab operator. Within the tool 18A, 18B or the tool or cell 300 may further have metrology capability, processing capability, sorting capability, material identification capability, test capability, inspection capability (put boxes . . . ) etc. . . . as required to effectively process and test substrates. As can be realized from FIG. 7, the processing apparatus 18A, 18B, and tool 300 may be coupled to share a common controller environment (e.g. inert atmosphere, or vacuum). This ensures that substrates remain in a controlled environment from tool 300 and throughout the process in apparatus 18A, 18B. This eliminates use of special environment controls of the FOUPs as in conventional apparatus configuration shown in FIG. 8.

Referring now to FIG. 7A, there is shown an exemplary fabrication facility layout 601 incorporating features of the embodiment shown in FIG. 7. Carts 406, similar to carts 22A, 122A transport substrates or wafers through process steps within the fabrication facility 601 through transport chambers 602, 604, 606, 608, 610, 612, 614, 616, 618, 620, 624, 626. Process steps may include epitaxial silicon 630, dielectric deposition 632, photolithography 634, etching 636, ion implantation 638, rapid thermal processing 640, metrology 642, dielectric deposition 644, etching 646, metal deposition 648, electroplating 650, chemical mechanical polishing 652. In alternate embodiments, more or less processes may be involved or mixed; such as etch, metal deposition, heating and cooling operations in the same sequence. As noted before, carts 406 may be capable of carrying a single wafer or multiple wafers and may have transfer capability, such as in the case where cart 406 has the capability to pick a processed wafer and place an unprocessed wafer at the same module. Carts 406 may travel through isolation valves 654 for direct tool to tool or bay to bay transfer or process to process transfer. Valves 654 may be sealed valves or simply conductance type valves depending upon the pressure differential or gas species difference on either side of a given valve 654. In this manner, wafers or substrates may be transferred from one process step to the next with a single handling step or "one touch". As a result, contamination due to handling is minimized. Examples of such pressure or species difference could be for example, clean air on one side and nitrogen on the other; or roughing pressure vacuum levels on one side and high vacuum on the other; or vacuum on one side and nitrogen on the other. Load locks 656, similar to chambers 184P4 in FIG. 7, may be used to transition between one environment and another; for example between vacuum and nitrogen or argon. In alternate embodiments, other pressures or species may be provided in any number of combinations. Load locks 656 may be capable of transitioning a single carrier or multiple carriers. Alternately, substrate(s) may be transferred into load lock 656 on shelves (not shown) or otherwise where the cart is not desired to pass through the valve. Additional features 658 such as alignment modules, metrology modules, cleaning modules, process modules (ex: etch, deposition, polish etc. . . . ), thermal conditioning modules or otherwise, may be incorporated in lock 656 or the transport chambers. Service ports 660 may be provided to remove carts or wafers from the tool. Wafer or carrier stockers 662, 664 may be provided to store and buffer process and or test wafers. In alternate embodiments, stockers 662, 664 may not be provided, such as where carts are directed to lithography tools directly. Another example is where indexer or wafer storage module 666 is provided on the tool set. Re-circulation unit 668 may be provided to circulate and or filter air or the gas species in any given section such as tool section 612. Re-circulation unit 668 may have a gas purge, particle filters, chemical filters, temperature control, humidity control or other features to condition the gas species being processed. In a given tool section more or less circulation and or filter or conditioning units may be provided. Isolation stages 670 may be provided to isolate carts and/or wafers from different process' or tool sections that can not be cross contaminated. Locks or interconnects 672 may be provided to change cart orientation or direction in the event the cart may pick or place within a generic workspace without an orientation change. In alternate embodiments or methods any suitable combination of process sequences or make up could be provided.

Referring now to FIG. 10, there is shown an end view of an exemplary single axis platen drive system 320 in accordance with one embodiment. Drive system 320 is an example of a drive suitable for driving transport apparatus or carts 22A, 122A, 406 shown in FIGS. 2, 3, and 7-7A. System 320 has a stationary winding set which drives platen 324. Platen 324 may be supported on slide blocks 326 which are slideable on rails 328. Rails 328 are coupled to a base 330, or side walls, of the transport chamber. Base 330 provides a barrier 332 between winding 322 and platen 324. As can be realized, barrier 332 may also isolate the winding 322 from the interior environment of the chamber. Winding 322 is coupled to base 330. Platen may have magnets 334 coupled to it for interfacing the platen 324 with winding 322. A sensor 336 may be a magneto-restrictive type hall effect sensor and may be provided for sensing the presence of the magnets in platen 324 and determining proper commutation. Additionally, sensors 336 may be employed for fine position determination of platen 324. Position feedback device 340 may be provided for accurate position feedback. Device 340 may be inductive or optical for example. In the instance where it is inductive, an excitation source 342 may be provided which excites winding or pattern 346 and inductively couples back to receiver 344 via coupling between pattern 346. The relative phase and amplitude relationship used for determining the location of platen 324. A cart identification tag 347, such as an IR tag may be provided with a reader 348 provided at appropriate stations to determine cart id by station.

Referring now to FIG. 11A, there is shown an end view of platen drive system 400 in accordance with another embodiment. Referring also to FIG. 11B, there is shown a section view of drive system 400, taken along lines 11B-11B in FIG. 11A. As will be described further below, system 400 is capable of effecting movement of a platen or cart 406 (cart 406 may be similar to carts or transport apparatus 22A, 122A described before). System 400 has opposing stationary winding sets 402, 404 which drive cart 406. Winding sets 402, 404 are wound in a two dimensional driving array, vertical 408 and lateral 410. In alternate embodiments, additional arrays could be provided to drive cart 406 in different directions, for example 427 by coupling system 400 to another similar system oriented 90 degrees therefrom. The arrays are driven in multiple zones in order to allow multiple carts to be driven independently. As an example, zone 424 could be a supply zone, zone 426 could be a transfer zone, and zone 428 could be a return zone. Within each zone may be sub-zones which allow driving multiple carts within each zone. In alternate embodiments, more or less zones or sub-zones may be provided in any of a number of combinations. Cart 406 is supported by the fields produced by winding sets 402, 404 and is positionable in a non-contact manner by biasing the fields between winding sets 402 and 406. Chamber 412 may be provided as a barrier 414 between winding sets 402, 404 and cart 406. Windings exist in zone 416 as shown. Cart 406 may have platens 418, 420 with the windings. In alternate embodiments, more or less platens may be provided. Arrays of sensors may be provided for sensing the presence of the magnets in the platens or the cart or the platens for determining proper commutation and location and for fine position determination of the platens and the cart. A cart identification tag may be provided with a reader provided at appropriate stations to determine cart id by station.

Figure 12:
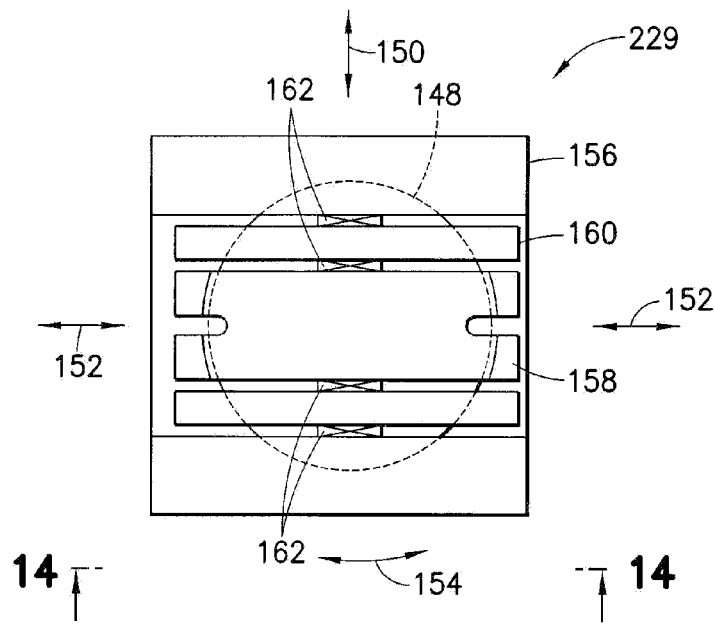
FIG. 12 is a top view of an exemplary cart of the substrate processing apparatus in accordance with another embodiment of the apparatus.

Referring now to FIG. 12, there is shown a top view of an exemplary cart 229 for the processing apparatus 10 in accordance with another embodiment of the apparatus. Cart 229 may be similar to carts 22, 122A, 406 described before and shown in FIGS. 2, 3, and 7-7A. Cart 229 is shown as being capable of transporting substrate 148 along an axial path 150 and/or a radial path 152. The cart 229 is also capable of moving the substrate along path 154 shown in FIG. 12. Cart 229 is shown as a two dimensional system for simplicity, however in alternate embodiments additional axis of motion, for example, z motion (not shown—in and out of paper) or angular motion 154 could be provided. Cart 229 is shown as being capable of handling a single substrate 148 for simplicity. However, in alternate embodiments, additional handling could be provided. For example, the cart may include capability to handle a second substrate, as in the case where it is desired that a substrate be exchanged at a process module (i.e. a first, processed substrate may be picked and a second unprocessed substrate may then be placed at the same process module from the same cart 229).

Figure 17:
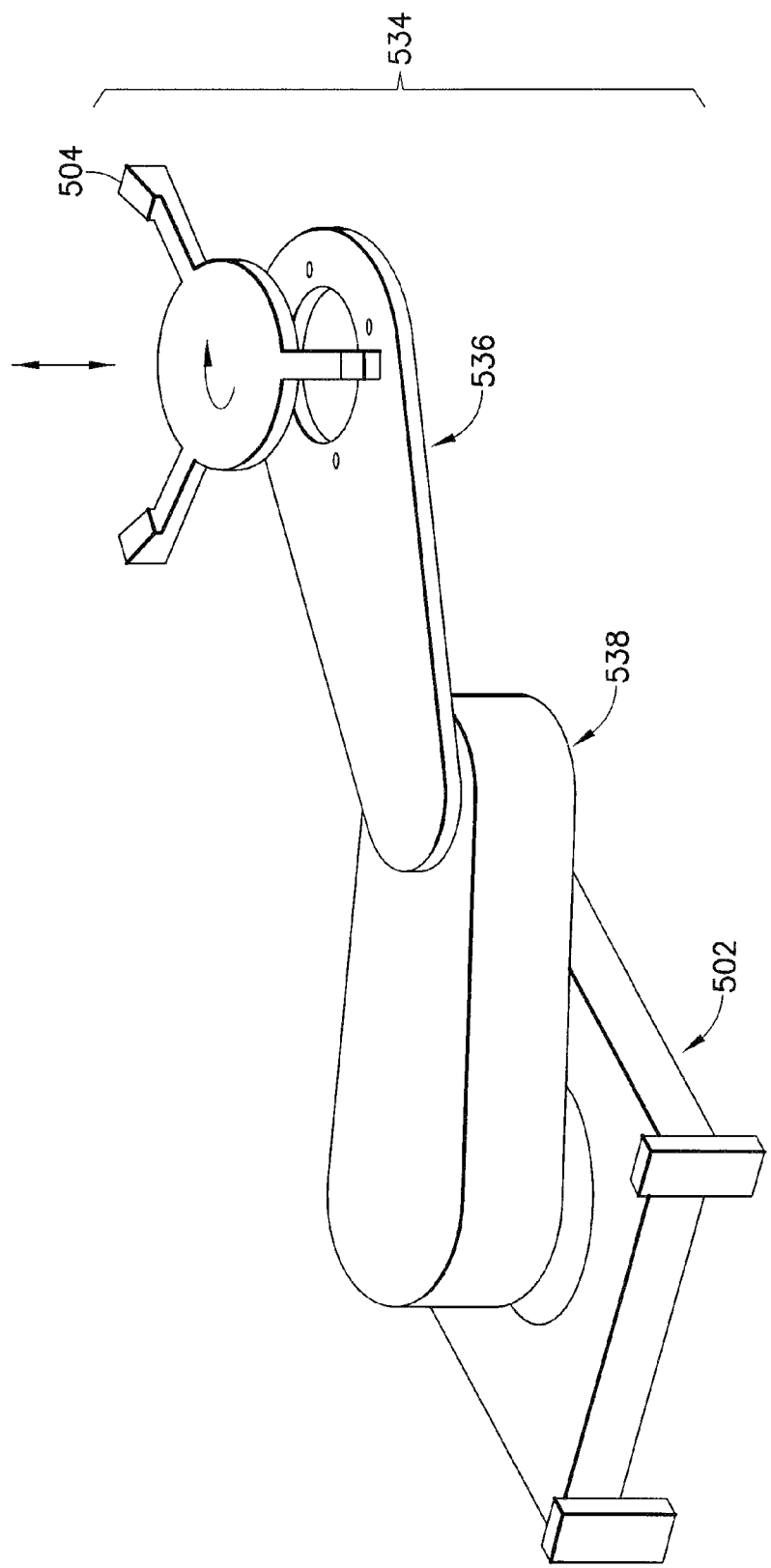
FIG. 17 is a schematic perspective view of the transport cart in accordance with another embodiment.

Cart 229 has frame 156, end effector 158 and secondary frame 160. Slides 162 constrain frame 156, end effector 158 and secondary frame 160 to be slideable relative to each other along linear path 152 either to the left or right of frame 156 as shown. Although a linear mechanism is shown, in alternate embodiments, any suitable arm system may be used such as, for example, a scara type arm coupled to frame 156 as shown in FIG. 17 and as will be described in greater detail below. Substrate 148 is supported on end effector 158.

Figure 12B:
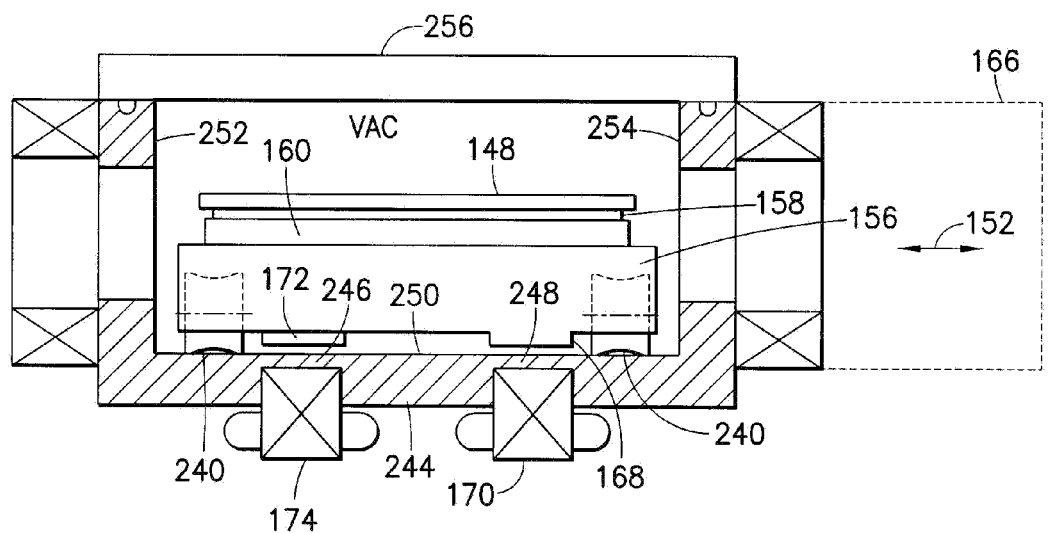
FIG. 12B is an end view of the exemplary cart in FIG. 12 in a portion of a chamber of the apparatus.
Figure 12A:
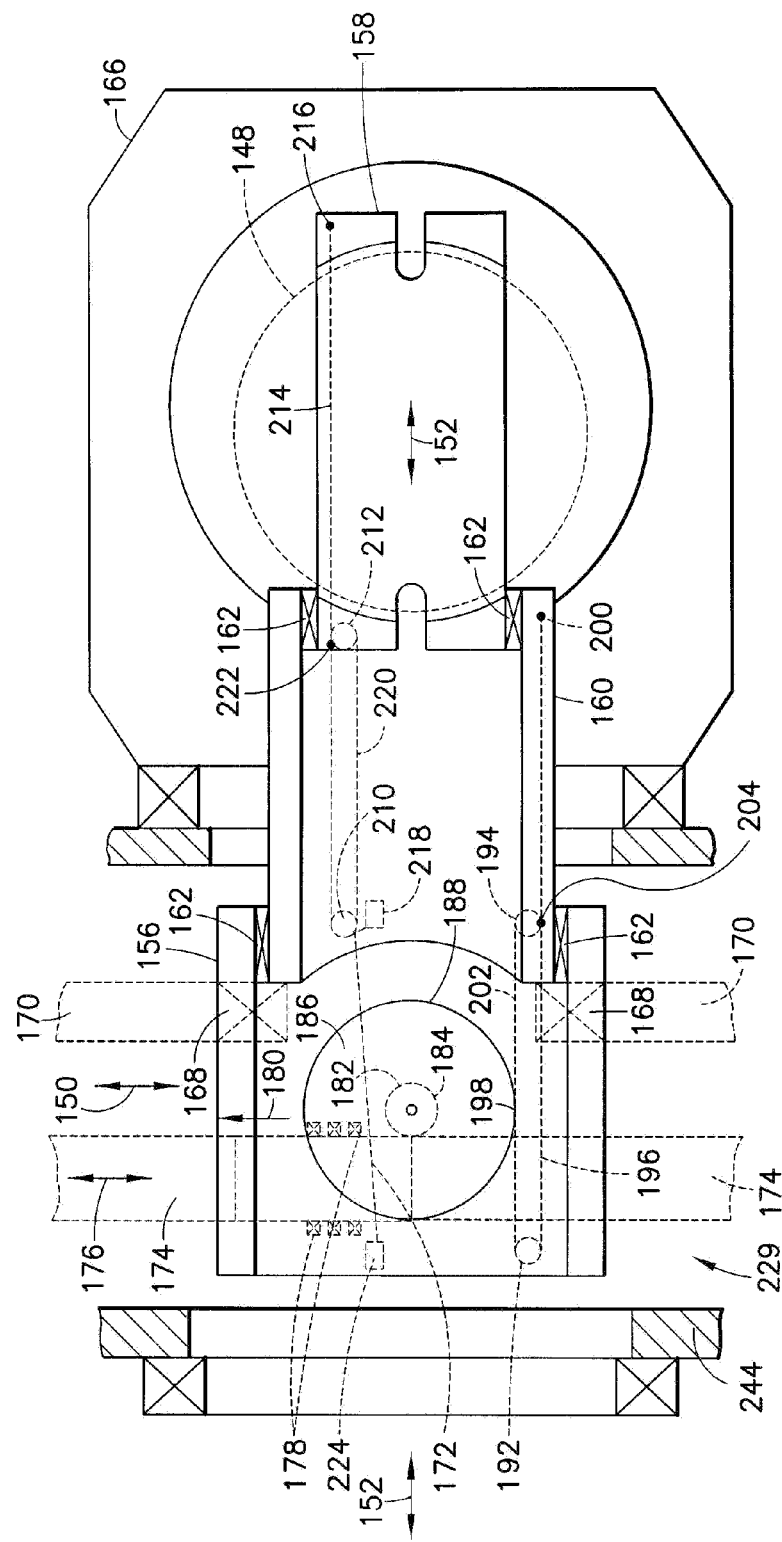
FIG. 12A is another top view of the exemplary cart in FIG. 12 with the cart shown in an extended position.

Referring now to FIG. 12A, there is shown a top view of exemplary cart 229, in a portion of chamber 229 (similar to chamber 18 and 602-626, see FIGS. 2-3, and 7-7A). The cart has the end effector 158 extended into exemplary module 166. Module 166 may be similar to any of the modules described before as being connected to the transport chamber. Cart 229 is shown as being capable of transporting substrate 148 along an axial path 150 and/or a radial path 152. Cart 229 has frame 156, end effector 158 and secondary frame 160. Slides 162 constrain frame 156, end effector 158 and secondary frame 160 to be slideable relative to each other along linear path 152 either to the left or right of frame 156 as shown. Frame 156 has magnetic platens 168 on its underside which interface with synchronous motor 170. Drive platen 172 interfaces with synchronous motor 174. Drive platen 172 is mounted on the underside of and slideable relative to frame 156 along direction 176 which is substantially parallel to direction 150 by using bearings 178. Movement of platens 168 and 172 simultaneously along direction 150 allows cart to move in direction 150 without motion in direction 152. Holding platens 168 stationary while simultaneously moving platen 172 along direction 176 relative to frame 156 causes a radial motion along direction 152 of substrate and end effector 148, 158.

Linear motion of platen 172 in direction 176 is translated into linear motion of secondary frame 160 along direction 152. Pulley 186 is rotatably coupled to frame 156 and has secondary pulleys 188 and 182. Pulley 182 is coupled to platen 172 with bands 184 such that movement of platen 172 along direction 180 causes pulley 182 to rotate in direction 190 with the opposite applying in opposing directions. Pulleys 192 and 194 are rotatably coupled to frame 156. Cable 196 is coupled to pulley 188 at point 198, wraps around pulley 192 as shown, and terminates at 200 on secondary frame 160. Cable 202 is coupled to pulley 188 at point 198, wraps around pulley 188 counterclockwise, wraps around pulley 194 as shown and terminates at 204 on secondary frame 160. In this manner, linear motion of platen 172 in direction 176 is translated into linear motion of secondary frame 160 along direction 152.

Linear motion of platen 172 in direction 176 and the translated linear motion of secondary frame 160 along direction 152 also further extends end effector 158 in direction 152 as shown. Pulleys 210 and 212 are rotatably coupled to secondary frame 160. Cable 214 is coupled to end effector 158 at point 216, wraps around pulley 210 as shown, and terminates at 218 on frame 156. Cable 220 is coupled to end effector 158 at point 222, wraps around pulley 212 and terminates at 224 on frame 156. In this manner, linear motion of platen 172 in direction 176 is translated into linear motion of secondary frame 160 along direction 152 which is further translated to further extension of end effector 158 in direction 152 as shown. In lieu of cable pulleys, the transmissions between platens and end effectors may use belts, bands or any other suitable transmission means made of any suitable materials. In alternate embodiments, a suitable linkage system may be used in place of cable pulleys to transmit motion from the platens to the end effectors. Retraction of the end effector 158, to the position shown substantially in FIG. 12, is accomplished in a similar but reverse manner. Further, extension of the end effector 158 to a position similar to but opposite from that shown in FIG. 12B is effected by moving platens 168, 172 in an opposite manner to that described above.

Referring now to FIG. 12B, there is shown an end view of cart 229 before being extended into exemplary process module 166. Slides 240 constrain frame 156 to be slideable along linear path 150 as shown. Frame 156 has magnetic platens 168 on its underside which interface with synchronous motor 170. Drive platen 172 interfaces with synchronous motor 174. Drive platen 172 is mounted on the underside of and slideable relative to frame 156 along a direction which is substantially parallel to direction indicated by arrow 150 (see FIG. 12). Movement of platens 168 and 172 simultaneously along direction 150 allows the cart to move in direction indicated by arrow 150 without motion in direction 152. Holding platens 168 stationary while simultaneously moving platen 172 along direction 176 relative to frame 156 causes a radial motion along direction 152 of substrate and end effector 148, 158. Platens 172 and 168 may have magnets that interface with motors 170 and 174. Chamber 244 may be made from a nonmagnetic material, for example non-magnetic stainless steel and provide a barrier 246, 248 between the motor windings and their respective platens. In alternate embodiments, more or less linear drives or carts may be provided. For example, a single drive motor may be provided having additional drive zones where platens 168 and 172 would interface with the same drive motor but be independently driveable by the different zones. As a further example, additional carts could be driven by different drive systems in the floor 250, the walls 252, 254 above in line with or below the slot openings or in the cover 256 of the chamber.

Figure 13A:
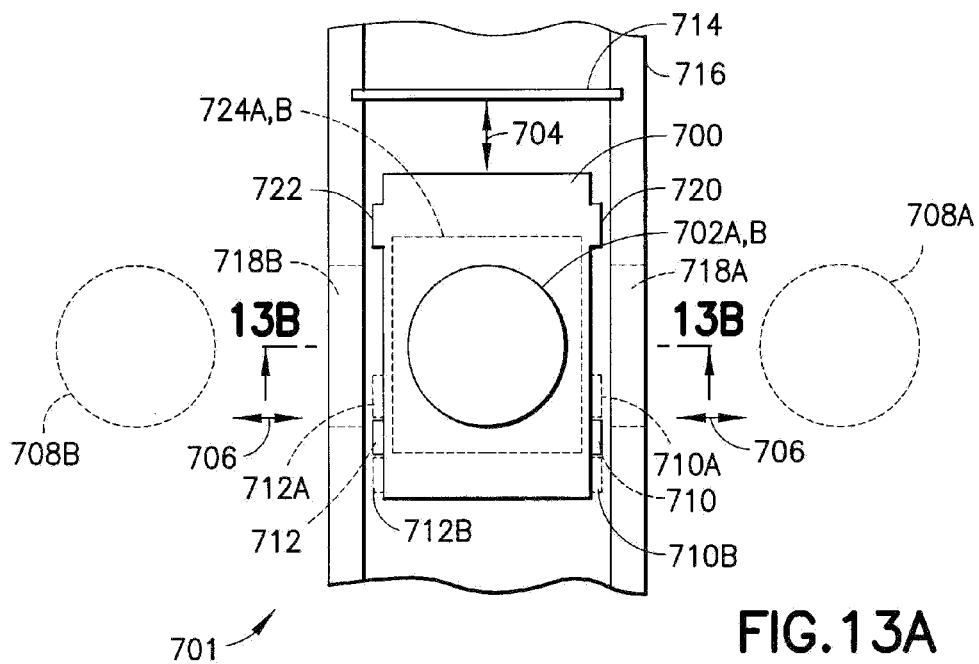
FIG. 13A is a top end view of a portion of a chamber of the apparatus with a drive system and transport cart in accordance with another embodiment of the apparatus.

Referring now to FIG. 13A, there is shown a portion of chamber 716 of the apparatus 10, and a top view of an exemplary drive system 701 with an exemplary cart 700 that may be used with the apparatus. Chamber 716 is another representative portion of chamber 18, or chambers 602-624 of the apparatus (see FIGS. 2-3, and 7-7A). Cart 700 is shown as being capable of transporting substrates 702A, 702B along an axial path 704 and/or a radial path 706 or in a Z motion (not shown—in and out of paper). In alternate embodiments, angular motion could be provided. In alternate embodiments, more or less substrate handling could be provided. Cart 700 has transport mechanisms 724A and 724B which can be a linear mechanism or any suitable arm system may be used such as, for example, a scara type arm. In alternate embodiments no arm may be provided. Transport mechanisms 724A and 724B may extended into process modules or other modules as desired in a manner similar to that shown in FIG. 12A. Cart 700 has platens 722, 720, 710 and 712 on its sides which interface with synchronous motors in the walls of transport chamber 716. Drive platen 712 is mounted on the side of cart 700 and is slideable relative to cart 700 along direction 704. Platen 712 drives mechanism 724A such that the movement of platen 712 along direction 704 (from location 712A to 712B, see FIG. 13A) relative to cart 700 allows mechanism 724A to transport wafer 702A between location 708A and 708B through slots 718A and 718B. Similarly, drive platen 710 is mounted on the side of cart 700 and is slideable relative to cart 700 along direction 704. Platen 710 drives mechanism 724B such that the movement of platen 710 along direction 704 (from location 710A to 710B, see FIG. 13A) relative to cart 700 allows mechanism 724B to transport wafer 702B between location 708A and 708B through slots 718A and 718B. Platens 710 and 712 are independently moveable relative to cart 700. Platens 722, 720 are fixed relative to cart 700. Holding platens 720, 722 stationary while simultaneously moving platen 712 along direction 704 causes a radial transfer motion along direction 706. Holding platens 720, 722 stationary while simultaneously moving platen 710 along direction 704 also causes a separate radial transfer motion along direction 706. Simultaneously moving platens 720, 722, 710 and 712 along direction 704 causes cart 700 to move along direction 704—enabling the cart 700 to move from process location to process location as through valve 714 for example.

Figure 13B:
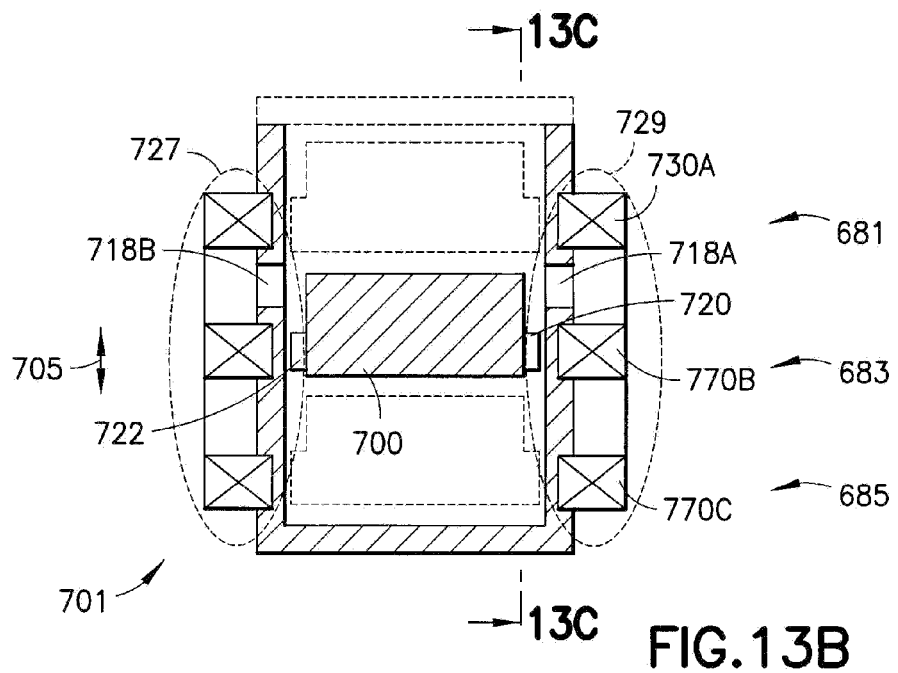
FIG. 13B-13C respectively are a section view of the chamber and cart taken along lines 13B-13B in FIG. 13A, and another section view taken along lines 13C-13C in FIG. 13B.
Figure 13C:
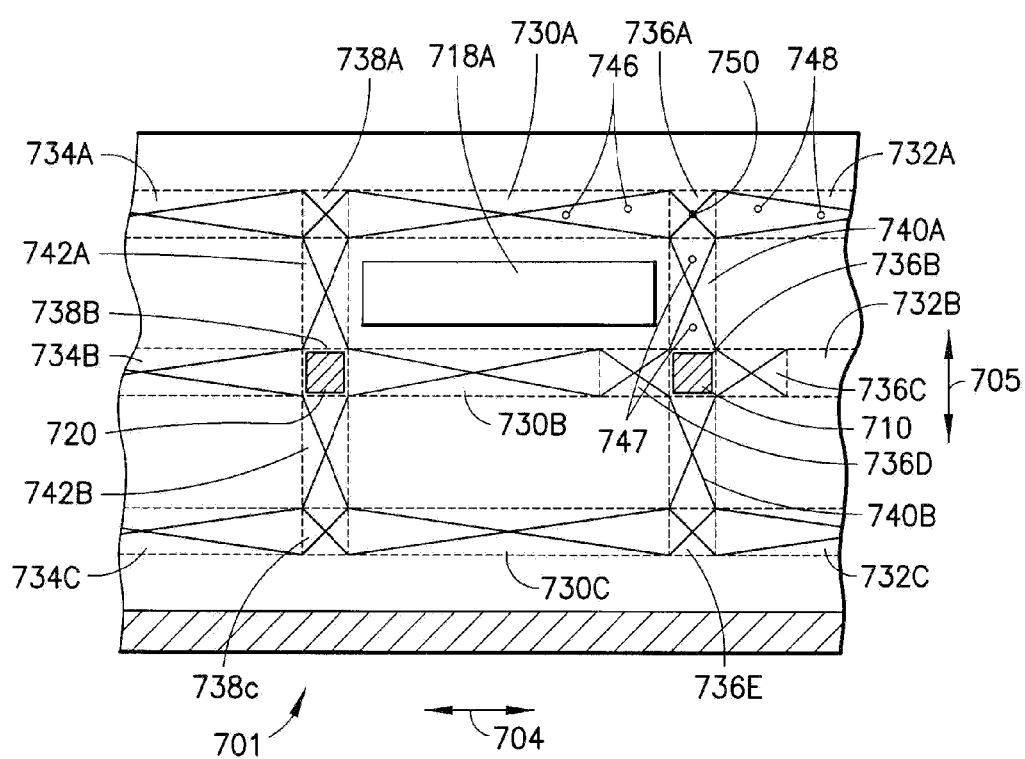
Figure 13D:
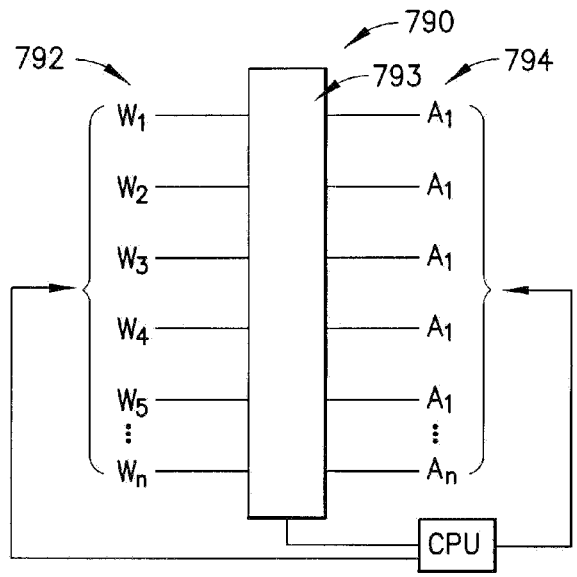
FIG. 13D is a schematic diagram of an exemplary drive system of the apparatus.

Referring now to FIG. 13B, there is shown a section view of the exemplary drive system 701 and cart 700 taken along line 13B-13B in FIG. 13A. Referring also to FIG. 13C, there is shown another side section view of the exemplary drive system 701 in FIG. 13B. System 701 has opposing stationary winding sets 727, 729 that drive cart 700. Winding sets 727, 729 are wound in a combination of one and two dimensional driving arrays, for example, vertical 705 and lateral 704. The driving arrays may be linear motors or linear stepping type motors in one or two dimensional arrays. Examples of such driving arrays are described in U.S. Pat. Nos. 4,958,115, 5,126,648, 4,555,650, 3,376,578, 3,857,078, 4,823,062, which are incorporated by reference herein in their entirety. In alternate embodiments, integrated two dimensional winding sets could be employed with platens having two dimensional magnets or patterns. In other alternate embodiments, other types of one or two dimensional drive systems could be employed. In alternate embodiments, additional arrays could be provided to drive cart 700 in different directions, for example by coupling system 701 to another similar system oriented 90 degrees therefrom. The arrays are driven in multiple zones in order to allow multiple carts to be driven independently. As an example, zone 685 could be a supply zone, zone 683 could be a transfer zone, and zone 681 could be a return zone. Within each zone may be sub-zones which allow driving multiple carts within each zone. In alternate embodiments, more or less zones or sub-zones may be provided in any of a number of combinations. Cart 700 is supported by the fields produced by winding sets 727, 729 and is positionable in a levitated and non-contact manner by biasing the fields between winding sets 727 and 729. FIG. 13C shows one possible winding combination that could be driven by the system shown in FIG. 13D and employed to levitate cart 700 (as for example as discussed further below with reference to FIG. 14A, or through multiple axis active levitation). One dimensional winding sets are provided in winding zones 732A-C and 730A-C and 734A-C and 742A-B and 740A-B. Two dimensional winding sets are provided in winding zones 736A-E and 738A-C. In alternate embodiments, any suitable combination of winding sets could be provided or a full 2-D array or otherwise could be provided. Cart 700 has platens 720 and 710 which may be used in combination with arrays 738B for platen 720 and arrays 736B,C and D for platen 710.

By moving platen 710 in direction 704 (see FIG. 13A) and holding platen 720 stationary, a wafer may be radially moved through slot 718A. By simultaneously moving 710 and 720 in direction 705 (see FIG. 13B), a wafer may be picked or placed. By coordinating winding commutation and winding switching between zones, cart 700 may selectively be moved vertically and/or laterally through the different winding and drive zones. Chamber 716 may be provided as a barrier between winding sets 727, 729 and cart 700. In alternate embodiments, no barrier need exist, such as in the event that winding sets 727, 729 are inside the enclosure 716 where there is for example a clean air or nitrogen environment. In alternate embodiments, more or less platens or windings may be provided. Arrays of sensors 746, 747, 748 may be provided for sensing the presence of the magnets in the platens or the platens or the cart(s) for determining proper commutation and location and for fine position determination of the platens and the cart or for determining positions, such as the gap between platens and windings. A cart identification tag, as noted before, may be provided with a reader provided at appropriate stations to determine cart id by station.

Figure 14A:
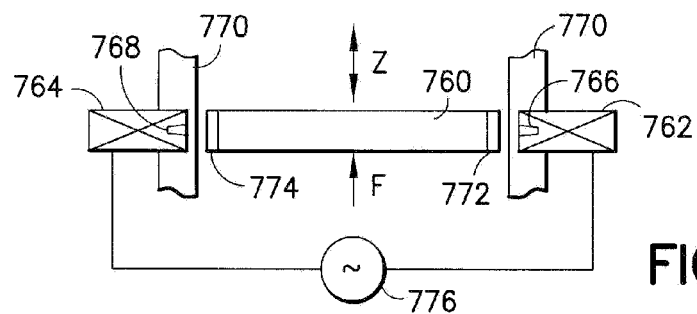
FIG. 14A is an end view of another embodiment of a cart used with the apparatus in FIG. 2.
Figure 14B:
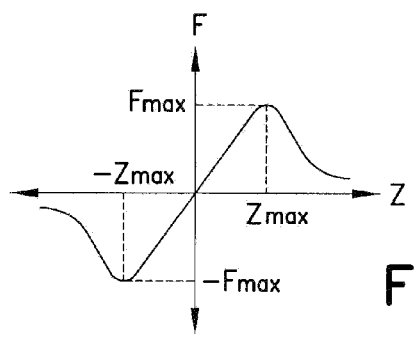
FIG. 14B is a graph illustrating the relationship between axial deflection Z and a restoring force F of the drive system.

Referring now to FIG. 14A there is shown an end view of another exemplary cart 760, in accordance with yet another embodiment, supported by the fields produced by single axis linear motor winding sets 762, 764. Exemplary cart 760 is positionable in a non-contact manner by biasing 776 the fields between winding sets 762 and 764. Position sensing 766, 768 is provided, in a close loop fashion with biasing 776, to levitate cart 760. Levitation may be accomplished in this simple manner as the cart is passively stabilized in the Z direction as shown in FIG. 14B. Cart 760 has magnetic platens 772 and 774 on its sides which may have magnets or be made from magnetic or conductive materials which interface with winding sets 762, 764. In alternate embodiments, more or less platens could be provided, driving arms for example. Chamber 770 (similar to any representative portion of the chambers 18, 602-624 of the apparatus, see FIGS. 2-3, and 7-7A) may be made from a nonmagnetic material, for example non-magnetic stainless steel and provide a barrier between the motor windings and their respective platens as described before. In alternate embodiments, more or less linear drives or carts may be provided. For example, a single drive motor may be provided having additional drive zones where platens would interface with the same drive motor but be independently driveable by the different zones. As a further example, additional carts could be driven by different drive systems in the floor, the walls above in line with or below slot openings or in the covers of the chamber.

In FIG. 14B the relationship between the restoring force F and the axial deflection Z from the desired position of cart 760 is graphically illustrated. In the respective positive or negative axial direction (z direction) the restoring force first increases in magnitude to a value FMAX or –FMAX respectively up to a maximal deflection ZMAX or –ZMAX respectively, but decreases again however when this deflection is exceeded. Therefore, if a force is applied to cart 760 (such as cart weight or external forces, such as from other winding sets that drive the same or other platens or otherwise) that exceeds FMAX, then the cart escapes from the windings 762, 764. Otherwise, cart 760 will stay within the fields as long as they are applied. This principle, described in US patent references (which are hereby incorporated by reference in their entirety) U.S. Pat. Nos. 6,485,531, 6,559,567, 6,386,505, 6,351,048, 6,355,998 for a rotary devices is applied in the drive system 701, of the apparatus described herein, in a linear fashion to levitate exemplary cart 760. In alternate embodiments, other drive systems or levitation systems may be used.

Referring again to FIG. 13D, there is shown a diagram of an exemplary winding drive system 790 suitable for use with cart/platen drive system 701 in FIG. 13A. Winding drive system 790 has windings 792, multiplexer 793 and amplifier modules 794. Windings 792 may have windings and/or sensors such as hall sensors, positions sensors, inductive sensors, carrier identification sensors, status and fault detection logic and circuitry or otherwise. Amplifier modules 794 may have single or multiple phase amplifiers, position and/or presence sensor inputs or outputs, CPUs and/or memory, identification reader inputs or outputs, status and fault detection logic and circuitry or otherwise. Amplifier modules 794 may connect directly to windings 792 or through multiplexer unit 793. When using multiplexer unit 793, amplifiers A1-Am may be selectively connected to any of windings W1-Wn. A CPU coordinates this selective connection and monitors the status of the devices. In this manner, the CPU may selectively take amplifier modules or windings off line for service without shutting down the tool.

Figure 22:
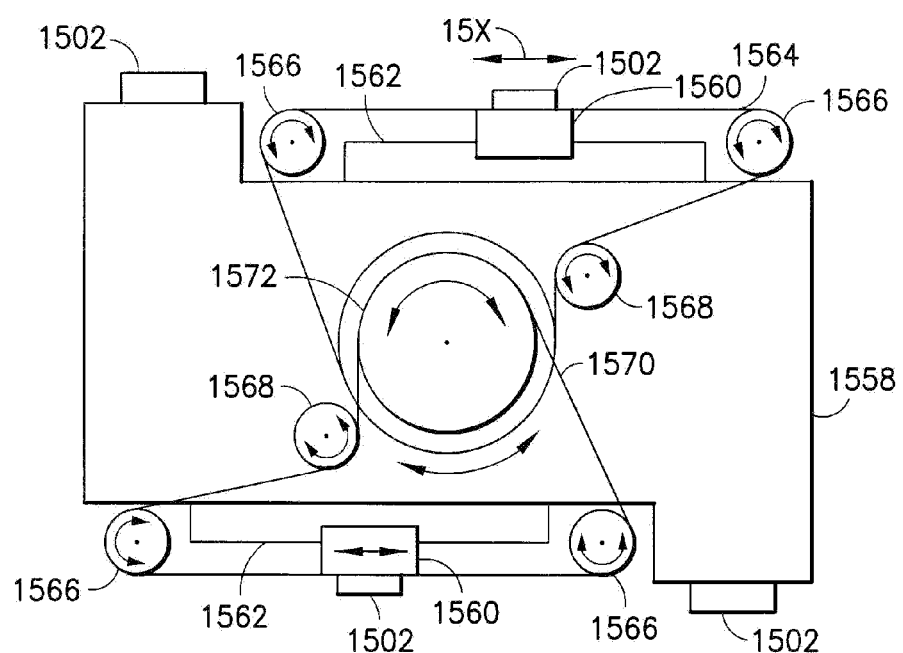
FIGS. 22-23 respectively are a schematic top plan view and schematic elevation view of yet another embodiment of the transport cart for the apparatus.
Figure 23A:
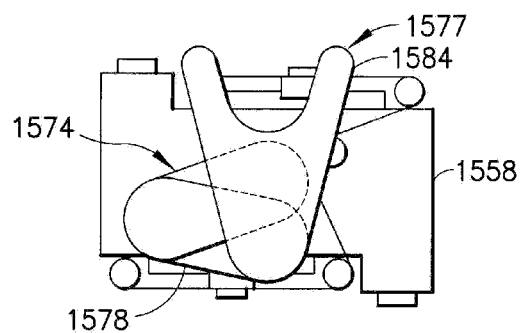
FIGS. 23A-23B respectively are other top plan views of the transport cart in FIG. 22 with a transfer arm of the cart in two different positions.
Figure 23B:
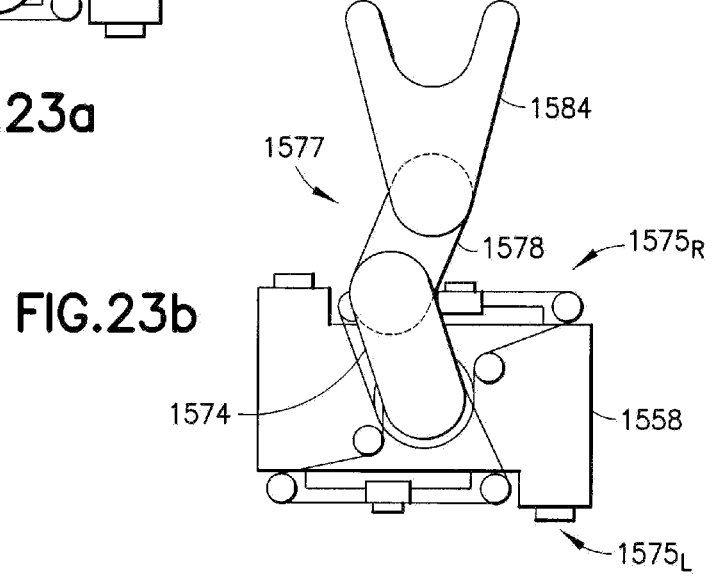
Figure 23:
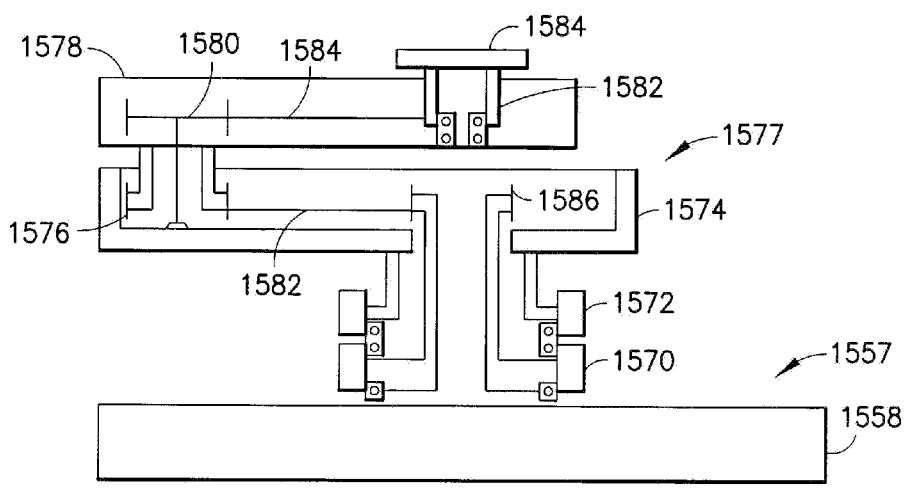

As noted before, the transport apparatus or carts suitable for use in the transport chambers 18, 602-624 (see for example FIGS. 2-3, and 7-7A) may comprise carts with or without a transfer arm for transferring semiconductor workpieces between the cart and a desired location in the apparatus. FIGS. 12 and 13A respectively show, as described before, two exemplary embodiments of transport carts 229, 700 with transfer arms for handling semiconductor workpieces in the apparatus. Referring now ahead to FIGS. 22 and 23, there is shown another embodiment of a transport cart mechanism 1557 suitable for use in the chambers of apparatus 10. Cart 1557 may include base section or base plate 1558 and transfer arm 1577 mounted to the base plate. As shown in FIG. 22, the cart mechanism base plate 1558 with two coupled magnet arrays 1502 on opposite sides of the plate, but not limited to opposite corners of the plate. On the opposing corners of the robot base plate 1558, two addition magnet arrays 1502 are coupled to linear bearing carriages 1560 and are made to slide on linear bearing rails 1562. These linear bearing rails 1562 are coupled to the base plate 1558. A drive belt 1564 or other means of converting linear motion to rotary motion is attached to the linear bearing carriage 1560. In the case shown, the drive belt 1564 is wrapped around an idler pulley 1566 and then a pulley tensioner 1568 and attached to a drive pulley 1570. The linear motion applied to the bearing carriage 1560 through the magnet array 1502, will result in rotary motion of the driven pulley 1572. In the case of a two degree of freedom application, a redundant version of the mechanism described is applied to the opposite side of the robot cart mechanism and a duplicate circuit is attached to drive pulley 1572. This combination yields a concentric pulley assembly. The relative motion between the fixed magnet array 1502 and the combined magnet array 1502 and linear bearing carriage 1560 provides a means of driving the transfer arm linkage. In the case of linear transport of the robot carriage, the linear bearing/magnet array 1560/1502 and the coupled magnet array/cart base plate 1502/1558 are driven as a fixed set and no rotation of the driven pulleys 1570 & 1572 is seen. The drive mechanism of base plate 1558 may be used for operating other suitable transfer arm linkages, some examples are shown in FIGS. 24-24C, 25-25C). The transfer arm 1577 in the embodiment shown in FIG. 23, has a general single SCARA arm configuration. Drive pulley 1572 is coupled to the lower link arm 1574 and drive pulley 1570 is tied to forearm drive pulley 1586. The rotation motion of the forearm pulley 1586 is coupled to the forearm 1578 through the drive belt 1582 and the elbow pulley 1576. The wrist/end effector 1584 is driven by the resulting relative rotation motion of the forearm 1578 with respect to the wrist elbow pulley 1580 as it is grounded to the lower link arm 1574. Typically, this motion is achieved by the pulley ratio at each joint with respect to the input drive ratio of pulleys 1572 and 1570. Referring also to FIGS. 23A-23B, the transfer arm linkage 1577 is shown respectively in retracted and extended positions. The movement between retracted and extended positions is achieved (in a manner as described above) by moving the movable magnet arrays 1502 as desired relative to the base plate. The movement of the arm linkage may be performed with the cart stationary or moving relative to the transport chamber. FIGS. 23A-23B show the transfer arm 1577 positioned so that when extended the arm 1577 extends to the lateral side 1576R (i.e. the side of the cart facing a chamber wall) of the cart. This is similar to the extension/retraction movement of the transfer mechanism 724A,B of cart 700 in FIG. 13A. As can be realized, the transfer arm 1577 on cart 1557 may be rotated as a unit (using movable magnet arrays 1502) about axis of rotation S (see FIG. 22) to any desired orientation relative to the cart base plate. For example, if rotated about 180° from the orientation shown in FIGS. 23A-23B, the transfer arm 1577 may be extended to the opposite side 1575L from that shown in FIG. 23B. Further, the transfer arm may be rotated about 90° so that the arm extension is along the linear direction of the chamber (indicated by arrow 15X in FIG. 22). Any number of arm linkages may be employed with such a cart. Other examples of suitable arm linkages that may be used with the cart are described in U.S. Pat. Nos. 5,180,276; 5,647,724; 5,765,983; and 6,485,250 all incorporated by reference herein in their entirety.

Figure 24:
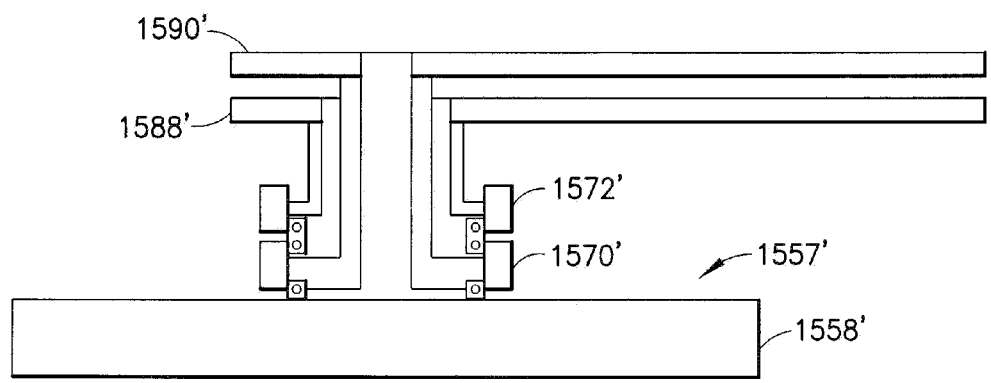
FIG. 24 is a schematic elevation view of another embodiment of the transport cart.
Figure 24A:
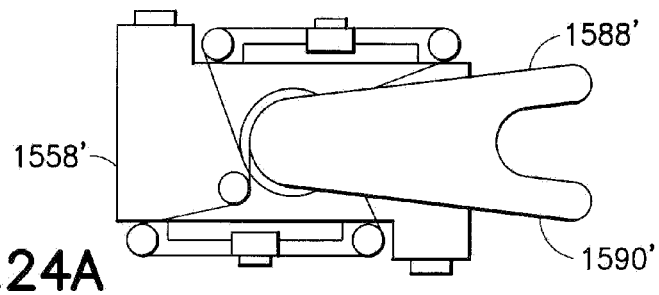
FIGS. 24A-24C respectively are plan views of the transport cart in FIG. 24 with the transport arm linkage of the cart in three different positions.
Figure 24B:
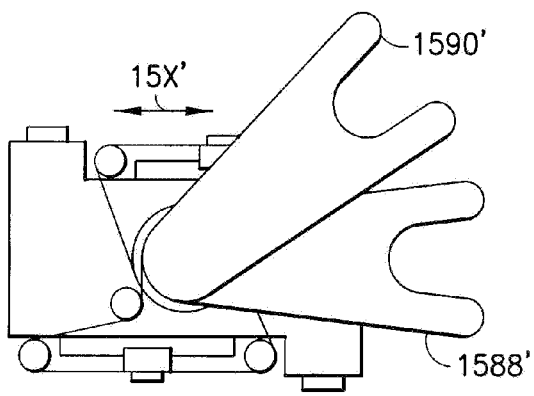
Figure 24C:
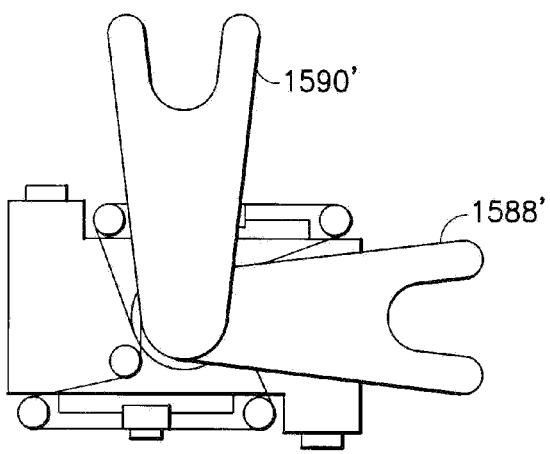

FIG. 24 is an elevation view of another embodiment of the cart mechanism 1557' with dual rotary end effectors mounted to the cart base plate 1558'. Cart 1557' is otherwise similar to cart 1557 described before and shown in FIGS. 22-23. Similar features are similarly numbered. FIGS. 24A-24C show the use of both linear transport and couple relative motion of the bearing carriage array as the cart is moving. As described before with reference to FIG. 22, the rotation of pulleys 1570' and 1572' results from the bearing carriage and magnet array moving with respect to the fixed magnet arrays which are coupled to the cart's base plate. In the combined case, the robot cart transport is moving along the linear chamber, in the direction indicated by arrows 15X', and the bearing carriage and magnet array move with respect to the grounded arrays. This motion enables the end effector(s) 1588' and 1590' to rotate thereby causing the robot end effector to extend substantially perpendicular to the linear direction of the cart similar to FIGS. 23A-23B, described before. FIGS. 24A-24C show the end effectors 1588' and 1590' extended to one side for example purposes. As can be realized however, the end effectors 1588', 1590' may be extended to any side of the base plate. Further, the end effectors 1588', 1590' may be extended to any side of the base plate. Further, the end effectors 1588', 1590' may be extended to a position where the end effector is oriented at an angle more or less than about 90° as shown in FIGS. 24A-24C.

Figure 25:
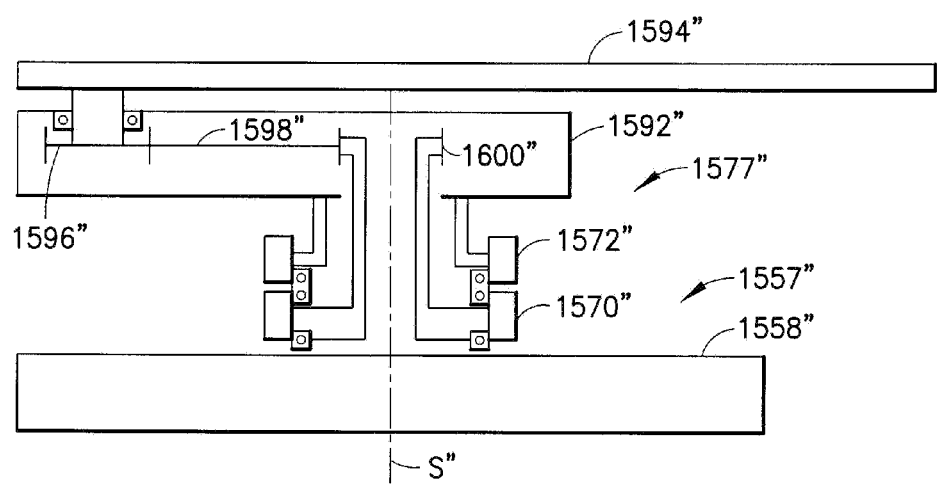
FIG. 25 is a schematic elevation view of still another embodiment of the transport cart.
Figure 25A:
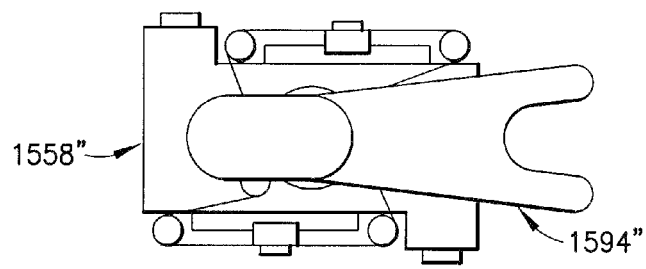
FIGS. 25A-25C respectively are plan views of the transport cart in FIG. 25 with the transport arm linkage of the cart in three different positions.
Figure 25B:
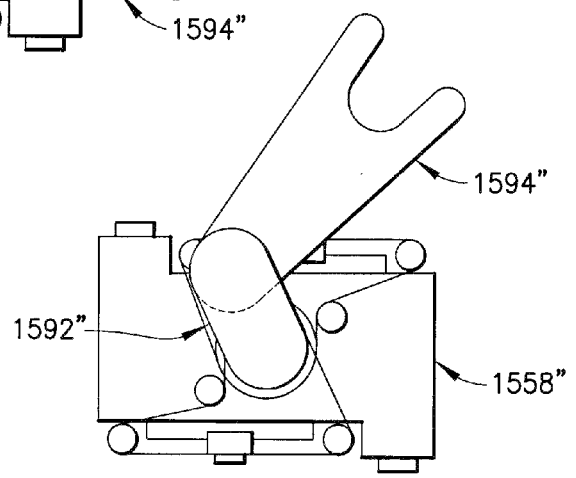
Figure 25C:
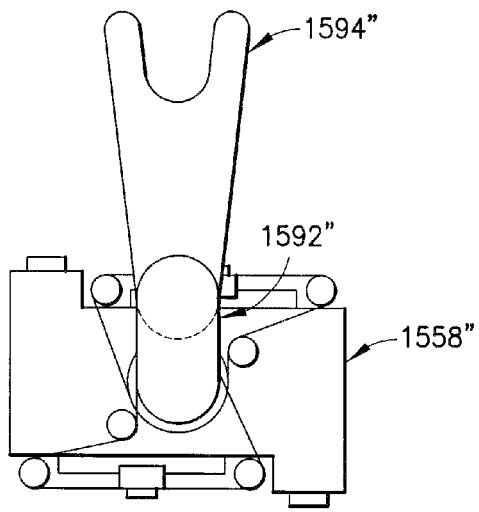

FIG. 25 is a schematic elevation view of still another embodiment of the cart 1557", having and arm linkage similar to that shown in FIG. 23. In this case, the drive pulley 1572" is attached to the lower link arm 1592". The driver pulley 1570" is coupled to the end effector driver pulley 1600" and coupled to the elbow pulley 1596" through a drive belt 1598". The elbow drive pulley is attached to the robot end effector 1594" and provides a means of transmitting the rotation of driver pulley 1570" to the driven end effector 1594". FIGS. 25A-25C show the cart with the arm linkage in three different positions. FIGS. 25A-25C show the end effector 1594" extended to one side of the base plate 1558" of the cart for example purposes only. Similar to the transfer arms shown in FIGS. 22-23 and 24, the transfer arm 1577" may be rotated about axis S" so that the end effector may be extended/retracted in any direction relative to the base plate 1558" of the cart 1557". With reference now also to FIGS. 2-7A, a significant advantage of using carts (such as carts 22, 122A, 406, 229, 700, 1557, 1557', 1557" shown in FIGS. 12, 13A, 22, 23, 24, and 25) with articulate transfer arms is that for a given reach of the transfer arm, the transfer chamber may be provided with the minimum width. The multi-axis articulation of the transfer arms on the different cart embodiments, allows substantially independent placement of the cart relative to the path of the articulating arm, which in turn allows the width of the transfer chamber 18 to be reduced to a minimum. Similarly, the width of slot valves and passages connecting storage processing modules to the transfer chamber may be reduced to minimum size.

Figure 15:
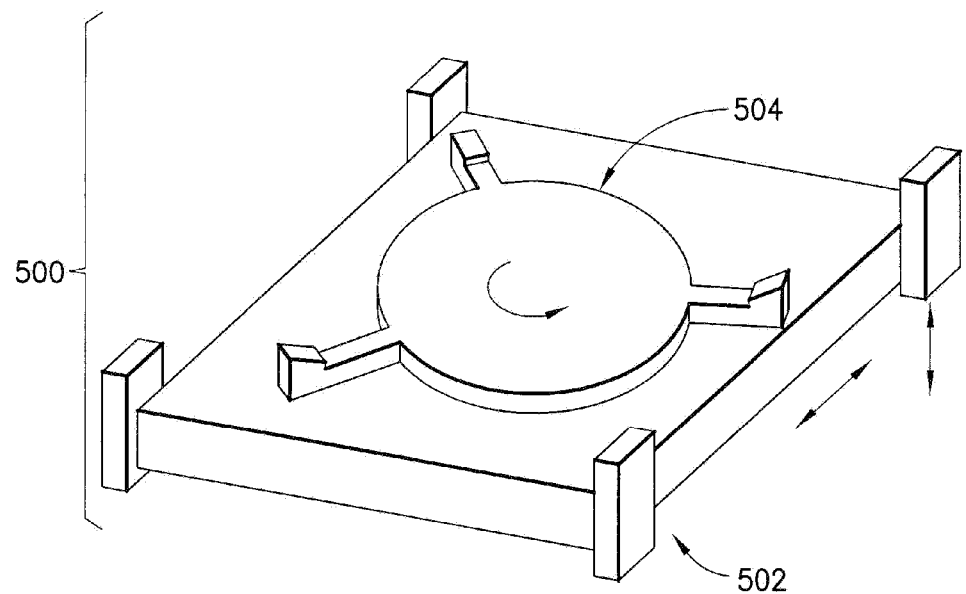
FIGS. 15-16 are respectively a schematic perspective view and an exploded elevation view of semiconductor workpiece transport cart of the apparatus in accordance with another embodiment.

Referring now to FIG. 15, an exemplary wafer aligner 500 for use with apparatus 10 is shown. The wafer aligner carrier 500 may generally include two parts, wafer chuck 504 and the wafer transport carrier 502. The aligner provides wafer alignment and movement within the linear Cartesian transport tool. The aligner is made to interface with the transport cart(s) in the apparatus (such as for example carts 22, 122A, 406, 700, 1557) or in some cases may be included in the robot cart of the linear process tool architecture.

Figure 16:
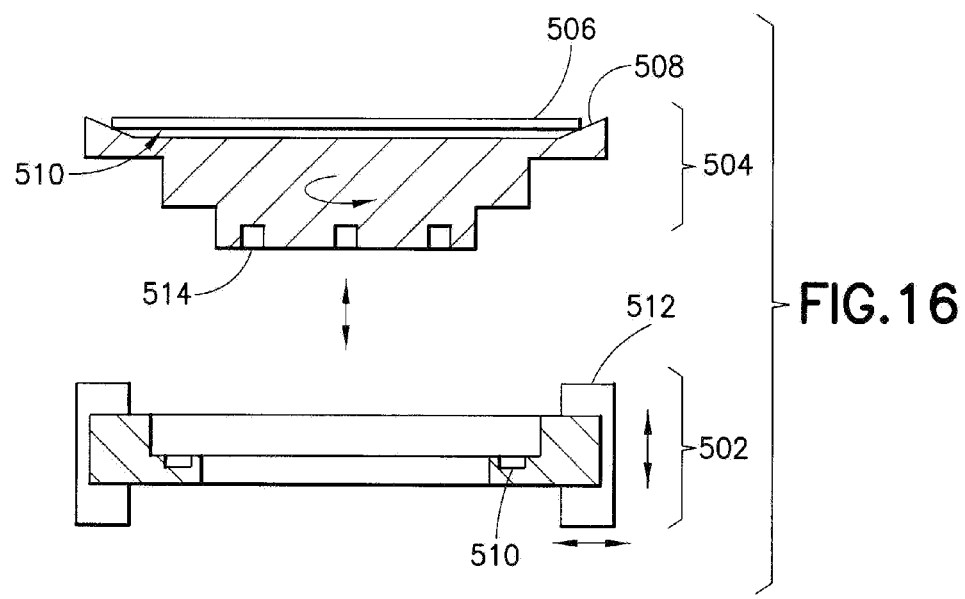

Referring also to FIG. 16, the wafer chuck 504 is shown to be able to separate from the wafer transport carrier 502. Friction pads may couple the two devices during transport throughout the linear Cartesian apparatus. When disassembled, the wafer chuck 504 is free to rotate with respect to the wafer transport carrier 502. The wafer chuck 504 provides a means of passive wafer edge support by using angle ramped wafer edge pads 508 with respect to the substrate (wafer) 506. An additional feature as part of the wafer chuck 504 is the relief beneath the wafer 506 for the ability of the robot arm cart to remove and place the wafer onto the wafer carrier 500. This is identified as wafer removal clearance zone 510.

This method of wafer rotation with respect to the linear transport cart can be applied directly to the robot's end effector. This method is shown in FIG. 17. The robot arm cart 534 is configured so that the wafer chuck 504 is removable from the robot's end effector 536. In this case, the chuck is free to be rotated to correct for any slight wafer notch orientation requirements based on drop off point changes found in the process modules or load locks.

Figure 18:
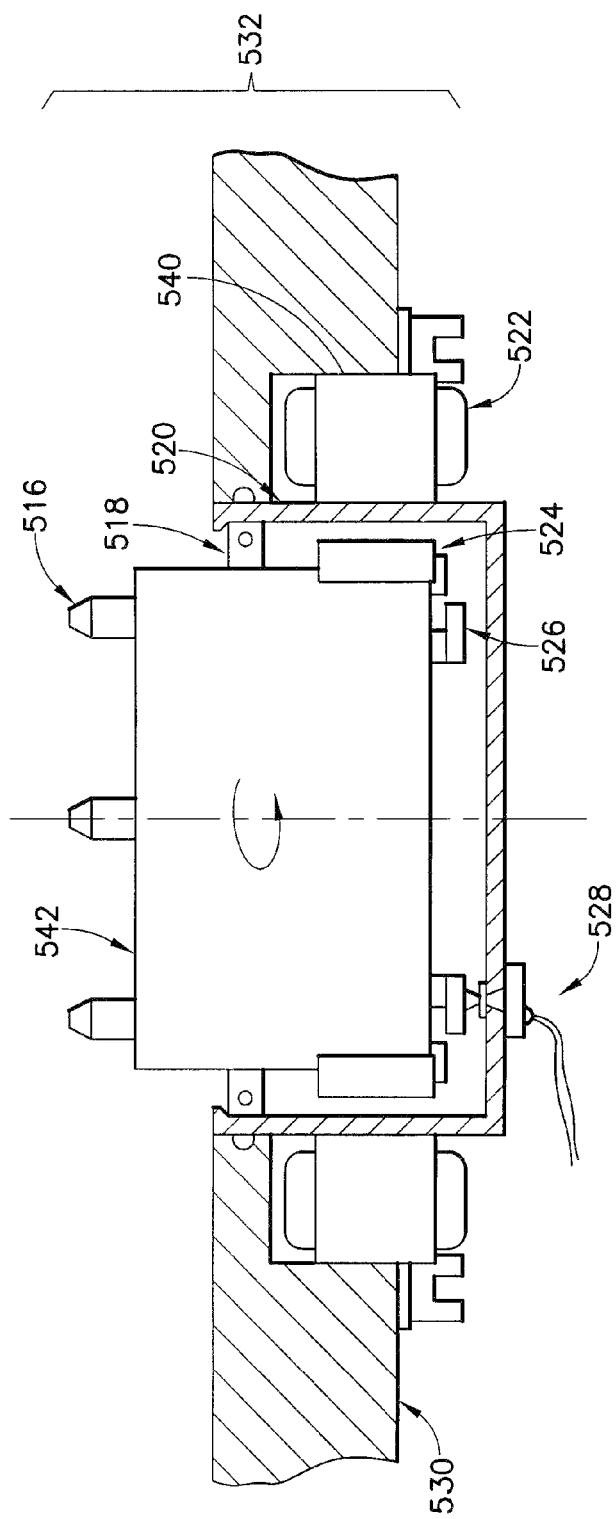
FIG. 18 is a cross-section of a portion of the transport apparatus in FIG. 2 and a workpiece chuck rotation device of the apparatus.

Referring also to FIG. 18, the wafer chuck rotation device 532 is shown. At multiple points within the linear transport tool, these rotational wells can be deployed. This device is based on motor isolation techniques found in U.S. Pat. No. 5,720,590 which is hereby incorporated by reference in its entirety. In alternate embodiments, a conventional motor and seal combination may be used. A stationary motor 522 is mounted to the linear transport chamber's base 530. A vacuum isolation barrier 520 is placed between the motor armature 540 and the magnet array 524. The magnet array is mounted directly to the rotation shaft 542. This allows for direct drive coupling into the vacuum system. A possible support bearing 518 may be required but ideally, magnetic suspension is used. An optical encoder disc 526 is attached to the rotation shaft 542 with the read head 528 placed in a location to provide position feedback to the controller for the rotation shaft's 542 angle. The aligner chuck 504 is lowered onto the friction pads or kinematics pin(s) 516. These pads/pins provide a means of wafer chuck 504 rotation once the wafer chuck 504 is disconnected from the wafer carrier 502 or the robot's end effector 536. This same means of providing rotation can be applied to control the rotational position of a robotic arm link 538 applied as part of the robot arm carrier shown in FIG. 17.

Figure 19:
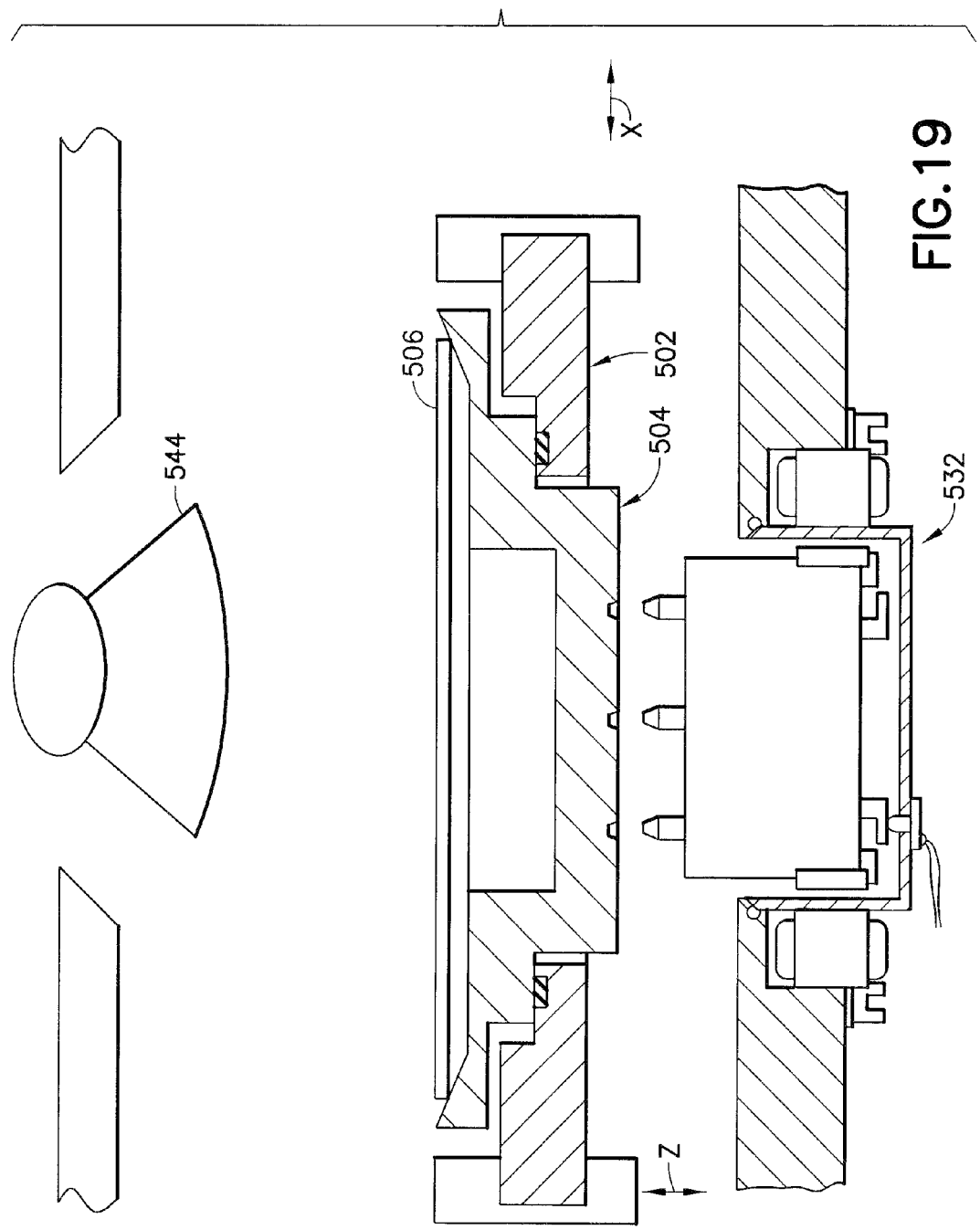
FIGS. 19-20 respectively are elevation views of the workpiece chuck rotation device and a transport cart of the apparatus with the transport cart in different positions.
Figure 20:
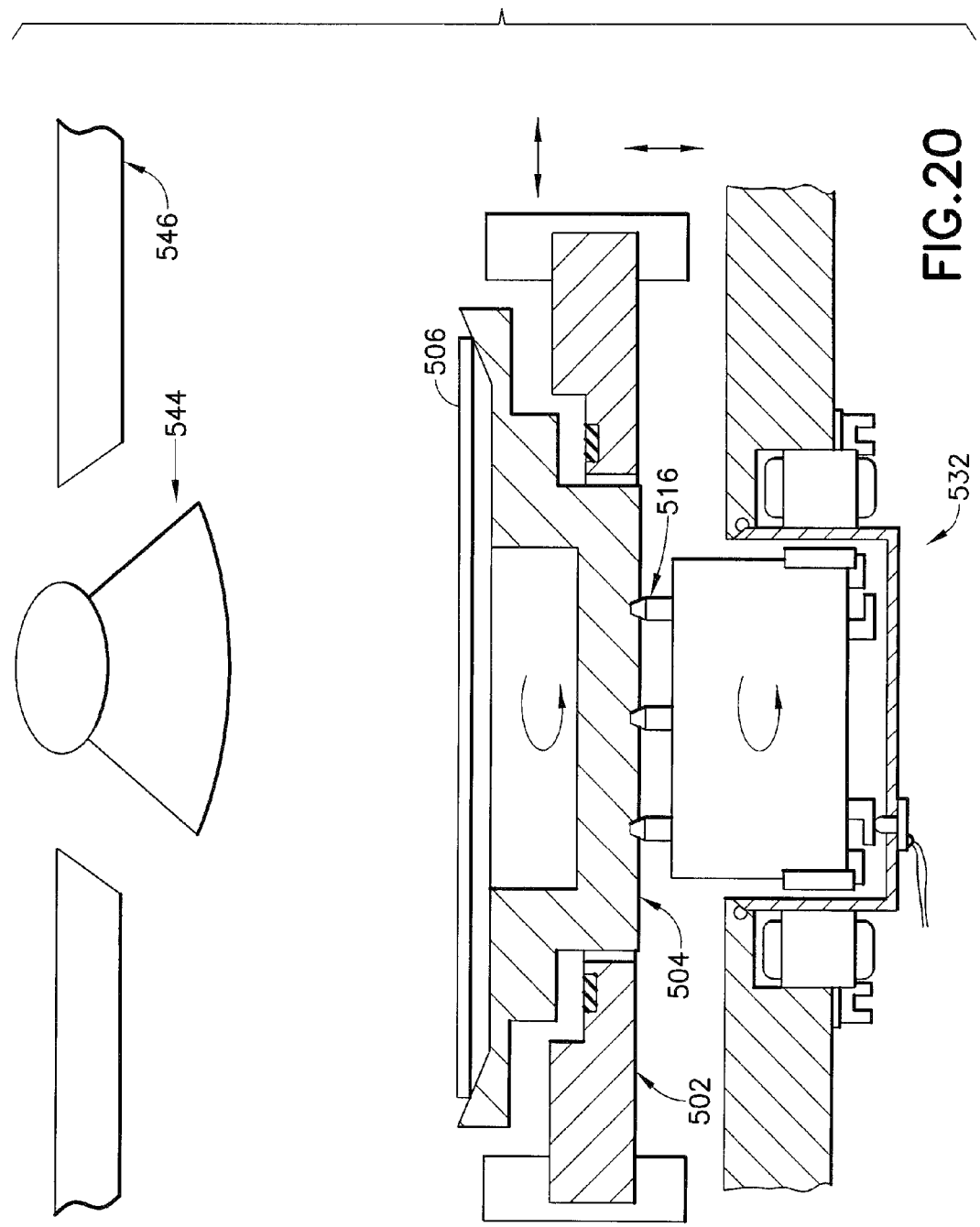
Figure 21:
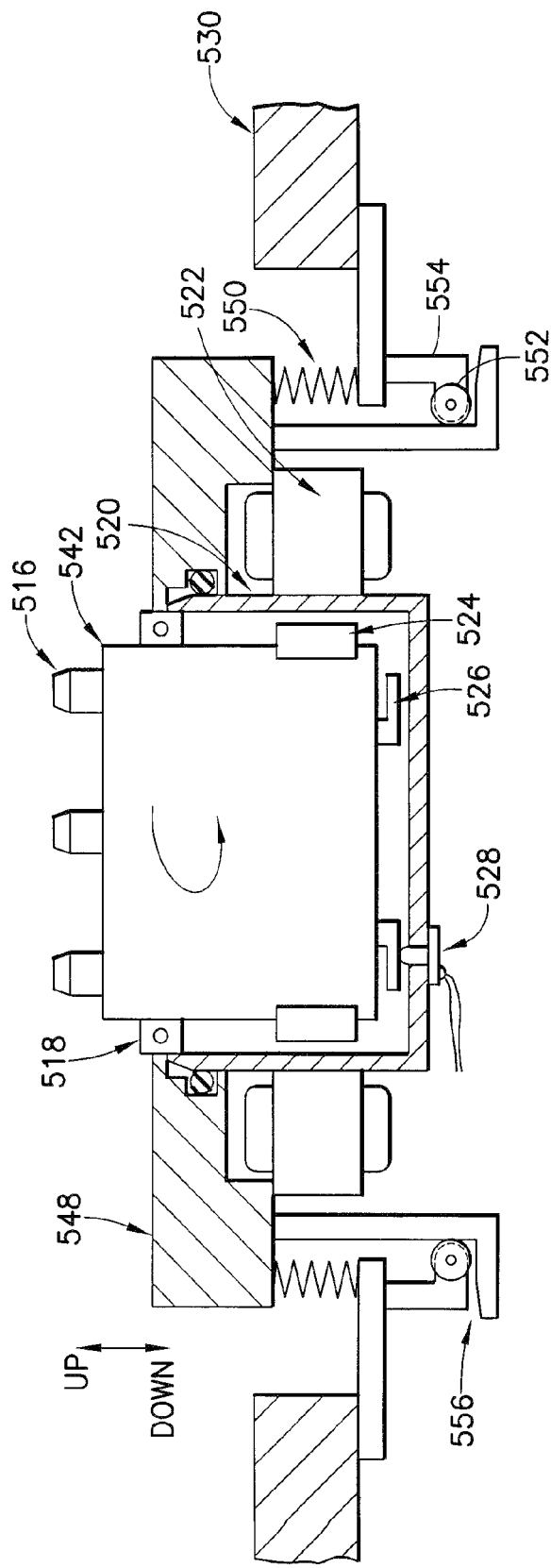
FIG. 21 is another schematic elevation of the chuck rotation device in accordance with yet another embodiment.

Referring also to FIG. 19, the wafer transport carrier 500 consisting of the wafer chuck 504 and the wafer transport carrier is moved to a position above the wafer chuck rotation device 532. In FIG. 20, the wafer transport carrier is lowered such that the wafer chuck 504 is lifted off on the transport carrier 502. A camera 544 located in the transport's chamber lid 546 is able to look at the image of the wafer and identify the wafer's x-y position and the location angle of the wafer's notch. The wafer carrier can then be moved to provide x-y location change of the wafer chuck 504 with respect to the wafer transport carrier 502 and rotation can be provided to correct for notch alignment. Another option for the wafer chuck rotational drive when used as a method of robot arm carrier device is to allow rotational engagement while extending the robot link arm and requiring vertical axis of motion to allow for the substrate or wafer to be lowered/raised from the process module or load lock. A method of this approach is schematically shown in FIG. 21. A stationary motor 522 is mounted to a guided plate 548. The guided plate is attached to the linear transport chamber's base 530 via a metal bellows 550 or other linear isolation seal (lip seal, o-ring, etc.). A vacuum isolation barrier 520 is placed between the motor armature 540 and the magnet array 524. The magnet array is mounted directly to the rotation shaft 542. This allows for direct drive coupling into the vacuum system. A possible support bearing 518 may be required but ideally, magnetic suspension is used. An optical encoder disc 526 is attached to the rotation shaft 542 with the read head 528 placed in a location to provide position feedback to the controller for the rotation shaft's 542 angle. An additional guide roller 552 and the supporting structure 554 with end of travel stop 556 allow the rotation drive to be held positioned as required to engage the wafer chuck or robot arm rather than using the linear wafer transport carrier 500 as the actuation device. In the case where the transport chamber is pressurized resulting in a state where the robot drive is positioned up, the force of the bellows will act as a spring and allows the rotational device to be engaged with various linear robot arm cart vertical elevations (such as during a pick or place) but over a practical limited vertical travel range. Once the device is engaged the friction pads or kinematics pin(s) 516. These pads/pins provide a means of wafer chuck 504 rotation once the wafer chuck 504 is disconnected from the wafer carrier 502 or the robot's end effector 536 as shown in FIG. 20. This same means of providing rotation can be applied to control the rotational position of a robotic arm link 538 applied as part of the robot arm carrier shown in FIG. 17.

Systems, such as those shown in FIGS. 2-7, may be controlled by configurable and scaleable software stored in controller C. Referring now also to FIG. 26, there is shown manufacturing execution ("MES") system software that may be provided in the controller C communicably connected to the processing system. The MES system 2000 comprises software modules 2002-2016 or options that enhance the capabilities of the MES. The modules include a material control system ("MCS") 2002, a real time dispatcher ("RTD") 2004, a workflow or activity manager ("AM") 2006, an engineering data manager ("EDA") 2008 and a computer maintenance management system ("CMMS") 2010. The MES 2002 allows manufacturers to configure their factory resources and process plans, track inventory and orders, collect and analyze production data, monitor equipment, dispatch work orders to manufacturing operators, and trace consumption of components into finished products. The MCS software module 2002 allows the manufacturer to efficiently schedule individual carts (for example, carts 22, 122A, 406, 228, 700, 1557 in FIGS. 2-3, 7-7A, 12, 13A and 22) to arrive at the processing tools to maximize overall system efficiency. The MCS schedules when an individual cart will arrive at, and depart from, a specified processing tool (for example, process 18A, 18B in FIG. 7, and modules 602-626 in FIG. 7A). The MCS manages any queuing and routing requirements at each processing tool and optimizes the system yield while minimizing the cart transport cycle time. The RTD 2004 allows manufacturers to make cart routing decisions, in real time, based on feed back from the health of the processing tools. Additionally, cart routing decisions may be made by the MES operator. The MES operator may change the priority in which specific products need to be manufactured. The AM 2006 allows manufacturers to monitor the progress of any given cart containing one or more substrates though the entire manufacturing process. If a processing tool generates an error, the AM 2006 determines the best remaining route for the all the substrates being processed at the processing tool. The EDA 2008 allows manufactures to analyze the manufacturing data and execute statistical process control algorithms on that data in an effort to improve the efficiency of the processing tool. The CMMS 2010 system allows the manufacturer to predict when maintenance is required on an individual processing tool. Variances in the process of the processing tool is monitored and compared against known process results and changes to the process or scheduled repairs to the processing tool is predicted.

Figure 27:
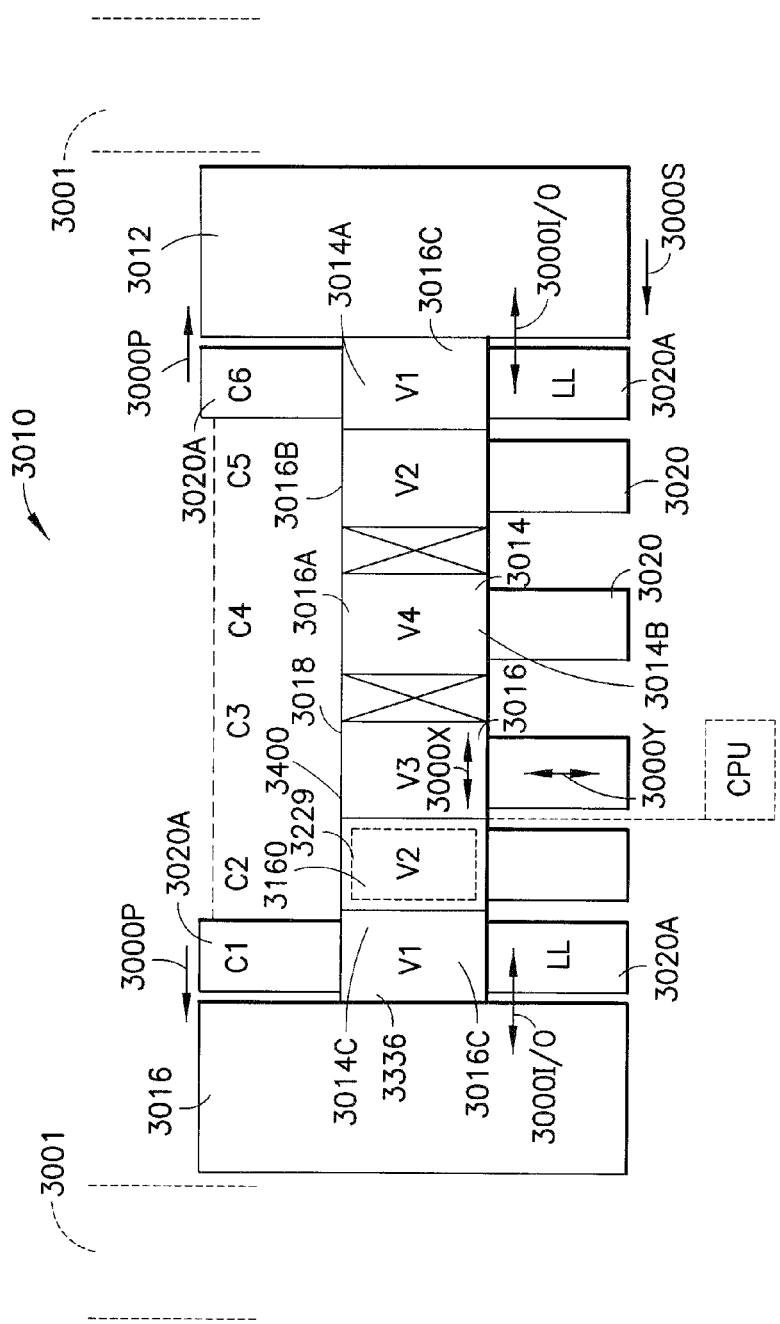
FIG. 27 is a schematic plan view of a substrate processing system in accordance with yet another exemplary embodiment of the invention.

Referring now to FIG. 27, there is shown a substrate processing system 3010 in accordance with yet another exemplary embodiment of the invention. The system 3010 in FIG. 27 is generally similar to processing systems and tools 10, 10', 18, 18A, 18B, 601 described before and shown in the drawings, except as otherwise noted below. Similar features are similarly numbered. System 3010 generally includes substrate processing tool 3014 and in this embodiment tool interfaces 3012 and 3016. As in the previous exemplary embodiments, tool 3018 has a controlled atmosphere and is isolated from the outside atmosphere. The tool interfaces 3012, 3016 generally provide an interface between the tool 3014 and other cooperative systems in the fab. For example, tool interface 3012 may be an EFEM suitably configured for interaction with a fab mass substrate transport system 3001, such as automated guided vehicles, or other desired automated material handling system. The EFEM 3012 may be able to allow or provide for loading and offloading of substrates between the mass transport system 3001 and EFEM, and hold unprocessed substrates for entry (in the direction indicated by arrow 3000S) into the processing tool 3018. The EFEM 3012 may also be capable of receiving from the processing tool 3018 (in the direction indicated by arrow 3000P), processed substrates for return transfer to the fab transport system 3001. As noted before, in this embodiment system 3010 has another tool interface 3016, such as an environmental second end module (ESEM), at the opposite end of the tool 3018 from EFEM 3012. ESEM 3016, in this embodiment, is substantially similar to EFEM 3012, capable for example of receiving processed substrates from the tool 3018 (in the direction indicated by arrow 3000P in FIG. 27) and able to facilitate subsequent transfer of the substrates to an adjoining portion of fab transport system 3001. If desired, ESEM 3016 may also be used to feed unprocessed substrates to tool 3018. In alternate embodiments, the processing system may have a tool interface at but one of the tool ends. In that case, unprocessed substrates would be input, and processed substrates would be output, throughout the one end of the process tool where the tool interface is located. In other alternate embodiments, the tool may interface or be otherwise connected directly to another tool or to a transport chamber having a controlled atmosphere (such as in a manner similar to that shown in FIG. 7A for transport chambers 602-626). Still referring to FIG. 27, tool 3018 generally comprises a substrate transport chamber 3014 and process modules 3020, 3020A. As noted before, chamber 3014 may have a controlled atmosphere such as a vacuum or inert gas and may be isolated from the outside atmosphere. Transport chamber 3014 may have different sections 3014A, 3014B, 3014C, capable of being isolated from each other such that each section may be capable of holding a different controlled atmosphere (e.g. vacuum, near high vacuum, high vacuum). As seen in FIG. 27, the transport chamber 3014 has a generally linear shape. The process modules 3020, 3020A are mounted in this embodiment to the lateral sides of the transport chamber 3014. The process modules 3020, 3020A may be similar or different from each other. For example, the processing tool 3018 may have one or more load lock chamber modules 3020A (in the embodiment shown in FIG. 27 there are four load lock chamber modules 3020A, two of which communicate with each tool interface 3012, 3016) as desired to allow transfer of substrates into and out of the tool (in the direction indicated by arrows 3000 I/O) without affecting the controlled atmosphere in the tool. The other process modules may be configured to perform desired processing on substrates in the tool, such as dielectric or metal deposition, etching, ion implantation, rapid thermal processing, chemical or mechanical polishing, metrology and others. The process modules, are connected to the sides of the transport chamber 3018 to form a seal with the chamber and maintain the controlled atmosphere in the chamber. The process modules 3020 may be arranged in any desired order along the chamber 3014, such as for example to provide a desired serial processing sequence when substrates progress through the tool in direction 3000S. As will be described further below, tool 3018 does not limit the process sequence, to which substrates are subjected, to merely the serial order of the process modules arrangement on the tool, but rather allows selectability of the process steps. In alternate embodiments, the process modules of the tool 3018 may each provide substantially the same process. As seen in FIG. 27, the tool 3018 has at least one transport vehicle or cart 3229 located in chamber 3014, and capable of holding one or more substrates thereon. The cart 3229 is capable of linear traverse inside the chamber 3014 (in the direction indicated by arrow 3000X). The cart 3229, as will be described below, may also have a suitable operable substrate transfer device 3160 for transferring substrates between the cart, inside the transport chamber 3014, and the process modules 3020, 3020A (in the direction indicated by arrow 3000Y in FIG. 27). The cart 3229 in this embodiment is passive, without motors or powered systems. The transport chamber 3014 includes a drive system 3400 that interfaces with the cart to move the cart within the chamber (direction 3000X) and effect operation of the cart substrate transfer device 3160 to transfer substrates (indicated by direction 3000Y). The transport chamber 3014 may also include a position feed back system 3336 for identifying the position of the cart 3229 and substrate. The drive system 3400 and position feed back system 3336 are operated by the CPU to move the cart and transfer substrates in order to select any desired process sequence for the substrates processed by the tool. As seen in FIG. 27 the transport chamber 3014 is formed by modules 3016, 3016A, 3016B, 3016C that are abutted to each other. As will be described below, each module 3016, 3016A, 3016B, 3016C is a self contained unit with integral drive system and, position feed back system portion to allow each module to operate as an individual transport chamber, and to allow integration of any desired number of modules to form the transport chamber 304 of desired length.

The transport chamber modules 3016, 3016A, 3016B, 3016C forming the transport chamber 3014 are generally similar to each other. The transport chamber modules 3016, 3016A, 3016B, 3016C may have different lengths, and different numbers of connections for connection of any desired number of process chamber modules to each transport chamber module. Though in the embodiment shown in FIG. 27, each transport chamber module is capable of having a process chamber module 3020, 3020A connected to each side of the transport chamber module, in alternate embodiments transport chamber modules may be configured to interface with multiple process chamber modules similar to modules 3020. The transport chamber modules 3016, 3016A, 3016B, 3016C are interchangeable so that the chamber modules may be joined together in any desired sequence to form the transport chamber.

Figure 28:
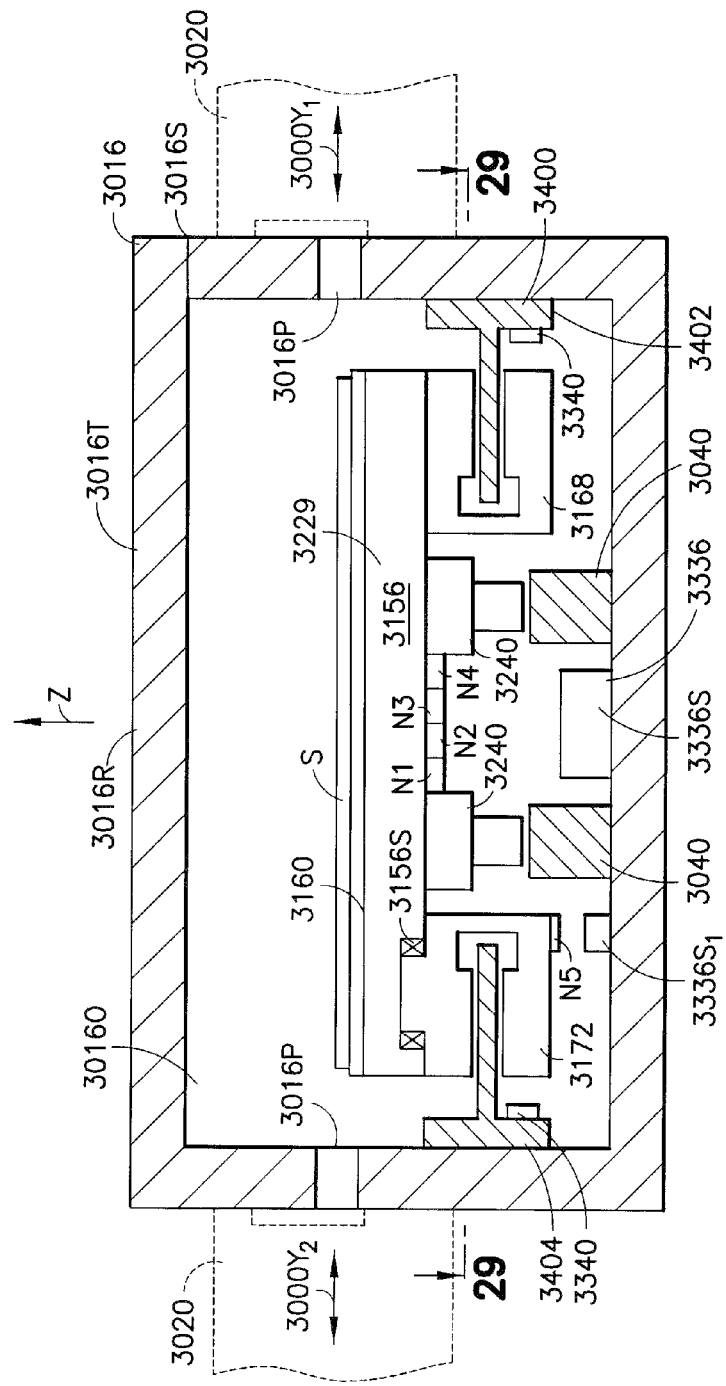
FIG. 28 is a cross-sectional elevation view of a representative module of a transport chamber of the system in FIG. 27.
Figure 29:
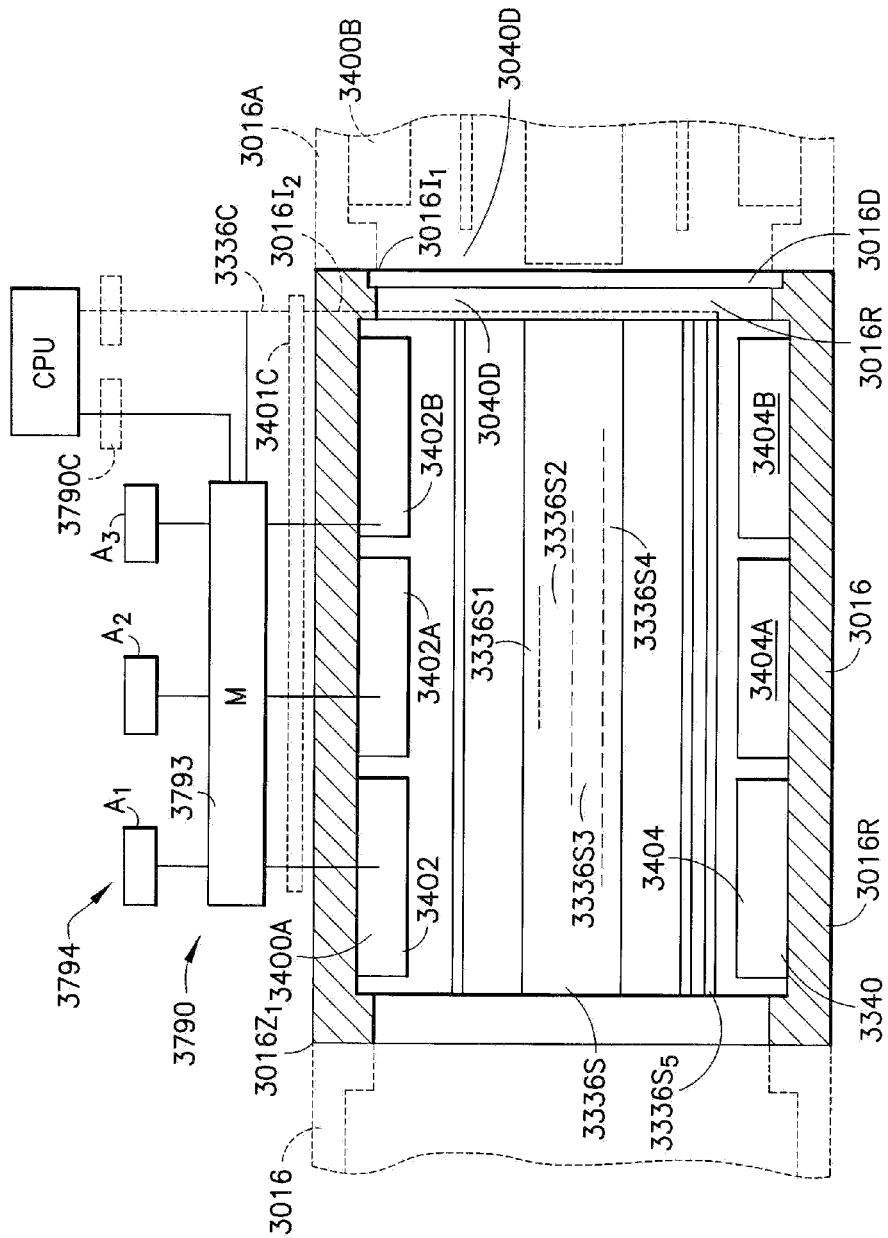
FIG. 29 is a cross-sectional view of the chamber module taken along line 29-29 in FIG. 28.

FIGS. 28 and 29 are cross sectional views of an exemplary transport chamber module 3016 (FIG. 29 further shows portions in phantom of adjacent transport chamber modules 3016, 3016A when abutted/mated to the chamber module 3016). As noted before, the transport chamber modules 3016, 3016A, 3016B, 3016C are substantially similar. Chamber module 3016 has a frame 3016F, which may be of any suitable shape and made of any suitable material. The frame 3016F may have removable panels or sections, such as for example removable top panel 3016T. The removable panel 3016T is mounted to the rest of the module frame 3016F to allow removal from the module when the module is connected to other modules forming the chamber. This allows access to components/cart inside the module without removal of the entire module from the chamber. Access panel 3016T may be sufficiently large to allow insertion/removal of the cart 3229 through the resultant opening 3016O in the chamber module frame. A seal 3016S is provided at the interface of the panel 3016T and frame to prevent compromise of the controlled atmosphere in the transport chamber 3014. As seen in FIG. 28, the frame has ports 3016P formed therein for communication with the process chamber modules 3020. As may be realized, the ports 3016P are sized and shaped to allow the substrate transfer device 33060 with the substrate S thereon to pass through the port into the process module. The ports 3016P may be closable by suitable valves or doors that may be integrated into the transport chamber module frame 3016F, or may be mounted on the process module. As seen in FIG. 29, the frame 3016F has suitable interface features 30161 at the opposite longitudinal ends for sealably mating the module 3016 to adjoining modules 3016A, 3016. The interfaces 30161 may be of any suitable type. By way of example, the interfaces 30161 may have suitable seating features complementing mating facets of the adjoining module interface to allow proper abutment of the adjoining modules. Fasteners, such as mechanical fasteners, or other suitable clamping or retention features may be included to capture the modules to each other. The interfaces $3016I_1$, $3016I_2$ may include polarization facets to establish a desired orientation of the chamber modules 3016, 3016A when being joined (and preventing abutment and connection therebetween when the module is not in the desired orientation) the interface features $3016I_1$, $3016I_2$ are common to each module allowing the modules to be interchangeable as noted before. The frame 3016F, in this embodiment defines a chamber space sufficient for cart 3229. Minimum clearances may be provided around the cart to allow free movement of the cart through the module. The end openings 3016R in the module frame are sized to allow the cart 3229 (holding a desired number of substrates S) to pass through the opening, and traverse between modules 3016, 3016A. The end openings 3016R may be closed by doors 3016D. The doors 3016D may be integral with the module frame, or may be installed as an additional modular portion between chamber modules when the chamber modules are joined together.

As seen in FIGS. 27-28, the module has support or guide rails 3040 for cooperating with slides 3240 on the cart, movably support the cart 3229 in the chamber. In this embodiment, the rails 3040 are located on the bottom of the module (under the cart), though in alternate embodiments the rails may be attached to any desired portion of the chamber module frame. In this embodiment, two rails 3040 are shown, but more or fewer rails may be used. The rails 3040 are shown as extending continuously through the module. The rails 3040 terminate at a distance 3040D from the interfacing face of the module 3016 sized so that, when the cart passes between modules 3016, 3016A, the slides 3240 on the cart may traverse the distance 3040D (in each module) and commence riding on the rail of the adjacent module 3016, 3016A without disturbance to the stable attitude of the cart. Conversely, as may be realized, the slides 3240 of the cart 3229 are sized to continue to provide stable support to the cart when the cart passes between modules 3016, 3016A and the slides 3240 traverse from the rails 3040 in one module 3016, 3016A to the adjoining rail segments in the adjoining module.

Still referring to FIGS. 27-28, the module 3016 has an integral portion of the cart drive system 3400. In this embodiment, the system is a linear electrical motor, though in alternate embodiments any suitable type of electric or mechanical drive system may be used such as a cable drive. In the embodiment shown in FIGS. 28-29, the drive system is a coreless linear drive system, such as coreless linear motors available from Tecnotion or Anorad. In FIG. 29, the drive system portion integral to the transport chamber module 3016 is shown as having three sets of windings 3402, 3402A, 3402B, 3404, 3404A, 3404B on each side of the module. As seen in FIG. 28 each set of windings 3402, 3404 cooperates with a corresponding platen 3168, 3172 on the cart 3229. The windings 3402, 3404 may be of any desired length, including commercially available standard lengths. In alternate embodiments, any desired number of windings may be used to drive the cart platens on each side of the chamber. As seen in FIG. 28, the coreless motor windings 3402, 3404 project into the chamber to interface with the platen 3168, 3172 of the cart. In alternate embodiments, the linear motor may be an iron core linear motor similar to the motor 400 described before and shown in FIGS. 11A-11B. In that case, the motor windings may be isolated from the chamber by interior frame portions similar to portions 414 in FIGS. 11A-11B. The windings 340L, 340SA, 3402B, and 3404, 3404A, 3404B on each side of the module are arranged respectively along a single axis, thereby providing one drive axis on each side. In alternate embodiments, windings may be positioned to provide multiple drive axes on each side. In other embodiments, for example as in the case where iron core linear motor windings are used, the windings may be arranged to provide drive axes in both X and Z directions (i.e. both linear along the chamber, as well as vertical drive axes, for shunting the cart between longitudinal drive axes, similar to the winding arrangement described before and shown in FIGS. 13B-13C). Windings 3402-3402B, and 3404-3404B, along each drive axis, are also sized and positioned relative to the module interface $3016I_1$, $3016I_2$, to maintain, in cooperation with the next most proximate windings 3400B in the abutting module 3016, a continuous propulsive force on the platens traversing the interface region of the abutting modules, enabling the cart to traverse from one module 3016, 3016A to the other. A control system 3790, controlled by the CPU is provided to control operation of the windings. Though in FIG. 29, only one set of drive axis windings 3402-3402B of the module 3016, is shown as being connected to the control 3790, both sets of windings are controlled in a similar manner. The winding control system 3790 is generally similar to winding control system 790, described before and shown in FIG. 13D. The winding control or drive system 3790, may generally have a multiplexer 3793 and amplifier modules 3794. The amplifier modules 3794 may be connected via multiplexer 3793 to drive windings 3402, 3402A, 3402B along each drive axis in the desired sequence for moving the cart platens. The sequencing and connection of the amplifiers to the windings is controlled by the CPU. The CPU may communicate with the position feed back system 3336 of the module, as will be described further below, to determine the amplifier connection and drive sequence of the windings. The winding control system 3790 may be a discrete system dedicated to the module 3016. For example, the control system 3790 may be carried, mounted or otherwise incorporated with the module 3016 (the control system 3790 need not be positioned on the module frame, and may be enclosed in a separate housing (not shown) if desired). The control system 3790 may communicate with the windings 3402, 3402A, 3402B through suitable communication lines penetrating through the chamber when using suitable feed through. In FIG. 29, dedicated communication lines are shown individually passing through the charger walls, for example purposes, and the communication lines may be consolidated to allow a minimum number of feed through penetrations in the chamber walls. The control system 3790 may include a suitable coupling 3790C, allowing the control system 3790 to be connected to the CPU upon assembly of the tool. As seen in FIG. 29, the module 3016 may have another wiring 3401C (for example mounted or situated on a side of the module) for coupling the communication lines of the windings to the control system 3790. Coupling 3401C may also allow the windings to be connected to a central winding control system of the process tool in a case where a dedicated module winding control system is not desired.

Figure 30:
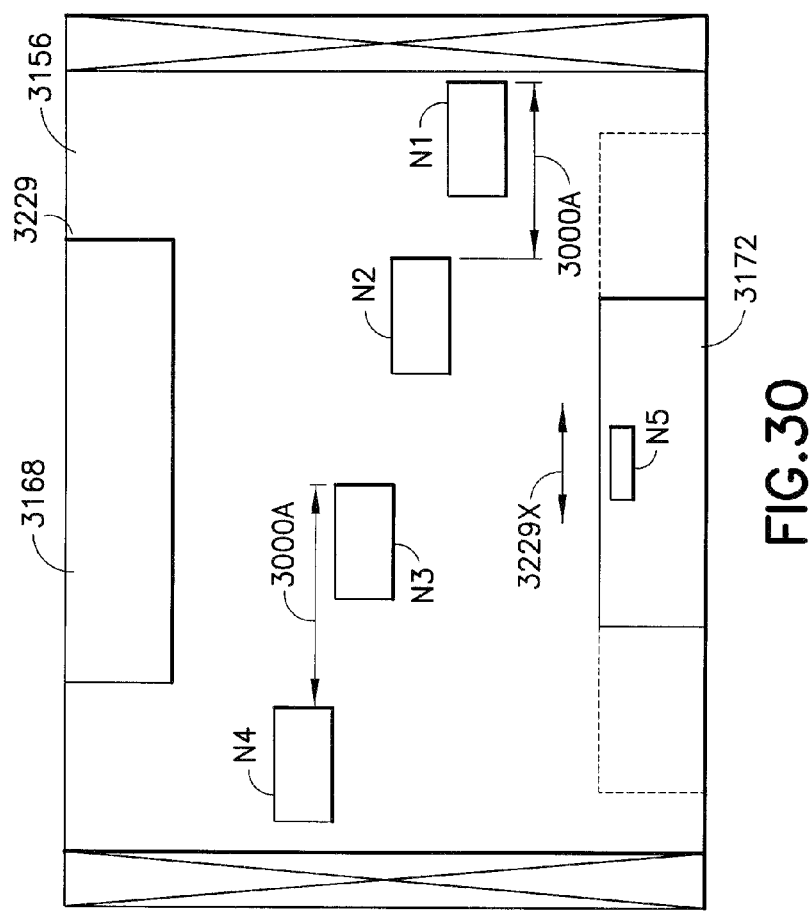
FIG. 30 is a bottom view of a substrate transport of the system in FIG. 27.

Referring now to FIG. 30, here is shown a bottom view of the cart 3229. The cart may have any suitable configuration. In this embodiment, the cart is substantially similar to cart 229 described before and shown in FIG. 12-12B. As noted before cart 3229 has two platens 3168, 3172. Platens 3168, 3172 have permanent magnets or magnetic material, and are configured for operation with the coreless linear windings 3402, 3404 as shown in FIG. 28. Platen 3168 in this embodiment is fixedly mounted to the cart frame 3156. Platen 3172 is movably secured, such as by keyed slides 3156S, to the frame 3156 of the cart. Platen 372 is thus capable of limited movement relative to the cart frame 3156 (in the direction indicated by arrow 3229X shown in FIG. 30). Fore and aft stops limit the motion of platen 3172 relative to the frame. Similar to platen 172 of cart 229, described before, the additional mobility of the platen 317L relative to cart 3229, provide the cart with a further degree of freedom that is converted to operate the substrate transfer device 3160 in order to extend and retract. Substrate transfer device 3160 is substantially similar to the telescoping sections 158, 160 of cart 229 (see FIGS. 12A, 12B). Hence, transfer device 3160 may include any suitable number of telescoping sections, terminating with an end effector, similar to end effector 158 described before. The transfer device 160 may be connected by a suitable transmission system, similar to the system of cart 229, to the movable platen 3172 to convert the relative movement of the platen to movement of the transfer device 3160 (and hence movement of the substrate in the direction indicated by arrows $3000Y_1$, $3000Y_2$ in FIG. 28) (Z axis) may be generated by deenergizing/energizing the windings 3402, 3404 and raising/lowering the cart to pick/place the substrate S. In alternate embodiments, the substrate transfer device of the cart may be of any suitable type such as for example a scara type arm, having one or more articulated sections. Further independent degrees of freedom, for independent motion of various transfer device sections may be provided by adding additional platens to the cart that are mounted to be independently movable relative to the cart similar to platen 3172. In alternate embodiments, the cart may be similar to cart 1558, described before and illustrated in FIGS. 22-23, or may be similar to carts 1558' and 1558" shown respectively in FIGS. 24, 24A-24C and FIGS. 25, 25A-25C.

Referring now again to FIGS. 28-29, as noted before, the transport module chamber 3016 also has an integral position feed back system 3336 for determining and controlling the position of the platens/cart in the module. In the embodiment shown in FIGS. 28-29, position feed back system 3336S may be capable of fine precision determination, such as having a positioning resolution and accurately in the range of about 1-5 µm. The module 3016 may have another position feed back system 3340 capable of gross or rough position determination, such as having a positioning resolution and accuracy of about 10-20 µm. The fine position determination system 3336 may be a linear electric encoder system. Suitable linear encoder systems are available from Netzer Precision Motion Sensors, Ltd., or from Farrand Corp. In alternate embodiments, the module may have any other suitable type of position determination system capable of fine precision determination, such as electro-optical encoders, or magneto-restrictive type Hau effect sensing system. In this embodiment, the fine positioning system 3336 may include a linear scale 3336S. The linear scale 3336S is mounted to the bottom surface of the module frame 3016F to interact with passive sensor registration features N1-N4 (see FIG. 30) on the cart 3229. In alternate embodiments, the scale may be positioned on any other portion of the module placing the scale in a suitable position for sensing the registration features on the cart. The scale 3336S, which is illustrated schematically in FIGS. 28-29 is an electrically active element, excited from a suitable AC source (not shown) via suitable communication line 3336C. For example, the scale may include one or more printed circuit strips on which periodic pattern field transmitter is printed. In this embodiment, the scale 3336S may also include a receiver capable of sensing changes in the fields of the transmitter as the registration features on the cart 3229 move along the scale. In this embodiment, the scale may extend continuously between the module interfaces $3016I_1$, $3016I_2$ at the opposite ends of the chamber module. In alternate embodiments, the scale may extend only partially in the module, in the areas of the module where fine position determination is desired. In this embodiment, the scale 3336S may include multiple sensing tracks 3336S1-3336S5, each being capable of sensing the position of a corresponding sensor registration features N1-N5 on the cart 3229. As seen in FIG. 30, cart 3229 may have multiple sensor registration features N1-N5. As noted before, the sensor registration features N1-N5 in this embodiment are passive (i.e. not powered) and may include magnets or magnetic material. In the embodiment shown in FIG. 30, the cart 3229 may have five sensor registration features N1-N5 to enable positioning of the cart 3229 as well as the movable platen. Two of the features, such as N4, N3 on the right and N1, N2 on the left, may be used for registration and positioning respectively of the right and left sides of the cart. Feature N5 in this embodiment is used for registration of the movable platen position. As seen in FIGS. 28 and 30, the registration features N1-N4, which in this case are positioned on the bottom of the cart in sufficient proximity to interact with the rails 3336S1-3336S4, are offset laterally to substantially align with the corresponding sensing track 3336S1-3336S4 of scale 3336S (see also FIG. 29). Also, the registration features N3-N4, and N1-N2, used respectively for position determination of the right and left sides of the cart 3229, are offset at a longitudinal pitch 3000A sufficient for continuous position determination of the cart when the cart traverses between modules 3016, 3016A. For example, during passage from one module to the next, the offset 3000A allows the rear most registration features N2, N4 to maintain interaction with the corresponding tracks 3336S2, 3336S4 of the module the cart is leaving until after the lead most registration features N1, N3 have commenced interaction (i.e. position determination has commenced) with the corresponding sensing tracks (similar to tracks 3336S1, 3336S3) of the module the chart is entering. Hence, positioning of the cart 3229 is continuously established throughout the cart traverse motion within chamber 3014 (see FIG. 27). Registration feature N5 on platen 3172, allows, in cooperation with track 3336S5, for position determination of the platen 3172 in a manner similar to that described above. A comparison o the position signals registered for features N1-N4 and N5 (performed for example by the CPU) allows for determination of the relative position of the movable platen 3172. The relative position information may then be used for controlling activation of the substrate transfer device 3160 of the cart. In alternate embodiment, the cart may have any other suitable arrangement of registration features, and may have more or fewer registration features, such as one registration feature for position determination of each side of the cart. In alternate embodiments, position determination may be achieved by a combination of rough position determination, using cross positioning system 3340, and fine position determination with precision positioning system 3336. For example, gross positioning system 3340 (which may be any suitable position determination system such as Hall effects type position sensing system or an electro-optic encoder system, and may be less expensive to install throughout the module chamber) may be used during general traverse motion of the cart 3229 through the chamber module 3016, and also for positioning when the cart moves from one module to another. The precision positioning system 3336 may then be used in a more limited fashion, such as in cases where greater position determination accuracy is desired. For example, it is desired to precisely determine the position of the cart 3229, as well as platen 3172, when transferring substrates to the process modules 3020, 3020A. Accordingly, in the case installation of the active scale 3336S may be sized to generally coincide with the region where ports 3016P (see FIG. 27), communicating with the process modules 3020, are located. Also, a single registration feature per side, and another registration feature for the movable platen 3172 may be sufficient for fine position determination of the cart 3229, and of the platen 3172 to enable accurate movement of the substrate transfer device 3160. As may be realized from FIG. 29, signals from the gross and fine position determination systems 3340, 3386 are communicated via suitable lines 3336C, or via wireless means, for processing by the CPU, which in turn uses the position information for controlling the windings through windings control system 3790 (see FIG. 29). Though communication lines 3336C have one or more couplings (similar to coupling 3790C) for coupling to an off module CPU, the positioning systems 3340, 3336 of the module are also capable of communicating directly with processors of the dedicated winding control system, so that the chamber module 3016, may autonomously, relative to the overall tool control architecture, control operation of the windings to effect desired movement of the cart 32229 and transfer device thereon.

As may be realized, each transport chamber module 3016, 3016A includes systems as described above, enabling the module to form a complete transport chamber for a processing tool. For example, the tool 3018 may be configured to have a transport chamber 3014 of but one module, selected form the different but interchangeable module 3016, 3016A, 3016B, 3016C, in a configuration similar to tool 18 shown in FIG. 5. As shown in FIG. 27, the modules 3016, 3016A, 3016B, 3016C may otherwise be joined, in any selected order, by abutting the common interfaces of the modules to form a transport chamber 3014, and tool 3018 of desired configuration. The autonomous overability of each module 3016, 3016A, 3016B, 3016C allows assembly of the tool to be effected as easily as completion of the mechanical connection at the module interfaces.

Figure 31:
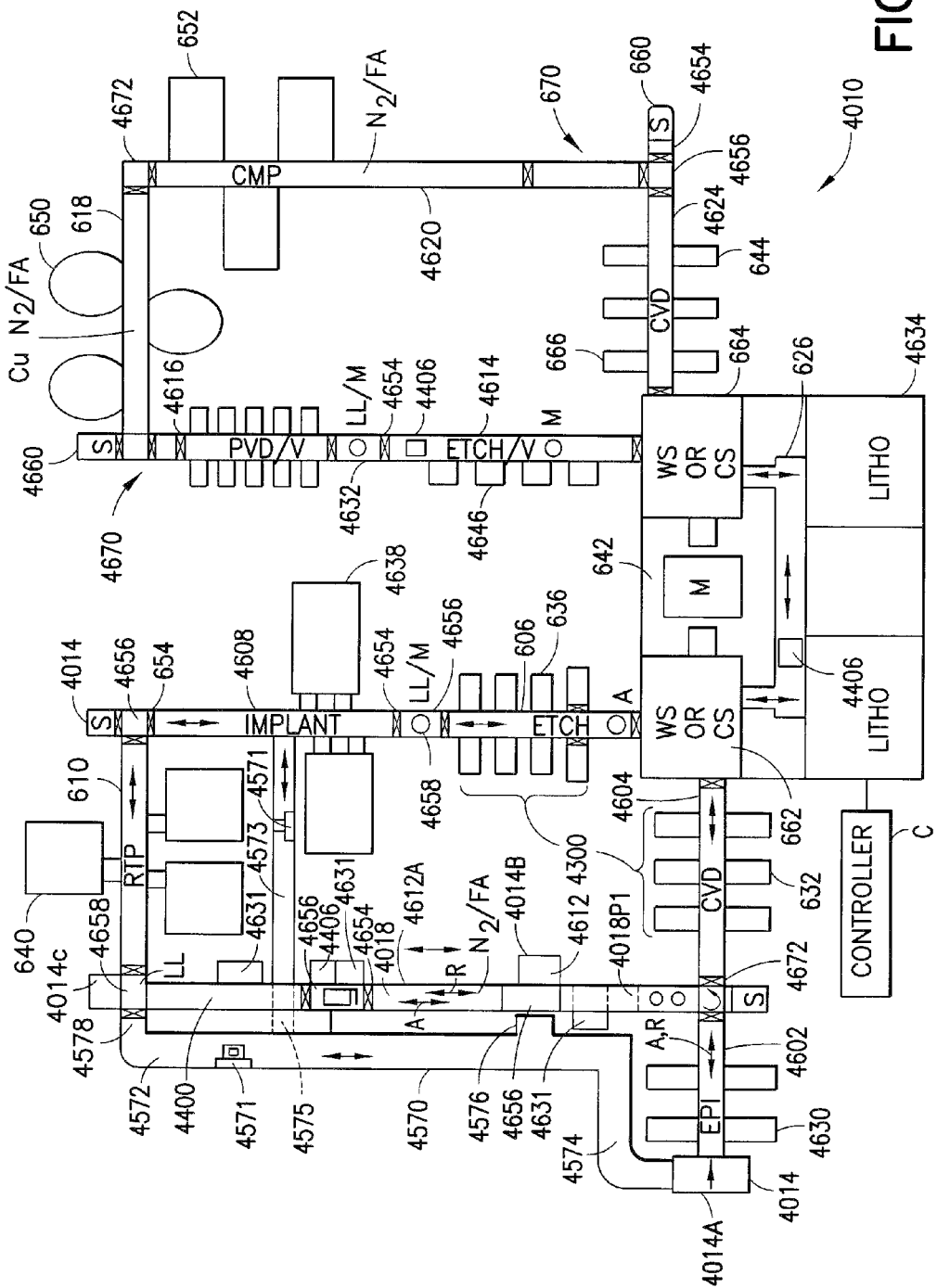
FIG. 31 is another schematic plan view of a processing apparatus in accordance with another exemplary embodiment.

Referring now to FIG. 31, there is shown a schematic plan view of a substrate processing apparatus 4010 in accordance with another exemplary embodiment. Processing apparatus 4010 illustrated in FIG. 31, is generally similarly to processing apparatus 10, 10, 601 and 3010, described previously and shown in FIGS. 2-7A, 27 except as otherwise noted. Similar features are similarly numbered. As may be realized, and similarly to the other exemplary embodiments illustrated in the Figures, the arrangement of the apparatus 4010 in the embodiment shown in FIG. 31 is merely exemplary, and in alternate embodiments, the processing apparatus may have any other desired shape/configuration. Similar to the processing apparatus in the exemplary embodiments described before, apparatus 4010 generally has an interface section 4014, transport chamber section 4018 and processing/substrate holding section 4300. The interface section 4014 may have module(s) or section(s) 4014A, similar for example to EFEM modules 14 (see for example FIGS. 2-3). The interface section 4014 may communicate with the other sections of the apparatus (such as the transport chamber section) and allowing the apparatus 4014 to interface with substrate peripheral systems, such as FAB AMHS or, manual interface, for loading/unloading substrate(s) from the apparatus. The number and locations of the interface section module(s) 4014A, in the exemplary embodiment shown in FIG. 31, is representative, and in alternate embodiments there may be more or fewer interface modules located in any desired positions of the apparatus. The transport chamber section generally includes a transport chamber 4018. Transport chamber 4018 may be generally similarly to transport chambers 18, 18A, 18B and transport chamber 3014 described before and shown in FIGS. 2-7A and 27. The processing/substrate holding section may generally have one or more substrate processing/holding modules, as will be described further below, communicably connected to the transport chamber 4018 of the apparatus to allow substrate transfer direction there between. In the exemplary embodiment, the transport chamber 4018 may have a selectably variable length and shape. The transport chamber 4018 in the exemplary embodiment show in FIG. 31, may be modularly formed from transport chamber modules, similar for example to transport chamber modules 18P1-18P4 (see FIG. 7), that may be serially connected linearly or in a two dimensional or three dimensional array, (as will be described further below) to form the transport chamber. As shown in FIG. 31, in the exemplary embodiment, the transport chamber 4018 may be extended and arranged to run through a FAB, similar for example to the FAB facility layout 601 of the exemplary embodiments shown in FIG. 7A. As noted before, the transport chamber 4018 (as well as the overall apparatus) arrangement is merely exemplary and in alternate embodiments the transport chamber may have any other desired arrangement. In alternate embodiments, the transport chamber may for example be arranged in accordance with inter bay and intra bay organization scheme (in which processes may be organized according to process "bays"; the associated transport chamber section, similar to chamber 18A in FIG. 7, may be referred to as an "intra-bay" section, and the intermediate sections of the transport chamber, linking the "intra-bay" sections, may be referred to as "inter bay" sections). The versatility inherent in the processing apparatus 4010, and its transport chamber 4018 as previously described and as will be described in greater detail below, enables what may be referred to as an organic arrangement of processes (e.g. processing/holding modules 4300) and the associated transport chamber within the FAB as illustrated in the exemplary embodiment shown in FIG. 31 (see also FIG. 7A). In other alternate embodiments, the transport chamber modules may be arranged to form a transport chamber similarly to transport chamber 18 shown in FIG. 5. The transport apparatus 4010 may also have a linearly distributed transport system 4400 capable of transporting, through the chamber, substrate from the interface section modules 4014 to the processing section a modules and between processing section modules and returning processed substrates to the interface section modules for off loading. The transport chamber may have one or more transport paths through a given cross section. In the exemplary embodiment the transport system may have one or more cart(s) 4406, similarly to casts 22A, 27A, 406 described before. In the exemplary embodiment cart(s) 4406 (for example along one, two or three directional axes) may be independently propelled through the transport chamber by linear motors. For example, the linear motors of the transport system 4400 may be brushless as linear motors, in section linear motor(s) consists of iron core linear motors, linear stepper motors) or any other desired type of linear motor. The linear motors may have winding sets similarly to winding sets 402, 404 (see FIG. 11A) or to winding sets 770A, 770B, 770C (see FIGS. 13B-13C0 disclosed in the side walls of the transport chamber. The linear motor may also have winding sets similarly to winding 322 (see FIG. 10) or windings 340L, 3404 (see FIG. 28). In alternate embodiments, the cart may be driven by any suitable drive system. In other alternate embodiments, the linearly distributed transport system may have any desired configuration.

The transport chamber 401B may be changeable or isolated atmosphereable isolated from outside atmosphere. Load locks, for example integral to the transport chamber similar to the load locks 18P4 (see FIG. 7), or otherwise communicably connected to the transport chamber, interface between the isolated atmosphere within the transport chamber, or isolated portions thereof, and substrate modules (for example EFEM modules of interface section 4014) or holding stations exposed to outside atmosphere. In the exemplary embodiments shown, the transport chamber 4018 may have different internal atmosphere(s) along its length, for example corresponding to the various processes disposed along the length of the transport chamber. The processes shown in the exemplary embodiment depicted in FIG. 31 are representative and similar generally to the processes in FAB 601 shown in the exemplary embodiment depicted in FIG. 7A and described before. For example, processes may include epitaxial silicon (EPI), dielectric deposition or photolithography, etching, ion implantation or rapid thermal processing, metrology, dielectric deposition and others. Correspondingly, sections of the transport chamber may for example have different gas spheres on premises or may be in vacuum (e.g. roughing or high vacuum levels). The transport chamber in the exemplary embodiment may have load lock modules 4656 allowing communication between different sections of the transport chamber holding different atmospheres without compromise of the respective atmospheres. Load lock modules 4656 may be similar to load lock modules 656 (see FIG. 7A), with isolation valves 4654 that allow the carts 4406 to travel through the load lock module from one transport chamber section with one gas species/pressure (e.g. vacuum, nitrogen, argon) to another transport chamber section with a different gas species/pressure. Load lock modules 4656 may be capable of transitioning a single cart or multiple carts 4406. Multiple carts 4406 may be arrayed in the load lock 4656 along one linear transport path (e.g. carts serially queued on path) or on more than one transport path (e.g. laterally stack) as will be described further below. Similar to the FAB layout 601, of the exemplary embodiment shown in FIG. 7A, other locks or interconnects 467L may be provided in the transport chamber for example to change cart orientation and/or direction, and/or elevation of know transition between intersecting sections 4602, 4612, 4604 of the transport chamber. As noted before, FIG. 31 schematically illustrates a plan view of the apparatus 4010, and though elevation differences are not apparent in the illustrated embodiment, it should be realized that sections of the transport chamber 4018 of the processing modules 4300 or of the interface section 4014 may be at different elevations. For example, the processing modules/substrate holding stations, as shown in FIG. 31, may be arrayed in plan along the transport chamber 4018, but in the exemplary embodiment the processing module and holding stations may also be vertically arrayed and/or located at different elevations along the transport chamber as will be described further below.

Still referring to FIG. 31, and as noted before, in the exemplary embodiment the transport chamber 4018 may form multiple transport paths along which carts 4406, and hence substrates carried by the carts, may be transported in one or more of the linear sections 4602, 4604, 4612, 4620, 4624, of the transport chamber. In FIG. 31, two transport paths A, R are illustrated schematically as being axially offset. Similar to previously described exemplary embodiments (for example see FIG. 13C) and as will also be further described below, axial offset between the transport paths A, R may be sufficient to allow carts moving along the paths through a given cross section of the transport chamber 4018 to pass each other. In the exemplary embodiment, the transport paths may be vertically offset. As may be realized, in the exemplary embodiments, the transport paths are defined, at least generally, by the linear motor windings positions in or on the transport chamber walls as previously described. In FIG. 31, two transport paths A, R are shown for example purposes, and in alternate embodiments more or fewer transport paths may be disposed in one or more of the linear sections of the transport chamber. In other alternate embodiments, the paths may have any other suitable axial offsets. In the exemplary embodiment, at least one of the transport paths A, R may be positioned so that carts positioned on the path can access the interface section 4014 processing or modules 4300 mated to the transport chamber (e.g. to effect substrate transfer therebetween). One or more of the transport paths may be a bypass lane, allowing carts to pass by stopped carts in the chamber. In the exemplary embodiment, the transport paths A, R may be capable of allowing carts 4406 bidirectional movement on each path. Controller C may define a transport path A, R or a desired portion thereof (for example transport path A in transport chamber section 4602, 4612A) as having a single transport direction. For example, path A in chamber 4602 may be defined by controller C as an advance path, moving carts and (in FIG. 31 to the left) from loading/unloading section 4014, and path R may be defined as a return path (towards section 4014). Thus carts, and their substrates, may be moved away from load/unload station 4014 on path A, to transport substrates to process modules 4630 along the transport chamber 4602. The carts 4406 may bring substrates (for example after processing) to load/unload station on path R. Switching or connecting paths, similar to vertical paths 705 (see FIG. 31C) in the transport chamber 4602 may serve to transfer carts between paths. As may be realized, path R may be used to bypass carts stopped on path A, such as when carts are stopped to access process modules 4630, and conversely path A may be used to bypass blocked portions of path R, such as when carts are stopped on path R to access those process module(s) 4630 that may be accessed from track R. By way of further example, in the exemplary embodiment path A in transport chamber 4612 may have a controller defined transport direction away from interconnect module 4672 (see FIG. 31) and path R may have its direction defined towards module 4672. Hence, carts 4406 for example may move substrates from module 4672 (as may be realized in the exemplary embodiment carts may bring substrates such as from loading module 4014 to module 4672 along path A of chamber 4602) to the process modules 4631 and/or load and unload station 4014B on path A of chamber 4612. Carts 4406 may be moved towards module 4672 on path R. As noted before, in the exemplary embodiment, interconnect module 4672 may allow cart(s) 4606 to change direction/orientation in order to transit via the module 4672 between transfer chamber section (e.g. 4602 to 4612 or 4604 and vice versa). In alternate embodiments, the interconnect module may operate as a substrate pass through, for example substrates being transferred from carts to connection module, and from module to other carts in adjoining transport chamber sections. As seen in FIG. 31, the transport direction defined by controller C on a transport path may extend for a portion of the transport chamber linear section. Different portions of a given transport path A, R within a linear section of the transport chamber may have different defined directions. For example, within transport chamber section 4612A, the defined direction of path A is away from module 4672, and the defined direction of path R is towards module 4672. In the other portions of transport chamber 4612, the path directions may for example be reversed. As noted before, interconnecting transport paths (not shown) may allow carts 4406 to transit between paths. (e.g. to reverse travel direction or continue in the same direction in the case where the defined direction along one path reverses/switches). The controller C may define the direction of the transport path(s) A, R, or portions thereof, according to the process being performed by processing modules on the respective transport chamber section and in order to effect optimum substrate FAB times and reduce WIP, within the apparatus and family. For example substrates may be loaded in the apparatus in one loading station and unloaded in a different unloading station. For instance, in the exemplary embodiment shown in FIG. 31 the controller C may further be programmed to route substrates to effect optimum processing. Processed substrates (that may have been loaded in apparatus 4010 via loading station 4014A) may be transported along path A (e.g. in the direction away from module 4672) or along path R (e.g. in a direction towards module 4672) for unloading from load/unload station 4014B. In alternate embodiments, the transport paths may have any desired transport direction.

Referring still to FIG. 31, in the exemplary embodiments, the transport chamber of the processing apparatus, may include supplement transport chamber(s) or passage(s) 4570. The supplement transport passage(s) 4570 operate to generally supplement the transport capacity of transport chamber 4018 as will be describe further below. In the exemplary embodiment, the transport passage(s) 4570 may be operated as express transit passage(s) or chamber(s). The term express refers generally to substantially uninterrupted transit between departure and destination stations, bypassing intermediate stations. In alternate embodiments, the supplement transport passage may be operated in any other desired manner to supplement the transport capacity of transport chamber 4018 (e.g. shunt, buffer, etc.) In the exemplary embodiment shown in FIG. 31 the transport passage 4570 is connected at desired locations to the transport chamber 4018 and also to one or more tool interfaces 4014. The transport passage 4570 may have a transport shuttle(s) or vehicle(s) 4571 capable of traversing the length of the transit passage. The shuttle 4571 may be capable of holding substrate(s) or a substrate carrier(s), and transporting the substrate(s) or carrier(s) through the length of the transit passage 4570. In alternate embodiments the transport passage may be configured to allow carts similar to carts 4406 to transit the transport passage. The transport passage 4570 may be a linearly elongated tube or tubes, each capable of holding an isolated atmosphere, such as $N_2$ or vacuum, or may have an atmosphere of highly clean air, that may be circulated through a desired filtration. In the exemplary embodiment shown in FIG. 31, the transport passage 4570 includes a passage tube 4572, schematically depicted for example as extending generally along the transport chamber section 4612. In alternate embodiments, each transport chamber section 4602, 4604, 4612, 4608 may have a complementing transport passage similar to passage tube 4572. In the exemplary embodiment shown, the transport passage also has a passage tube 4573 shunting between transport chamber sections 4612 and 4608. In alternative embodiments, the supplemental transport passage may have another desired passage tubes. The transport passage 4570 in the exemplary embodiment shown, has interconnect passages 4576, 4578 (two are shown for example purposes and in alternate embodiments there may be more or fewer interconnection passages) connecting the passage tube 4572 to the desired modules 4656, 4658 of the transport chamber 4018. In the exemplary embodiment shown, interconnect passage tube 4576 may be joined to an intermediate loadlock (LL) module 4656, and another interconnect passage tube 4578 may be joined to another LL module 4658 located, in the exemplary embodiments, at the end of the linear portion 4612 of the transport chamber. In alternate embodiments, the interconnect passage(s) may be joined to any desired portion of the transport chamber, such as a transport chamber module 4518 that is not a loadlock. As may be realized, other passage tube(s) 4573 of the transport passage 4570 may be connected to corresponding portions of respected transport chamber sections 4612, 4608 via similar interconnect passages. In the exemplary embodiment, other interconnect passage tube(s) 4575 may join passage tubes 4572, 4573 to each other. The passage tube to passage tube interconnects may have suitable means to change directions and/or orientation of vehicle(s) 4571 to transit between passage tubes. In alternate embodiments the passage interconnects may have a transfer system capable of transferring substrate(s) or carrier(s) between vehicles in adjoining passage tubes. In other alternative embodiments, passage tubes may not be directly interconnected, but may communicate via separate connections between passage tubes and corresponding sections of the transport chamber. The interconnect passage tubes may be sized to allow passage of one or more substrates between the transport chamber 4018 and transport passage 4570. A transfer system (not shown) for moving the workpieces between the transit passage and transport chamber through the interconnect passages may be provided in the transit passage or transport chamber as will be described in greater detail below. The transport passage 4570 may be located in any desired position relative to linear transport chamber 4018 to allow the interconnect passages to be joined to the transport chamber. For example, the transport passage tubes 4572 may be located above, along side or under the transport chamber section 4612. The interconnect passages may be mated to any desired workpiece transit openings of the transport chamber modules, such as side openings similar to the closable openings 718A (see FIG. 13C) or closable top openings in the transport chamber modules. The transit openings may be closed by suitable valves (similar to slot valves 4654 for side openings) to isolate the transport chamber atmosphere from the transit passage. In alternate embodiments, the transport passage tubes may have any other desired orientation, such as being angled relative to the transport chamber. In the exemplary embodiment shown in FIG. 31, the transport passage has a passage(s) 4574 (one is shown for example) that communicates with tool interface section 4014A to allow workpiece(s) to be loaded/unloaded from shuttle 4571 from the interface section 4014A. As may be realized, the shuttle 4571 may be capable of substantially uninterrupted movement within transport passage(s) 4570 between for example interface section 4014A and interconnect passages 4576, 4578 and may thus transit substrates in the controlled atmosphere of the transport passage between interface section(s) 4014A and the interconnect passages 4576, 4578, or between passages 4576, 4578 thereby allowing the substrates to bypass transport through portions of the transport chamber 4018. In the exemplary embodiment, the passage tubes 4572, 4573 or the transport tube 4570 may have a common atmosphere and transit times through the transport passage may not be affected by atmosphere cycling times. Accordingly, transit time between desired station may be shorter via transport passage 4570 compared to transport chamber 4018. Moreover, by bypassing portions of the transport chamber 4018 throughput of the processing tool 4010 may be increased and WIP may be reduced. By way of example, turnaround time, such as from one interfacing station 4014, for "hot lots" may be reduced. For instance, a single workpiece ("hot lot") carrier may be loaded, by a FAB AMHS (not shown), at tool interface section 4014A where the "hot lot" substrate(s) are to be processed at processing modules 4031. The substrate(s) may be picked, by a suitable transfer system (such as an indexer in the interface section), from the interface section 4014A and placed onto shuttle 4571. The shuttle 4571 may transit through passage 4570 to interconnect passage 4576 and the workpiece may be loaded, by another suitable transfer system (now shown) to load lock 4656. Hence, the workpiece is expressed from the loading location to a portion of the tool 4010 proximate to the desired processing steps. The LL 4656 may be cycled to allow one or more cart(s) 4406 of the transport system 4400 access to the substrate(s) from shuttle 4571. For example the indexing system may move substrates from shuttle to cart. The workpiece may be moved through the transport chamber 4612 by cart 4406 and loaded and unloaded from the desired processing modules 4631 for processing. Upon completion of the desired processing, the workpiece may be located, for example, near the LL to which interconnect passage 4578 is connected. Accordingly, the workpiece may be transported in transport chamber 4612 to this LL for loading onto shuttle 4571. The LL may be cycled to facilitate access for loading the processed workpiece unto the shuttle 4571 in the transit passage without compromise of the different atmosphere in the transport chamber 4612. The shuttle 4571 may express the processed workpiece to a desired location, such as tool interface section 4014A (via passage 4574) or interface section 4014B (via passage 4576) for loadout. In alternate embodiments, the express transit passage may have any desired length and configuration, and may communicate to allow workpiece transfer with any desired portion of the processing tool 510 including for example metrology, workpiece stocker (WS) or carrier stocker (CS) sections, lithography sections 4634, etc.

Figure 32:
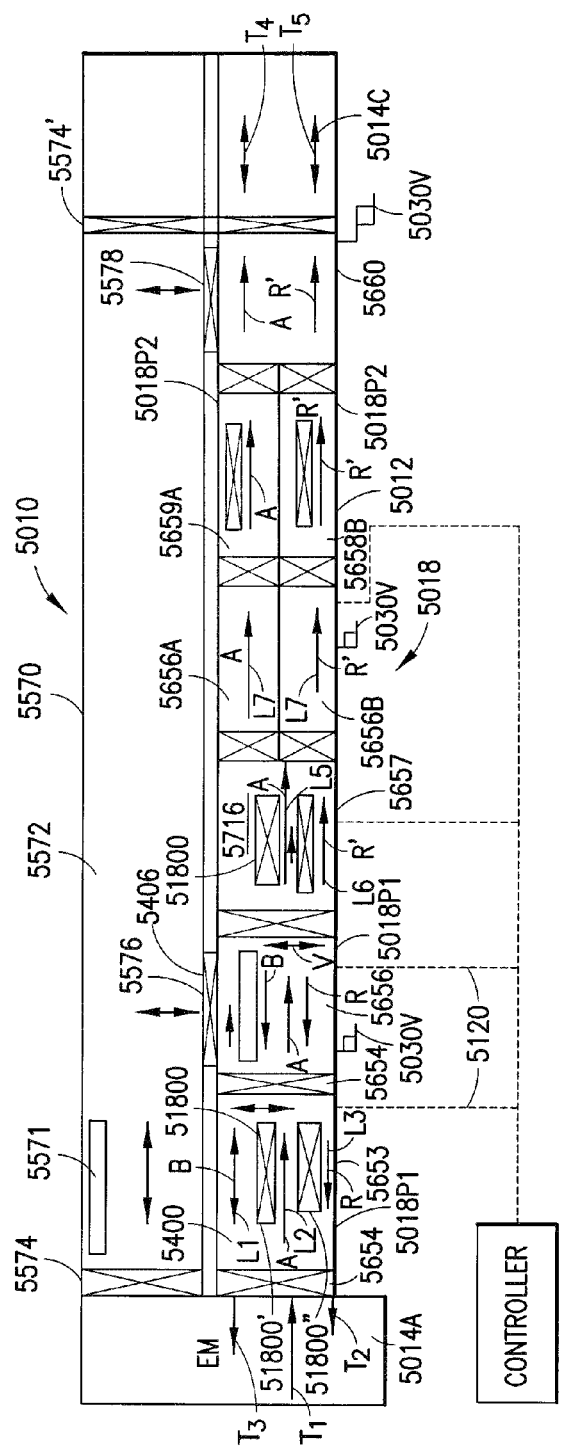
FIG. 32 is a schematic elevation view of a representative portion of a processing apparatus in accordance with another exemplary embodiment.

Referring now to FIG. 32, there is shown a schematic elevation view of a representative portion of a processing apparatus 5010 in accordance with another exemplary embodiment. The representative portion of the processing apparatus 5010 may be representative of and similar to portions of apparatus 4010 shown in FIG. 31. Similar features are similarly numbered. The representative portion illustrated in FIG. 32 has a linear chamber portion 5012 of a transport chamber 5018 similar for example to linear section 4012 of transport chamber 4018 shown in FIG. 31. The confirmation of the exemplary embodiment shown in FIG. 32 is merely exemplary and in alternate embodiments, any other suitable configuration may be employed for the illustrated portions of the apparatus. In the exemplary embodiment, the transport chamber 5012 is schematically illustrated as communicating with interface sections 5014A, 5014C (similar to interface sections 4014A, 4014B, 4014C, see FIG. 31). In the exemplary embodiment, the interface sections 5014A, 5014C may be located for example purposes at ends of the transport chamber sections 5012, and in alternate embodiments the interface sections may be located at one or more intermediate locations along the transport chamber (for example, similar to connection of interface section 4014B to chamber 4012 in FIG. 31), and the transport chamber may communicate with more or fewer interface sections. In the exemplary embodiment, the transport chamber 5012 is schematically illustrated as communicating substantially directly with the interface sections, though in alternate embodiments the transport chamber may communicate through intervening transport chamber sections that may offset the interface sections both horizontally and vertically from the linear portion of the transport chamber (see for example interface section 4014A related to transport chamber 4012 in FIG. 31). The transport chamber in the illustrated embodiment is formed from representative transport chamber modules 5018P1, 5018P2. The transport chamber modules 5018P1, 5018P2 may be generally similar to each other and to modules 4018P1, 18Pa, 18P2 shown in FIGS. 7 and 31 also described previously. In the exemplary embodiment shown in FIG. 32, transport chamber modules are illustrated as having similar lengths for example purposes, and in alternate embodiments transport chamber modules may have different lengths and shapes. For example, as also noted before, transport chamber modules 5018P1, 5018P2 (similar to modules 18P1, 18P2) may be of various lengths capable, for example, of accommodating one or more transport carts serially queued along the transport chamber length (FIG. 32 shows one transport cart 5406 in a transport chamber module for example purposes). In the exemplary embodiment transport chamber modules 5018P1, 5018P2 may have different heights similar to the exemplary embodiments describe before, the transport chamber 5018 (or a portion thereof 5012) is formed by joining the transport chamber modules serially in order to form the transport chamber of desired length and shape. As may be realized, similar to previously described embodiments, transport chamber length 5018 or a portion thereof 5012) may be varied by adding or removing transport chamber modules. The arrangement of the transport chamber modules in transport chamber section 5012 is exemplary, and in alternate embodiments the transport chamber modules may have any other desired arrangement along the transport chamber.

In the exemplary embodiment, each transport chamber module may include an integral portion of the distributed transport system 5400 (transport systems 5400 may be generally similar to transport systems 4400 described before and shown in FIG. 31). As shown in FIG. 32, in the exemplary embodiment each transport chamber module 5018P1, 5018P2 may define one or more transport lanes that form substantially continuous transport paths A, R, R', throughout the transport chamber 5012, for transport cart(s) 5406 when the modules are assembled to form the transport chamber. In the exemplary embodiment cart(s) 5406 may be similar to carts 406, 4406 described before. The travel lanes in the chamber modules, and the paths formed thereby in the transport chamber may be varied. For example, in the exemplary embodiments shown in FIG. 32, transport chamber modules 5653, 5656, may have three transport lanes L1, L2, L3, transport chamber modules 5657, 5660 may have two lanes L5, L6, and modules 5656A, 5656B, 5655A, 5659B may have one lane L7. (It is noted that reference numerals 5653, 5656, 5657, 5656A, 5656B, 5659A, 5659B, 5660 in FIG. 32 identify transport chamber modules as specific to the reference frame of the transport chamber of the exemplary embodiment shown, and reference numerals 5018P1, 5018P2 identify transport chamber modules when referred to generally.) In alternate embodiments, the transport chamber modules may have more of fewer transport lanes.

As noted before, the module transport lanes L1, L2, L3, L5, L6, L7 combine to form the substantially continuous longitudinal transport paths A, R, B. For example, as shown in FIG. 32, lanes L2 (in modules 5653, 5656) and L5 (module 5652, 5660) and L7 (modules 5656A, 5655A) combined form path A. Similarly path R, R' and B may be formed in the corresponding sections of the transport chamber 5012. In alternate embodiments, different portions of the transport chamber may have more or fewer paths and any desired path arrangement. In the exemplary embodiment, the side walls (referred to generally with reference numerals 5716 in FIG. 32) may be similar to sidewalls of chamber module 716, shown in FIGS. 13A-13C. Winding sets in the side walls 5716 may define the travel lanes within the respective modules of the transport chamber. In the exemplary embodiment, each of the transport chamber modules may be communicably connected, for example by a suitable "plug and play" type coupling (as will be described further below) to controller C. The controller C, as noted before, has programming that operably integrates the discrete winding sets, and hence travel lanes, of the individual transport chamber modules to form the transport paths for cart(s) 5406 throughout the desired portions of the transport chamber 5018/5012. As noted before, and as will also be described further below, the controller may polarize (or define specific) travel directions along portions of the transport paths A, R, R', B. As may be realized, in a given transport chamber module where a travel lane is undesired, the winding sets (see form example FIG. 13C) corresponding to the undesired travel lane, may be de-energized by the controller. Conversely, winding sets corresponding to desired travel lanes may be energized and controllably operated by the controller to move the cart(s) 5406 (or cart platens) as previously. Hence, the travel lanes of the transport chamber modules may be varied. In alternate embodiments, the transport chamber module travel lanes may be formed in any suitable manner (see for example FIGS. 10, 12B, 28).

In the exemplary embodiment shown, modules 5653, 5657, 5659A, 5659B may have closable side openings 5180O for communication with processing modules/substrate holding stations (not shown). The side openings 5180O may be generally similar to wall openings 180, 18A, 18B described previously (see also FIGS. 2, 13A-13C), sized to allow substrate transfer between transport chamber and mated processing module by any desired means (for example, transfer with cart mounted arm, see FIGS. 22-25; or transport arm in processing module, or transport arm in transport chamber independent from cart, or by cart transiting through the opening). The openings may be controllably opened/closed by slot valves, or other suitable valves/doors, to avoid compromise of the internal atmosphere of the transport chamber module. The valves are connected to and controlled by the controller, for example via "plug and play" coupling 5720. The number and arrangement of side openings 5180O in the transport chamber modules shown in FIG. 32 is merely exemplary, and is alternate embodiments more or fewer openings may be provided. Undesired openings may be covered with a blank. As noted before, openings 5180O, 5180O' 5180O" for communicating with processing modules arrayed along side the transport chamber may be positioned relative to the transport lanes to allow transfer of substrates from/to the cart(s) 5406. For example, transfer openings 5180O', 5180O" in module 5653 may be respectively positioned relative to lanes L2, L3, and opening 5180O in module 5657 may be positioned relative to transport lane L5. In the exemplary embodiment, the substrate transfer openings in the transport chamber may be considered to correspond to desired transport lanes, and hence transport paths of the transport chamber. For example, openings 5180O, 5180O' may be correspond to path A, and opening 5180" to path R (path B may be a bypass path). Accordingly, as may be realized, the process modules of the apparatus may be connected to desired transfer openings 5180O', 5180O", 5180O of the transport chamber according to a desired process protocol to be established (by the controller) along desired paths. Conversely, the transport directions of the transport paths in the chamber may be defined by the controller based on the process module arrangement. In alternate embodiments, some combination of this may be used. In the exemplary embodiment, path A may have a defined direction (for example) away, from interface section 5014A, (interface section 5014A is being used as a reference point relative to the transport path directions only for ease of description, and any suitable reference location may be used), path R may have a defined direction towards section 5014A, path R' may be polarized away from section 5014A. Path B in the exemplary embodiment is, as noted before a bypass path, and is shown as being bidirectional, though in alternate embodiments the bypass path may be polarized to a specific direction. In the exemplary embodiment shown in FIG. 32, interconnecting vertical paths V may be provided in the transport chamber (see for example FIG. 13C) allow transport cart(s) 5406 to switch between longitudinal paths A, R, R'. As may be realized, the controller may apply different process protocols to substrates, for example loaded at interface station 5014A, via transport along the different transport paths. If desired for a specific lot, one or more transport path directions may be changed to establish still other process protocols.

In the exemplary embodiment shown in FIG. 32, transport chamber modules 5653, 5657, 5659A, 5659B may have different internal atmospheres (gas species/pressures) from each other. In the exemplary embodiment, modules 5656, 5656A, 5656B may be loadlock chambers allowing carts to transit between the chamber modules with different atmospheres (via isolation valves 5654, similar to valves 4654 in FIG. 31.) For example, the loadlock may be provided with a vacuum or roughing pump 5030V such as available from Helix Technology Corp., for evacuating the atmosphere of the loadlock. When the isolation valves 5654 are closed, thereby isolating the loadlock 5656 from the adjoining chamber modules (e.g. chamber modules 5653, 5657) the atmosphere in the loadlock may be pumped down independent of the modules. A controllable vent line (not shown) between module(s) and loadlock 5656, 5656A, 5656B may allow controlled venting between module(s) and loadlock(s). In the exemplary embodiment, the vacuum pump 5030V may also be used to simultaneously evacuate the atmosphere of one or more transport chamber modules 5653, 5657, 5656A, 5656B and loadlock 5656. For example, the isolation valves 5654 may be open and pump 5030V draws vacuum in the desired transport chamber module(s) via the loadlock 5656. Accordingly, in the exemplary embodiment a loadlock of variable size or capacity is formed. In alternate embodiments, any other desired transport chamber module may be provided with a vacuum pump so that any transport chamber module, including those with substrate transfer openings (similar to isolation valve opening 5180O) may operate as a load lock. As noted before, one or more of the load lock modules 5656, 5656A, 5656B, (in alternate embodiments any one or more of the transport chamber modules, as also previously described with reference to the exemplary embodiments in FIGS. 7A and 31) may incorporation one or more additional features (similar to modules 658, 4658 see FIGS. 7A and 31) such as substrate alignment, metrology, substrate cleaning or processing such as substrate thermal conditioning, substrate buffering or any other desired features that may be applied to substrates in the transport chamber 5018. In the exemplary embodiment, load lock module 5656 may be provided with thermal conditioning capability for raising or lowering the temperature of a substrate, such as a substrate held by cart 5406 in the load lock, between an ambient temperature and a desired temperature (e.g. an operating temperature of one or more processing modules.)

As noted before, the transport chamber modules in the exemplary embodiment, may be provided with a "plug and play" capability via for example coupling 5120, allowing the controller C to automatically recognize a specific transport chamber module, and desired parameters of the module (including for example processing modules connected to the transport chamber module) when the module is connected to the transport chamber and the controller C. For example, the coupling 5120 of the transport chamber module, may have a suitable interface, for communicating with controller C, provided with integral programming to automatically provide the "plug and play" capability on connection of the respective interface to the controller. For example, the coupling and interface may be configured and a USB port an connector. Mating of the coupling 5120, for example to a suitable port in bi-directional communication with the controller, may cause the interface to automatically identify to the controller C the module configuration, for example module 5653 is transport chamber module, with (M) travel lanes, the winding sets defining the travel lanes, and the control parameters for the drive section motors, and control instrumentation, identification and control parameters for any other controllable system resident on module 5653, position of module with respect to a desired reference frame (e.g. $M^{th}$ module of transport chamber). The information, which is downloaded automatically by controller C on mating with the interface of coupling 5120 may provide the controller with system information and control parameters for all controllable systems of the module being controlled by controller C to enable the controller to communicate and control operation of the module's controllable systems substantially immediately on connection of the coupling. The information may also provide the controller C with the geometric parameters defining the transport "space" of the transport chamber 5012, incorporating the specific transport chamber module(s) 5653, 5656, 5657 for establishing the kinematic equations and commands controlling transport motions. For example, the downloaded information may allow the controller to establish the spatial coordinates (X, Y, Z) of various features, such as location of substrate transfer openings (See FIG. 32) and isolation valves 5654, 5576, chamber boundaries, center of substrate pick, place positions, etc. As may be realized, the information programmed into interface module/controller of coupling 5120 may be but a portion, or an identifier, sufficient to enable the controller to look up/read the information from a memory location (not shown) of the controller where the control information may have been preprogrammed. By way of example, the controller may be programmed with lookup tables or an algorithm establishing the X,Y,Z coordinates for kinematic relevant features such as the locations of substrate transfer openings, module chamber walls for transport chamber modules. Upon coupling, the interface of a given module, may provide an indication to the controller that (M) module is being coupled to other modules of the transport chamber, for example already registered by the controller, causing the controller to access (via for example the lookup tables/algorithm) the desired characteristics of the module.

In alternate embodiments, the module interface may be programmed with any other desired information to be downloaded by the controller on coupling. Upon registering that (M) transport chamber module is coupled, the controller C may further automatically access, or automatically make available to an operator corresponding programming to initialize the respective operable systems/components and query status of the various systems (e.g. slot valves open/shut, transport encoders position, etc.). Similarly, the controller C may automatically lookup and initialize suitable test protocol to verify that the systems (hardware, software) of the added module are operating nominally and if desired actuate module systems to bring them to a "zero" position. In addition, the controller may enable display features (not shown), for example indicating to an operator the addition of the module, the present configuration of the transport chamber and tool, as well as command protocol allowing entry of operator commands, via a desired user interface, to operate the systems on the added module or modify workpiece process protocol carried out by the tool to incorporate the newly available features from the added module. For example, on registration of the coupling of the transport chamber module, the controller may add or enable features on the display (not shown) schematically representing the module and its relative position in the transport chamber with respect to other modules as well as presence and status of any module systems. Also enabled may be user selectable features such as "soft keys", for initializing test programs, or teaching programs (e.g. fine teaching programming for arm 26B) for the module systems. As may be realized, any desired user interface architecture may be employed, and in alternate embodiments more or fewer features may be enabled by the controller at coupling. The downloaded information may be used by the controller MES system software (See FIG. 26) to configure or reconfigure factory resources and process plans in order to maximize overall system efficiency.

Still referring to FIG. 32, substrates may be loaded into the transport chamber 5012 from any interface section 5014A, 5014C. In the exemplary embodiment, each of the interface section 5014A, 5014C may have multiple substrate transfer planes T1-T5 along which substrates may be transferred (loaded/unloaded) between interface section and transport chamber. In the exemplary embodiment shown the transfer planes T1-T5 may be vertically offset. As may be realized, the interface section(s) 5014A, 5014C may have a suitable indexer (not shown) to index substrates to and from the desired transfer plane. One or more transfer planes may be substantially aligned with one or more of the transport paths A, R, R' of the transport chamber 5012. In alternate embodiments, transfer paths for loading/unloading substrates between interface section and transport chamber may be horizontally offset (e.g. horizontally arrayed). An exemplary process protocol may transfer substrates from interface section 5014A, for example along transfer plane T1 (though in alternate embodiments any transfer plane may be used) to the transport chamber. As may be realized, one or more substrate(s) may be simultaneously transferred (e.g. vertically stacked) along a given transfer plane. Substrate transfer may occur via a load lock (not shown) located for example between transport chamber module 5653 and interface section 5014A. In alternate embodiments, the interface section may have load lock capabilities, or may hold a vacuum or other desired gas species/pressure conforming to the internal atmosphere of transport chamber module 5653. In the exemplary embodiment, the substrate(s) may be transferred to a cart 5406 (for example with a pick from the robot arm on the cart) on transport path A (in alternate embodiments the cart may be on any desired transport path). In the exemplary embodiment, carts may be queued prior to positioning for receiving substrate(s) from the interface section 5014A on another transport path (e.g. path R or bypass path B). As noted before, cart(s) may be moved between transport paths A, R, B by interconnects V. In the exemplary embodiment, the cart may move the substrate(s) on path A which as noted before may have a polarized direction (e.g. away from interface section 5014A) by the controller in accordance with the desired process protocol. For example, the substrate(s), in accordance with the process protocol, may be processed in processing module(s) connected to transfer opening 5180O'. If further processing is desired, the substrate(s) are moved, via load lock 5656, to chamber module 5657 for processing in the process module accessed via the transfer opening 5180O. Processing of the substrate(s) may be similarly continued as the substrate(s) are transported along path A. The substrate(s) may be for example thermally conditioned (heated/cooled) to desired temperature in the load lock 5656, and may undergo alignment or metrology testing or other desired processing in the transport chamber according to the capabilities of the transport chamber modules. If unloading of the substrate(s) at interface section 5014C is desired, the substrate(s) may continue on path A to the chamber module 5660 for transfer along a desired transfer plane T4 to the interface section 5014C. If processing of the substrate(s) is desired according to protocols provided along path R, R' the cart may move from path A to path R, R' for processing the substrate(s) therein along those paths. Bypass path B, may be used in the exemplary embodiment to bypass blocked portions of the transport paths A, R and "jump over" process steps or intervening traffic along the other paths. In the exemplary embodiment, the bypass path B may be used either to advance substrates from the interface section(s) or when returning or bringing substrate(s) to the interface section. The controller may variably designate one or more of the paths A, R, R', B a bypass path for some period of time depending on existing and predicted traffic conditions along given transport paths.

In the exemplary embodiment shown in FIG. 32, the apparatus has a supplemental transport passage 5570. The supplemental transport passage 5570 in the exemplary embodiment may be similar to supplemental transport passage 4570 described before and shown in FIG. 31. Similar features are similarly numbered. In the exemplary embodiment shown in FIG. 32, the supplemental transport passage may have a passage tube 5572 with one or more shuttle(s) 5571 capable of transiting the tube. The tube 5572 in the exemplary embodiment may be connected by suitable interconnects 5574, 5574' (similar to interconnect tube 4574, see FIG. 31) to the interface section 5014A, 5014C on the transport chamber. In alternate embodiments, the passage tube may be connected to more or fewer interface sections on the transport chamber. The passage tube 5572 may also communicate via interconnects 5576, 5578 (similar to interconnects 4576, 4578, see FIG. 31) to transport chamber modules 5656 and 5660. In alternate embodiments, the passage tube may be connected to more or fewer transport chamber modules or transport chamber locations. As noted before, in the exemplary embodiment, chamber module 5656 may be a load lock. Chamber module 5660 in the exemplary embodiment may also be a load lock. Isolation valves (that may for example be integral to the chamber modules 5656) isolate the load locks from the passage tube, and in the exemplary embodiment the passage tube 5572 may have a different atmosphere (e.g. controlled air) than one or more of the transport chamber modules. In the exemplary embodiment, passage tube 5572 may be modular allowing the tube length to be variable and easily conformable to desired length. In alternate embodiments, the transport chamber modules may have integral tube sections, so that assembly of the modules to form the transport chamber results in formation of the passage tube. As may be realized from FIG. 32, in the exemplary embodiment, substrate(s) may be expressed by shuttle(s) 5571 in passage tube 5572, away from interface section 5014A, 5014C to intermediate and/or distal sections or modules of the transport chamber 5012, and vice versa. Thus, substrate(s) may be introduced in the process stream at a distance or remote location from the interface section 5014A that receives the substrate carrier from outside the apparatus. A suitable indexing mechanism (not shown) that may be provided on the shuttle (e.g. hoist) or the transport chamber or any other suitable place, may index the substrates between shuttle and stations (not shown) in the transport chamber from which the cart(s) can pick/place substrates. In alternate embodiments, the indexer may be capable of direct substrate transfer from shuttle to cart and vice versa. The isolation valves to the passage tube 5572 may be opened to allow substrate transfer between transport chamber and passage tube, and isolation valves 5654 to other portions of the transport chamber may be closed. In the exemplary embodiment, the expressed substrates delivered to load lock 5656 may be heated to operating temperature in the load lock as described before. From the load lock the substrates may be processed according to the desired protocol. Processed substrates may be expressed from a remote location to a desired interface section 5014A, 5014C in a similar but opposite manner. By way of example, a processed substrate(s) located in chamber module 5659B (see FIG. 32) may be transported to load lock 5660, indexed through the isolation valve to the shuttle 5571 in passage tube 5572, and expressed to interface section 5014A. In alternate embodiments, the substrate(s) may be transported and processed with the apparatus in any other desired manner.

Figure 33:
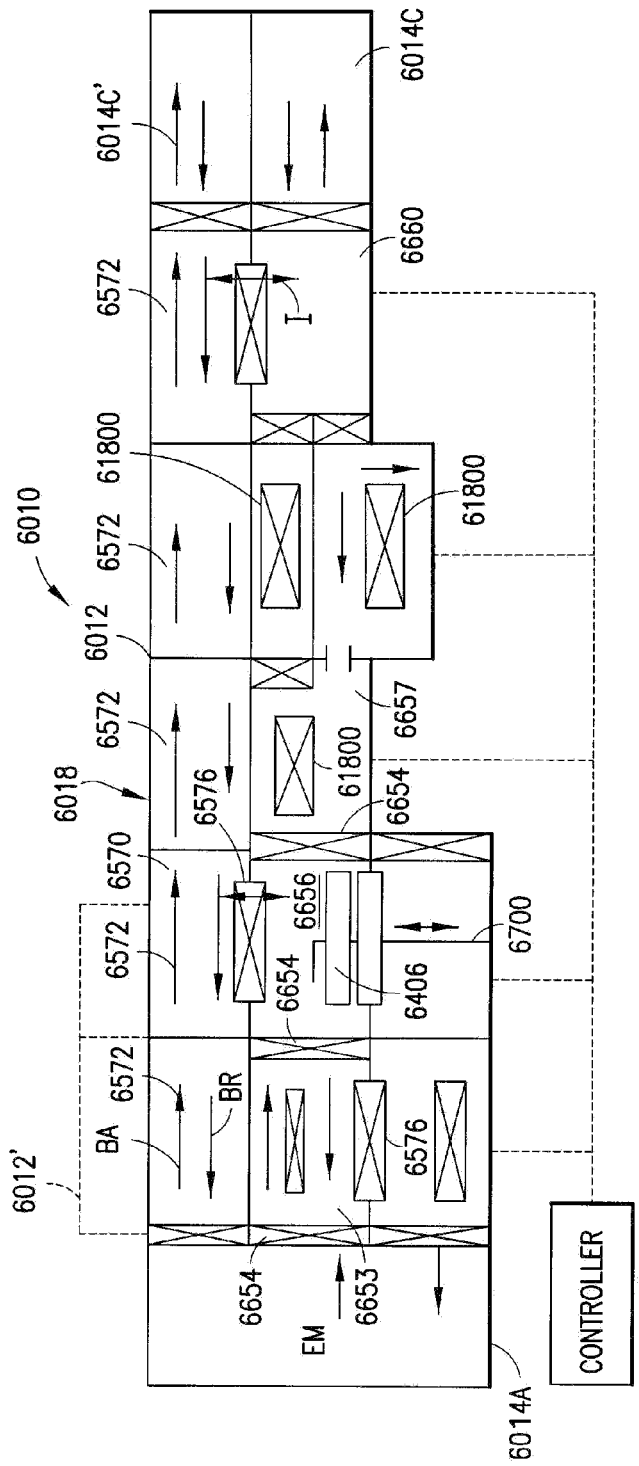
FIG. 33 is another schematic elevation view of a representative portion of a processing apparatus in accordance with still another exemplary embodiment.

Referring to FIG. 33, there is shown a schematic elevation view of another representative portion of a processing apparatus 6010 in accordance with another exemplary embodiment. The representative portion of apparatus 6010 shown in FIG. 33 may be similar to processing apparatus 4010, and the representative portion of apparatus 5010 shown respectively in FIGS. 31, 32. Similar features are similarly numbered. In the exemplary embodiment shown in FIG. 33, the apparatus may have a transport chamber 6018, with a section thereof 6012 connected to interface sections 6014A, 6014C, 6014C'. The configuration shown in FIG. 32 is merely exemplary and in alternate embodiments, any other suitable configuration may be employed. For example, one or more of the interface sections may be located at an intermediate position along the transport chamber, alongside or inline with the transport chamber. The interface section 6014A, 6014C, 6014C' may be similar to the interface sections described before. In the exemplary embodiment shown, interface sections 6014C, 6014C' may be vertically stacked, and may be parted from each other by a suitable partition. Each interface section 6014C, 6014C' may hold an atmosphere isolated from the other. For example, interface section 6014C' may hold a vacuum or a desired gas species, and interface section 6014C may be an environmental interface module. The transport chamber 6012 may be formed from transport chamber modules similar to modules 6018P, 5018P2 (See FIG. 32). In the exemplary embodiment, modules 6572 are prearranged to define an express or bypass passage 6570 (akin to supplemental transport passage 4570, 5570 shown in FIGS. 31 and 32). In the exemplary embodiment shown in FIG. 33, the express passage 6570 may be integrated into the transport chamber, though in alternate embodiments some separation may be provided between the express passage and other corresponding portions of the transport chamber. As noted before, the modules 6572 forming the express passage of the transport chamber may be similar to other transport chamber modules 6653, 6656, 6657. Thus, the express passage modules 6572, in the exemplary embodiment, may have integral transport lanes that form transport paths BA, BR through the express passage that can be used by transport carts 6406. Though integral to transport chamber 6012, in the exemplary embodiment, the passage 6570 may be partitioned by suitable means (e.g. floor/wall/ceiling) from adjoining modules of the transport chamber. Accordingly, the express passage may maintain an atmosphere (e.g. filtered air, inert gas, vacuum) different from the atmosphere(s) maintained in other modules of the transport chamber. In the exemplary embodiment, the express passage modules are illustrated without transfer openings in side walls for example purposes. In alternate embodiments, the express passage modules may be provided with closed or closable access openings (similar for example to openings 61800 in FIG. 33) for substrate transfer. In the exemplary embodiment the controller may define, may define in accordance with temporal status conditions of the apparatus 6010, one or more of the suitable tube sections formed in the transport chamber by the module architecture into one or more bypass/express passages. By way of example, the controller may, according to its programming, review the status and expected operation of the apparatus, and identify a tube section similar to passage 6572 of the transport chamber that is not being used (for some desired period of time) for substrate processing. The passage may be connected to desired interface sections and desired transport chamber modules in order to allow the passage to be efficiently operated as an express passage. Accordingly, the controller may establish the identified tube section as an express passage and operate it in a manner similar to passage tube 5572 (see FIG. 32). The selection may be made by the controller, if desired, in real time and used for example for a temporal "hot lot". The express passage selected may thus be different for different lots at different times. The location of the express passage 6578 shown in FIG. 33 is exemplary and as may be realized, in alternate embodiments, the express passage may be located anywhere in the transport chamber module stack. The express passage may be sandwiched between transport chamber modules as shown in FIG. 33. In other alternate embodiments, the express passage may extend horizontally along one or more transport chamber section or be horizontally sandwiched between such sections. In the exemplary embodiment, the express passage may communicate with other modules (e.g. load locks 6656, 6660) via suitable isolation valves 6576. Valves 6576 may be sized to allow the cart(s) 6406 to travel through between express passage and other portion of the transport chamber. In alternate embodiments, the load lock module may be located in the express passage. In the exemplary embodiment, an indexing system (e.g. a mechanical indexer 6700) may be positioned to transfer carts between load lock 6656 and express passage. Other modules 6572, 6660 of the transport chamber may have suitable drive motors to define interconnect paths I as shown in FIG. 33 for directly motivating the cart(s) in and out of the express passage. Substrate processing may be performed in a manner similar to that previously described.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate processing apparatus comprising:
   a transport chamber defining more than one substantially linear substrate transport paths extending longitudinally along the transport chamber between opposing walls of the transport chamber;
   a generally linear array of substrate holding modules alongside the transport chamber, each communicably connected to the chamber to allow passage of a substrate between transport chamber and holding module; and
   a substrate transport located in and movably mounted to the transport chamber for transporting the substrate along the more than one substantially linear substrate transport paths, the substrate transport having at least one transporter capable of holding and moving the substrate on at least one of the more than one substantially linear substrate transport paths;
   wherein the transport chamber comprises different transport tubes at least one of which is sealable at both ends of the transport tube and configured to hold an isolated atmosphere different from an atmosphere of another of the transport tubes where each transport tube has a separate interface at least at one end of a respective transport tube separately mating each transport tube with a common substrate holding module that is common to the different transport tubes, each interface having an opening through which at least one path of the more than one substantially linear substrate transport paths extends through into the common substrate holding module and the at least one transporter is configured to travel through the transport tubes having the different atmospheres for transporting substrates through the different atmospheres corresponding to respective substrate holding modules, each of the different transport tubes having at least one of the substrate transport paths located therein different from another of the transport paths located in another of the transport tubes, and being communicably connected to each other at a first location to allow substrate transfer between different substrate transport paths in different transport tubes, each transport tube extending longitudinally to another location common to each transport tube and distant from the first location, where at least one of the transport tubes is configured to provide substantially uninterrupted transit of the substrate transport through the at least one of the transport tubes along a respective transport path.

2. The apparatus according to claim 1, further comprising an interface section connected to the transport chamber, the interface section being adapted to load and unload substrates from the apparatus, wherein the transport tubes are each communicably connected at the other location to the interface section to allow substrate transfer from each transport tube to the interface section.

3. The apparatus according to claim 1, wherein at least two of the transport tubes are substantially parallel to each other.

4. The apparatus according to claim 1, wherein at least one of the transport tubes has a selectably variable longitudinal length.

5. The apparatus according to claim 1, wherein the length of at least one of the more than one linear transport paths is selectably variable, path length variability being set with variance of a longitudinal length of a corresponding one of the transport tubes.

6. The apparatus according to claim 1, wherein each of the transport tubes are separated from each other.

7. The apparatus according to claim 1, wherein at least one of the transport tubes is capable of holding an internal atmosphere isolated from and different than another internal atmosphere in another of the transport tubes.

8. The apparatus according to claim 1, wherein at least one of the transport tubes has a tube portion, with at least one of the more than one transport paths located therein, that is capable of holding a first isolated atmosphere isolated from another atmosphere in another tube portion of the at least one transport tube, the at least one transport path extending through the other tube portion.

9. The apparatus according to claim 1, wherein at least one of the transport tubes has a load lock therein.

10. The apparatus according to claim 9, wherein the load lock is capable of thermal conditioning a substrate transported along one of the more than one transport paths through the load lock.

11. The apparatus according to claim 1, further comprising at least one interface section connected to the transport chamber and configured to load and unload substrates from the apparatus, wherein the at least one of the transport tubes configured to provide substantially uninterrupted transit is configured to provide substantially uninterrupted transit between the at least one interface section and at least a point of the transport chamber between the first location and the other location.

12. The apparatus of according to claim 11, wherein the at least one interface section includes an first interface section disposed at the first location and a second interface section disposed at the other location, and the at least one of the transport tubes configured to provide substantially uninterrupted transit is configured to provide substantially uninterrupted transit substantially directly between the first and second interface sections.

13. The apparatus according to claim 1, wherein the transport chamber has holding module ports and at least one of the transport tubes is free of holding module ports.

14. A substrate processing apparatus comprising:
a plurality of first transport modules coupled to each other to form a first substantially linearly elongated transport tube having a first and second end and at least one transport path extending between the first and second end, the first substantially linearly elongated transport tube having a plurality of holding module ports configured for coupling a generally linear array of substrate holding modules, arranged in a processing plane, to the first substantially linearly elongated transport tube, each holding module port being configured to allow passage of a substrate between the first substantially linearly elongated transport tube and the substrate holding module;
at least one substrate transport movably mounted within the first substantially linearly elongated transport tube, the at least one substrate transport being configured to traverse the at least one transport path; and
a plurality of second transport modules coupled to each other to form a second substantially linearly elongated transport tube that is free of holding module ports and having a first and second end and at least one express transport path extending between the first and second end, the at least one express transport path being different than and substantially parallel to the at least one transport path, the second substantially linearly elongated transport tube being communicably connected to the first substantially linearly elongated transport tube and configured to allow passage of the at least one substrate transport between the first and second substantially linearly elongated transport tubes along a path arranged at an angle to the at least one transport path and the at least one express transport path and disposed between the first and second ends of the first and second substantially linearly elongated transport tubes
wherein at least the first ends of the first and second substantially linearly elongated transport tubes are separately coterminous.

15. The apparatus according to claim 14, wherein the second substantially linearly elongated transport tube includes an atmospheric controlled environment and the first substantially linearly elongated transport tube includes an environment different than the atmospheric controlled environment.

16. The apparatus according to claim 14, wherein the first and second substantially linearly elongated transport tubes share a common environment.

17. The apparatus according to claim 14, wherein and the second ends of the first and second substantially linearly elongated transport tubes are coterminous, the apparatus further comprising an interface section disposed at least at one of the first and second ends and communicably connected to at least one of the first and second substantially linearly elongated transport tubes, the interface section being to load and unload substrates from the apparatus.

18. The apparatus according to claim 17, wherein the interface section is communicably coupled to the second substantially linearly elongated transport tube and the second substantially linearly elongated transport tube is configured to provide substantially uninterrupted travel along the at least one express transport path to one of both the second end and a first transport module disposed between the first and second ends.

19. The apparatus according to claim 14, wherein each of the at least one transport path and the at least one express transport path include at least two transport paths configured to allow substantially simultaneous bi-directional travel of the at least one substrate transport within a respective one of the first and second substantially linearly elongated transport tube.

20. The apparatus according to claim 19, wherein each of the at least one transport path and the at least one express transport path include at least two transport paths configured to allow two substrate transports to pass adjacently by one another within a respective one of the first and second substantially linearly elongated transport tube.

21. The apparatus according to claim 14, wherein the second substantially linearly elongated transport tube is disposed in a plane that is different and spatially offset from than the processing plane.

22. The apparatus according to claim 14, wherein at least one of the plurality of first transport modules comprises a load lock disposed between the first and second ends where the load lock is configured to allow passage of the at least one substrate transport between the first and second substantially linearly elongated transport tubes along the path arranged at an angle to the at least one transport path and the at least one express transport path.

23. A substrate processing apparatus comprising:
a plurality of first transport modules coupled to each other to form a first substantially linearly elongated transport tube having a first and second end and at least one transport path extending between the first and second end;
at least one substrate transport movable along the at least one transport path
a plurality of substrate holding module ports disposed in walls of the first substantially linearly elongated transport tube and configured to connect substrate holding modules to the first substantially linearly elongated transport tube where the plurality of substrate holding modules are arranged so that a substrate is transported to be processed in the plurality of substrate holding modules in a predetermined sequence that substantially avoids substrate transport to substrate transport interference;
at least one load lock disposed between the first and second ends of the first substantially linearly elongated transport tube at a location with at least one intervening substrate holding module port between the first end and the load lock; and
a second substantially linearly elongated transport tube disposed adjacent the first substantially elongated transport tube and free from substrate holding module ports, where the at least one load lock is configured to sealingly communicably couple the first and second linearly elongated transport tubes at a point between the first and second ends and where the second substantially elongated transport tube is configured to provide at least one substantially uninterrupted pathway to at least the first end.

24. The apparatus according to claim 23, wherein the apparatus further comprises at least one of a front interface module coupled to the first end and at back interface module coupled to the second end, the front and back interface modules being configured to at least one of add or remove substrates to or from at least one of the first and second linearly elongated transfer tubes.

25. The apparatus according to claim 24, wherein at least one of the front and back transfer modules comprises a pair of vertically stacked interface modules.

* * * * *

UNITED STATES PATENT AND TRADEMARK OFFICE
CERTIFICATE OF CORRECTION

Page 1 of 1

PATENT NO. : 8,651,789 B2
APPLICATION NO. : 13/159034
DATED : February 18, 2014
INVENTOR(S) : Hofmeister et al.

It is certified that error appears in the above-identified patent and that said Letters Patent is hereby corrected as shown below:

In the Specification

Column 2, line 40, delete "Excerted" and insert --Excerpted-- therefor.

Signed and Sealed this
Fourteenth Day of April, 2015

Michelle K. Lee
*Director of the United States Patent and Trademark Office*